United States Patent
Kariya

(10) Patent No.: US 10,872,902 B2
(45) Date of Patent: Dec. 22, 2020

(54) SEMICONDUCTOR MEMORY DEVICE

(71) Applicant: TOSHIBA MEMORY CORPORATION, Minato-ku (JP)

(72) Inventor: Nayuta Kariya, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/299,609

(22) Filed: Mar. 12, 2019

(65) Prior Publication Data

US 2020/0098785 A1 Mar. 26, 2020

(30) Foreign Application Priority Data

Sep. 20, 2018 (JP) ................................. 2018-176315

(51) Int. Cl.
| | | |
|---|---|---|
| H01L 27/11582 | (2017.01) |
| H01L 27/11519 | (2017.01) |
| H01L 27/11565 | (2017.01) |
| H01L 27/11556 | (2017.01) |
| H01L 21/311 | (2006.01) |

(52) U.S. Cl.
CPC .. *H01L 27/11582* (2013.01); *H01L 27/11519* (2013.01); *H01L 27/11556* (2013.01); *H01L 27/11565* (2013.01); *H01L 21/31111* (2013.01)

(58) Field of Classification Search
CPC ......... H01L 27/11582; H01L 27/11519; H01L 27/11556; H01L 27/11565; H01L 21/31111

USPC ......................................................... 257/314
See application file for complete search history.

(56) References Cited

U.S. PATENT DOCUMENTS

| | | | |
|---|---|---|---|
| 8,299,571 B2 | 10/2012 | Ozawa et al. | |
| 9,620,712 B2 | 4/2017 | Hayashi et al. | |
| 2017/0117290 A1* | 4/2017 | Lee .................. | H01L 27/11582 |
| 2017/0236836 A1* | 8/2017 | Huo .................. | H01L 27/11578 257/324 |
| 2018/0047787 A1 | 2/2018 | Nakamura et al. | |
| 2020/0020712 A1* | 1/2020 | Kim .................. | H01L 27/11582 |

FOREIGN PATENT DOCUMENTS

| | | |
|---|---|---|
| JP | 5558090 | 7/2014 |
| JP | 2018-026418 | 2/2018 |

* cited by examiner

*Primary Examiner* — Tu-Tu V Ho
(74) *Attorney, Agent, or Firm* — Oblon, McClelland, Maier & Neustadt, L.L.P.

(57) ABSTRACT

According to one embodiment, first and second conductive layers are stacked in a first direction. The second conductive layers are spaced from the first conductive layers. Insulation regions are provided between the first and second conductive layers. A pillar is arranged between the first and second conductive layers and between the insulation regions. The pillar includes a charge storage film, a first insulation film, and a semiconductor layer, which are provided sequentially from the first conductive layers. A second insulation film is provided between the charge storage film and the first conductive layers. A portion of the charge storage film is provided between one of the insulation regions and the first conductive layers at an end of a portion where the first conductive layers and the pillar face each other.

24 Claims, 45 Drawing Sheets

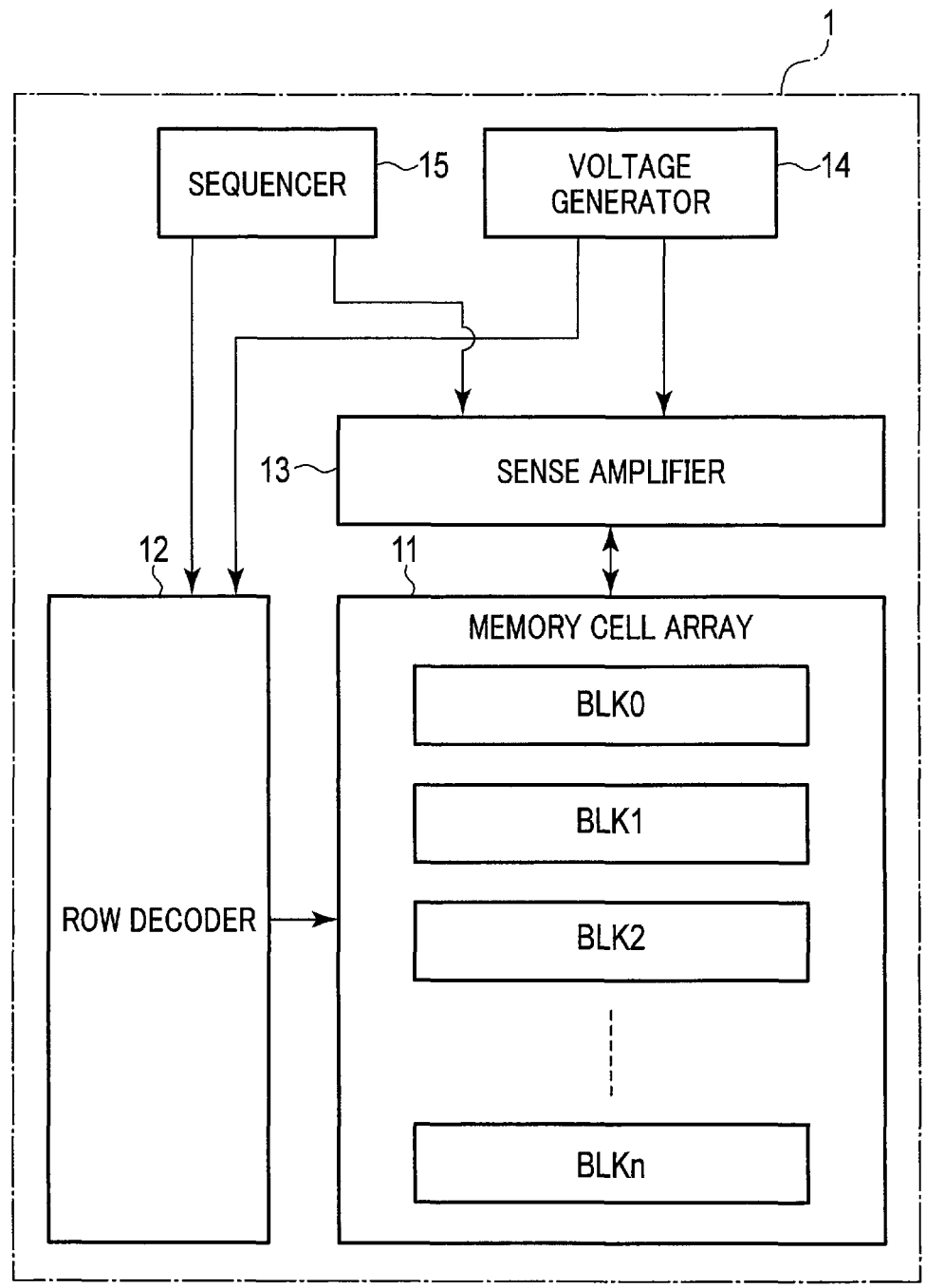
F I G. 1

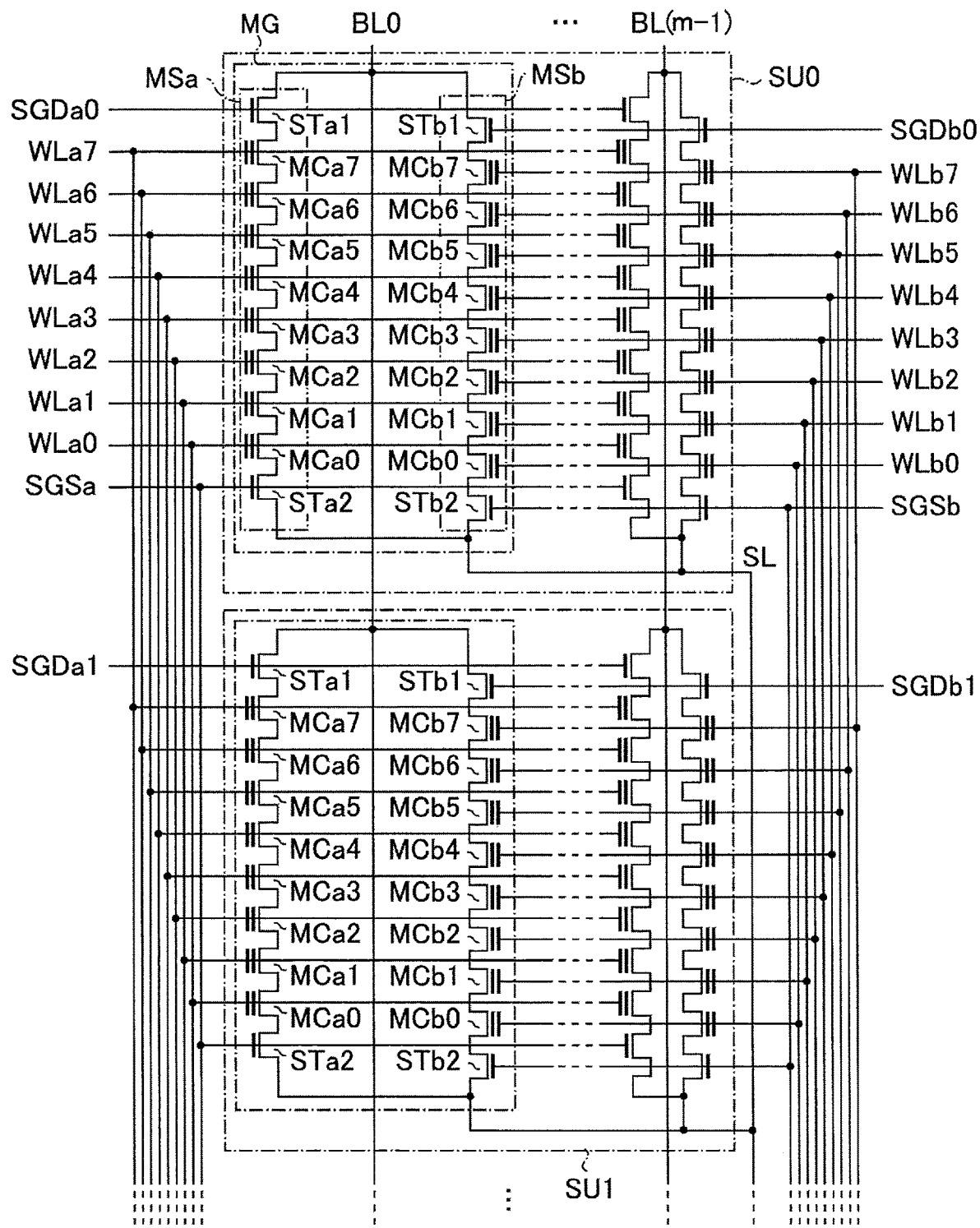
F I G. 2

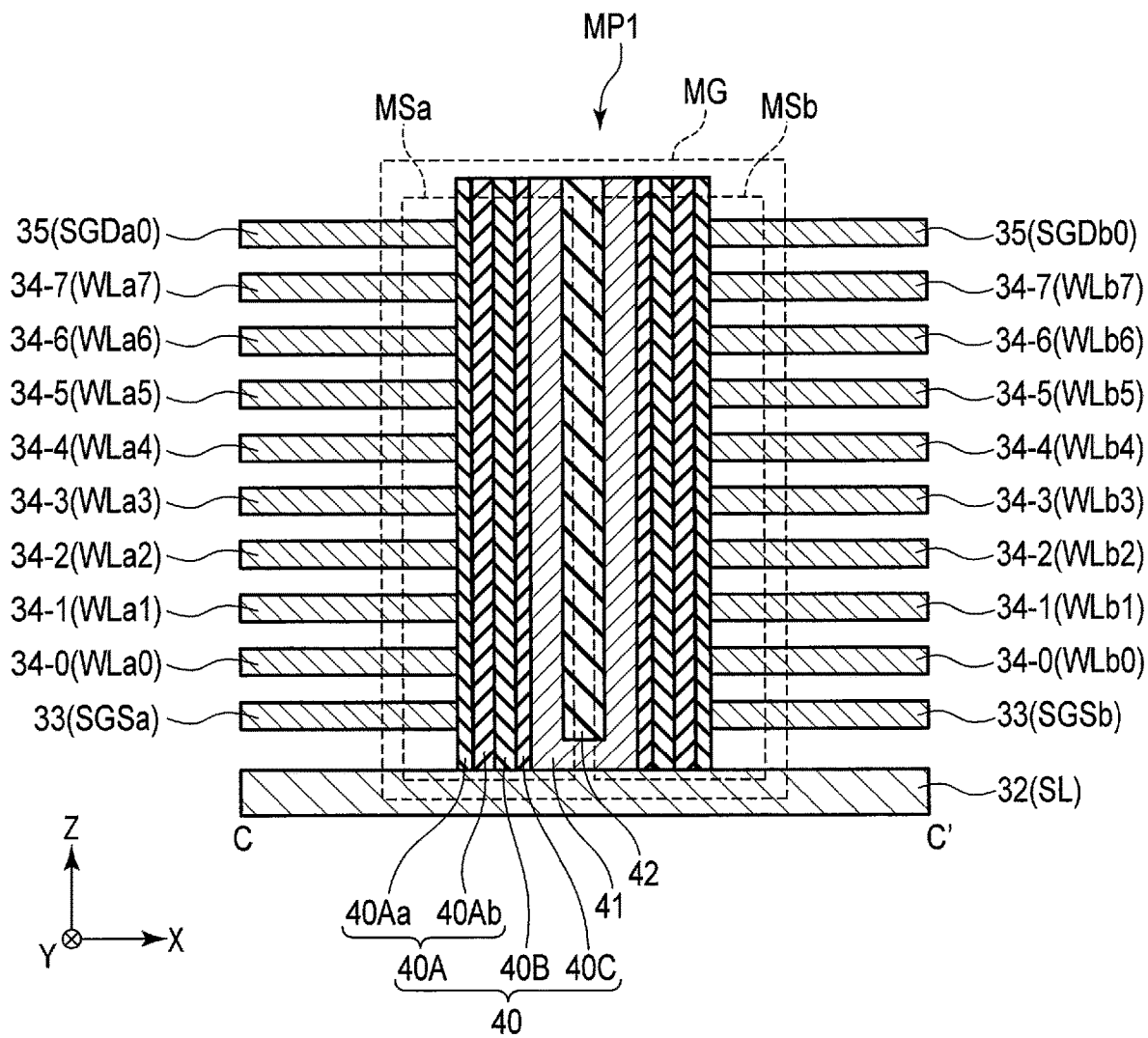
F I G. 6

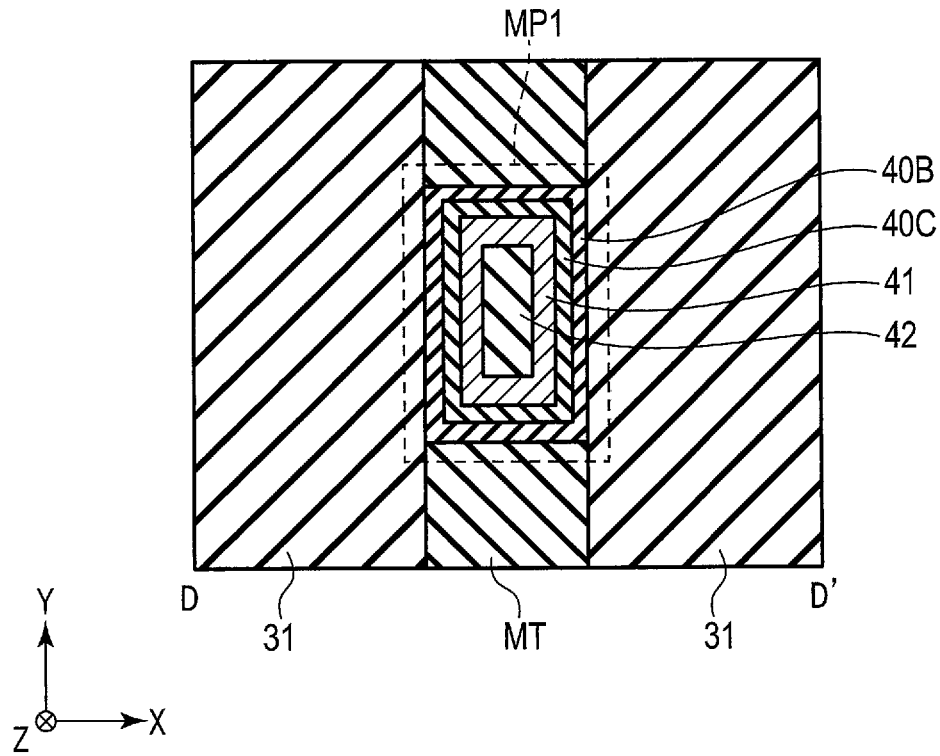
F I G. 9
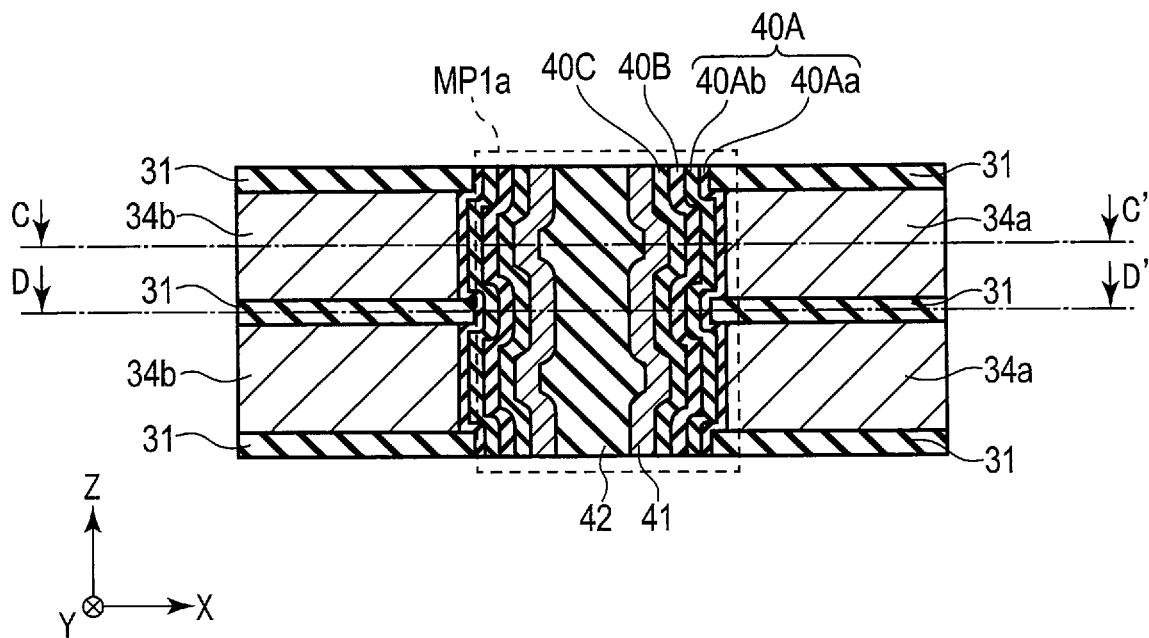
F I G. 10

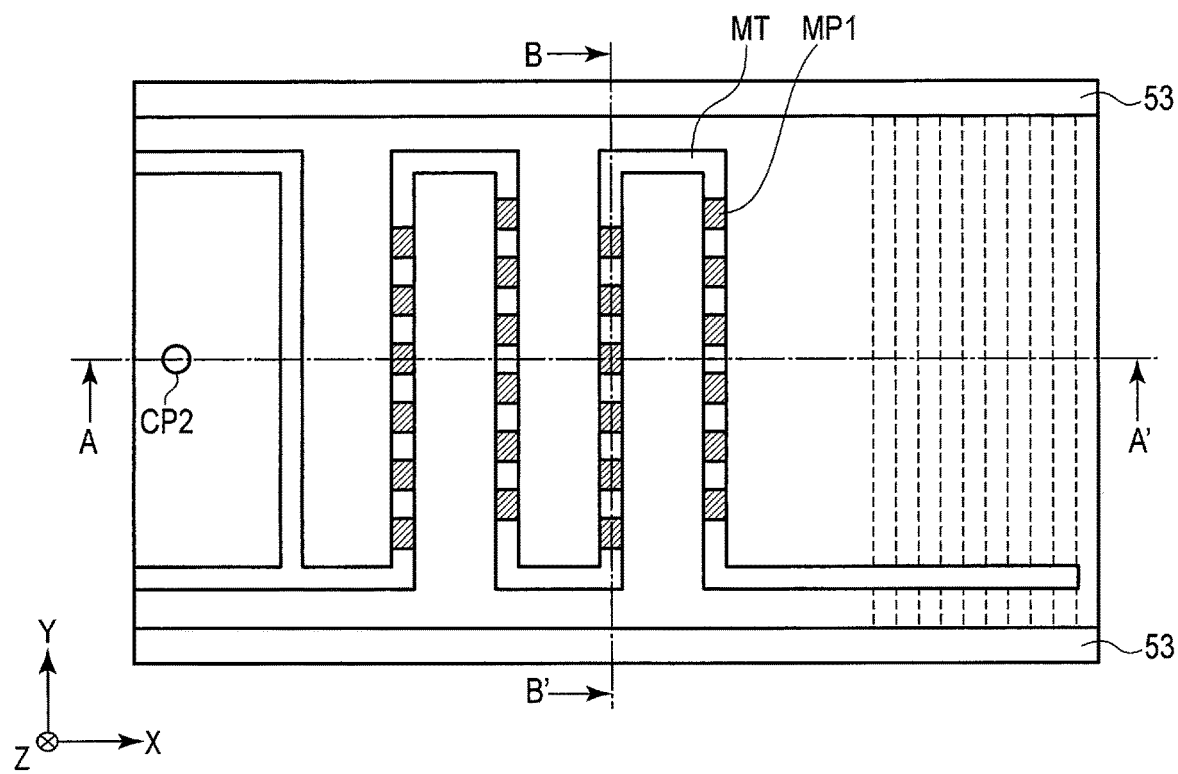
F I G. 31
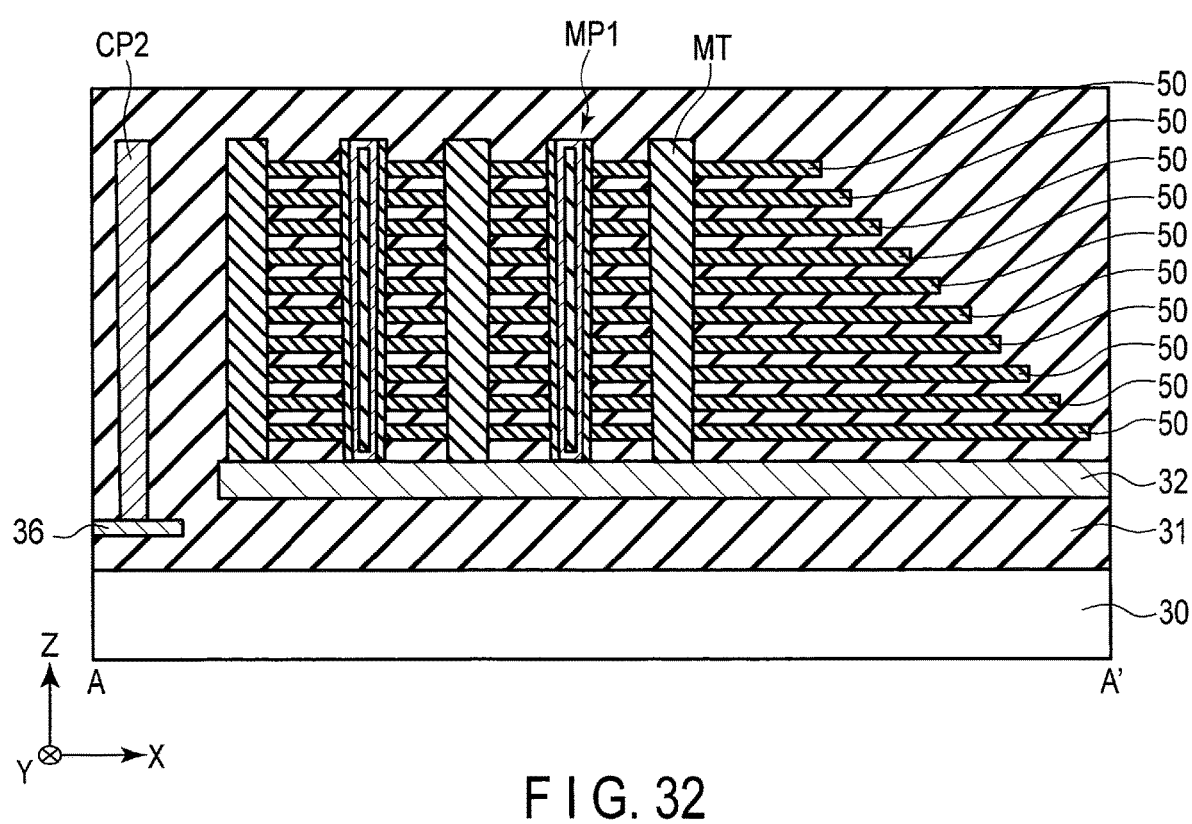
F I G. 32

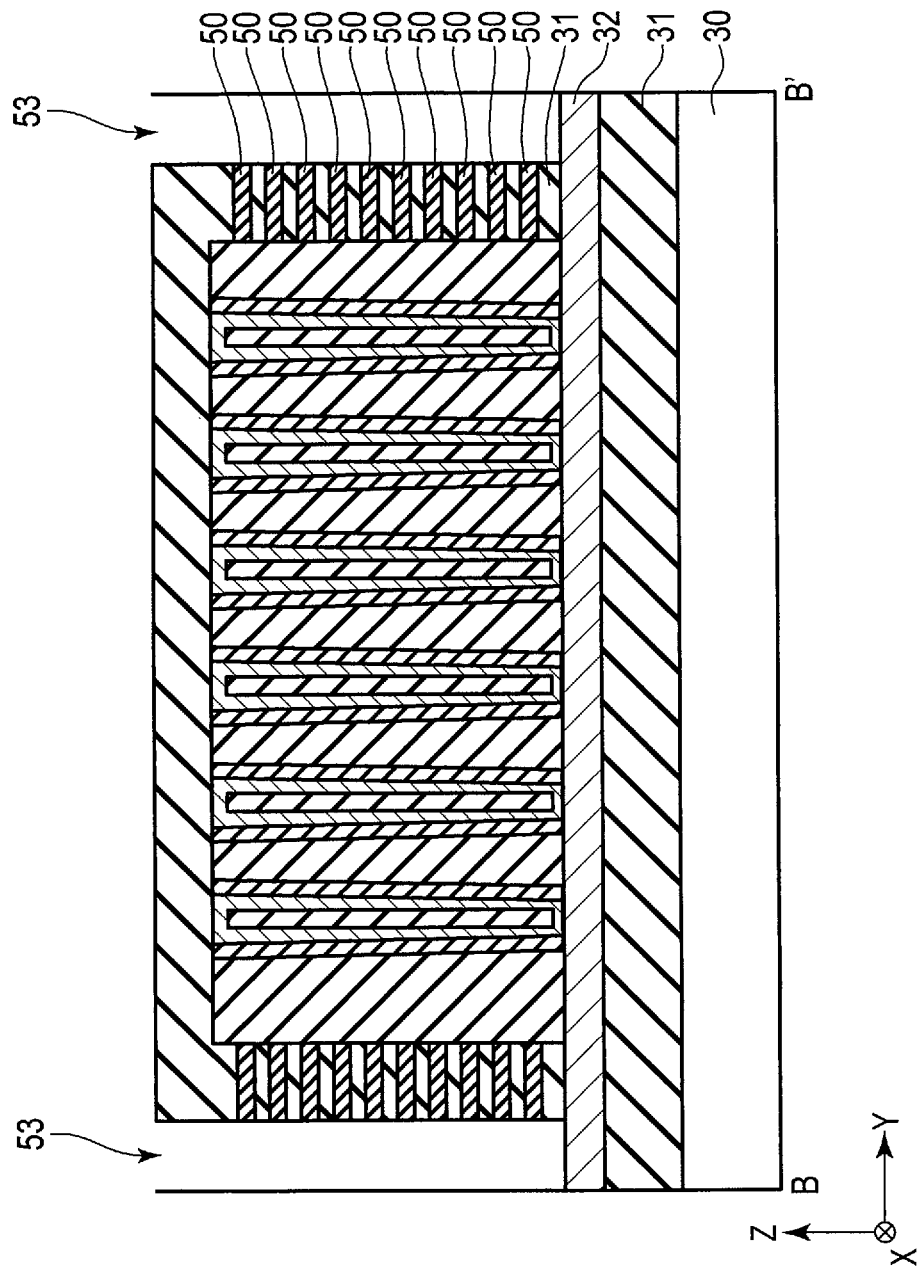
F I G. 33

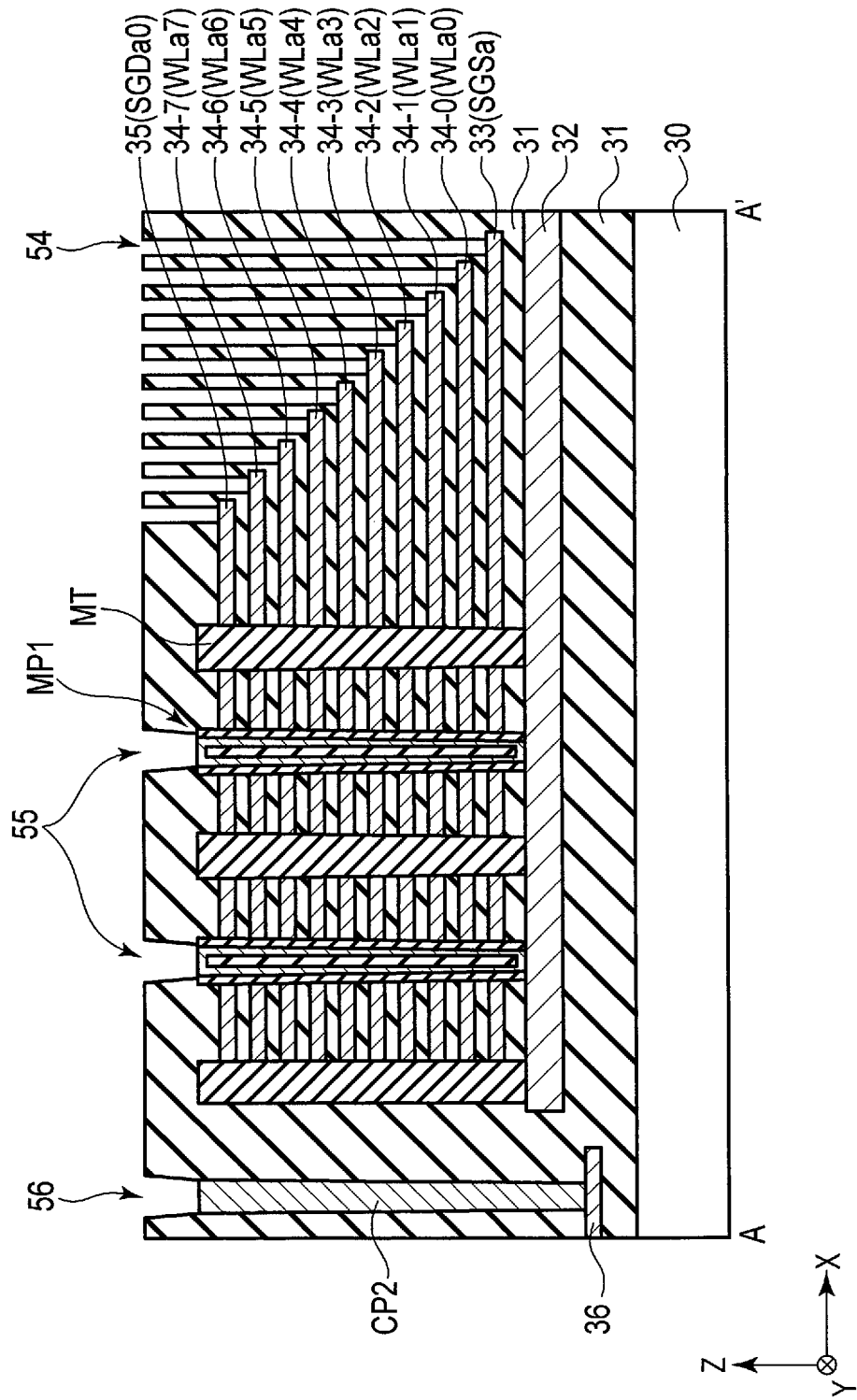
F I G. 38

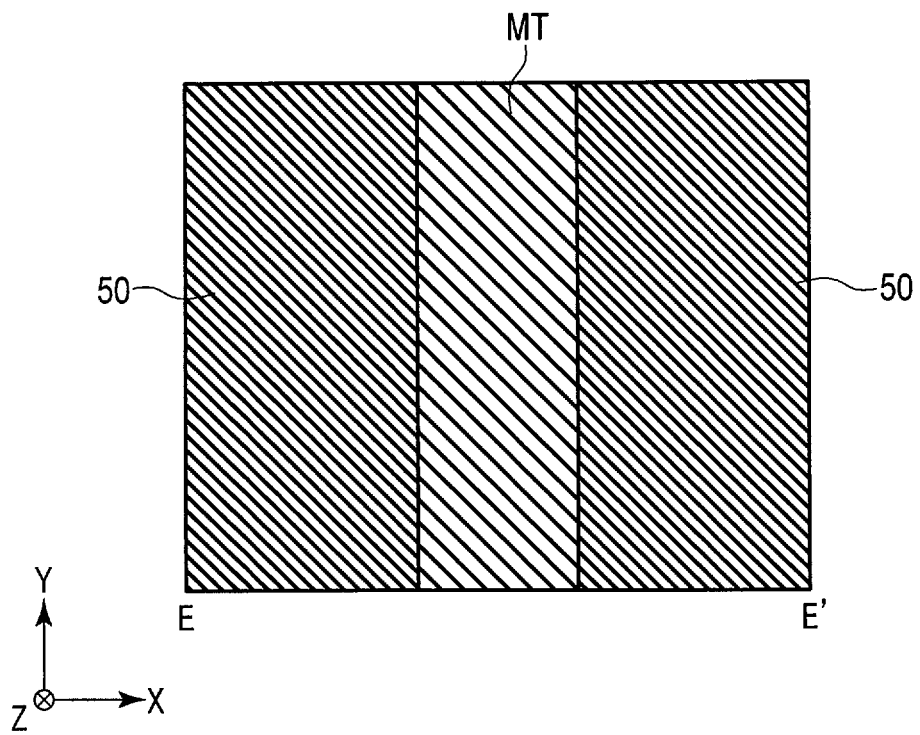
F I G. 43
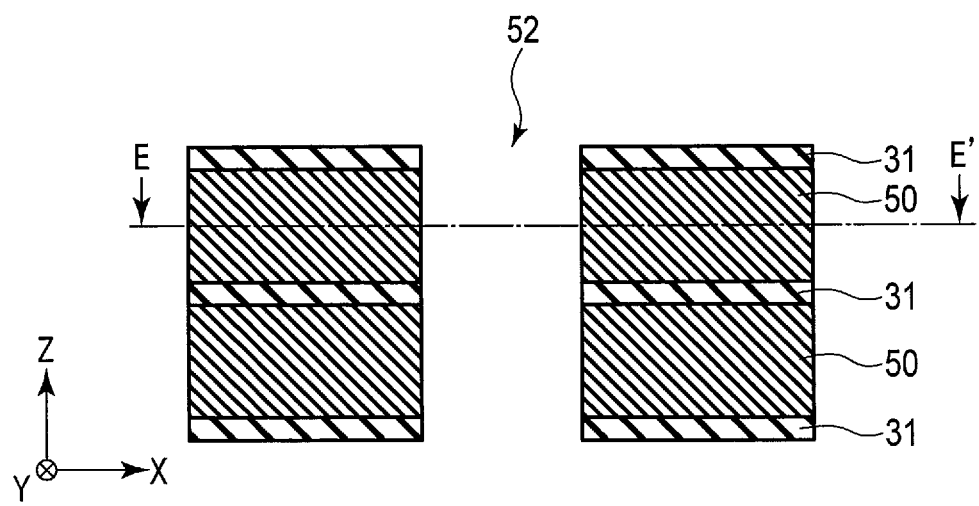
F I G. 44

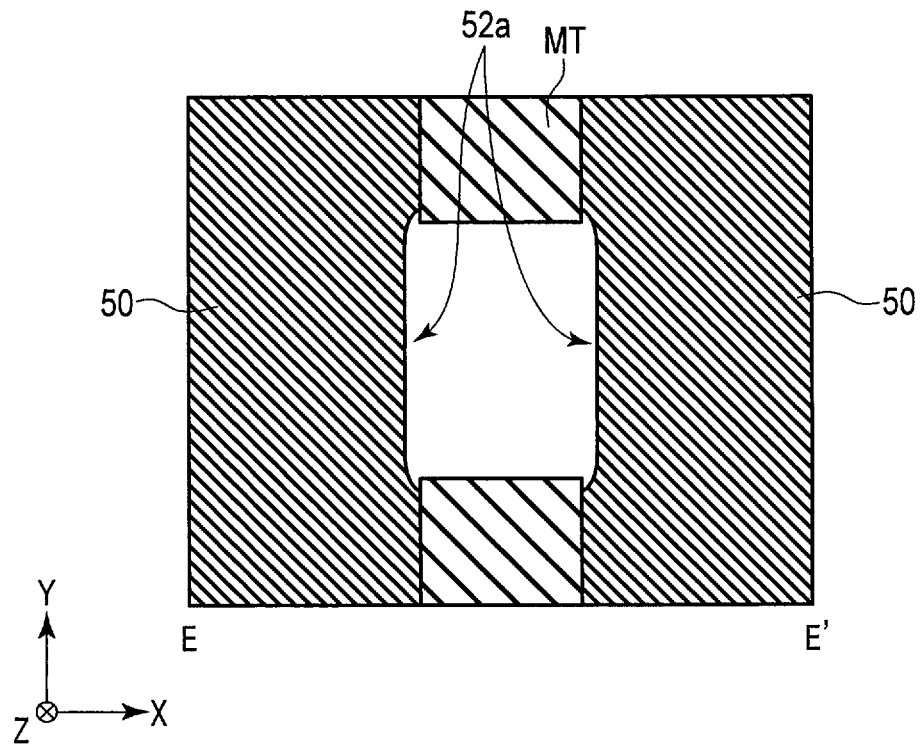
F I G. 47
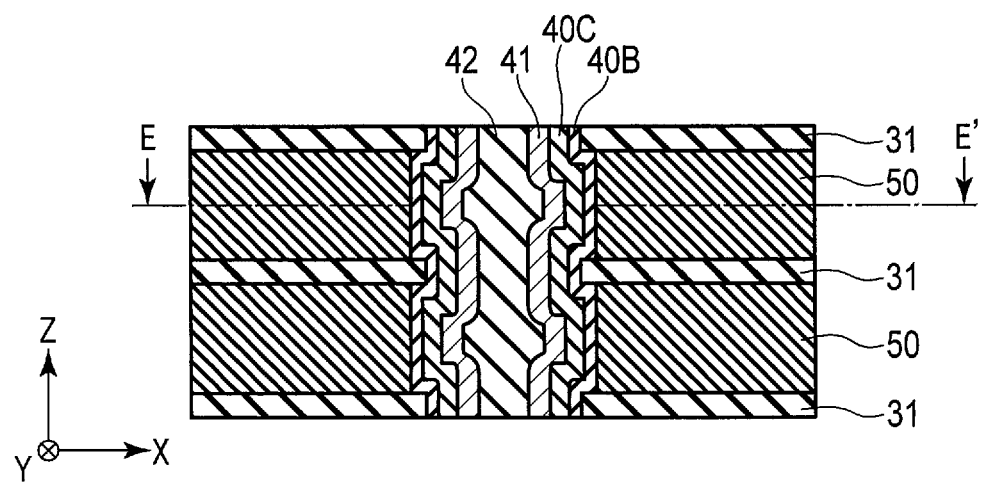
F I G. 48

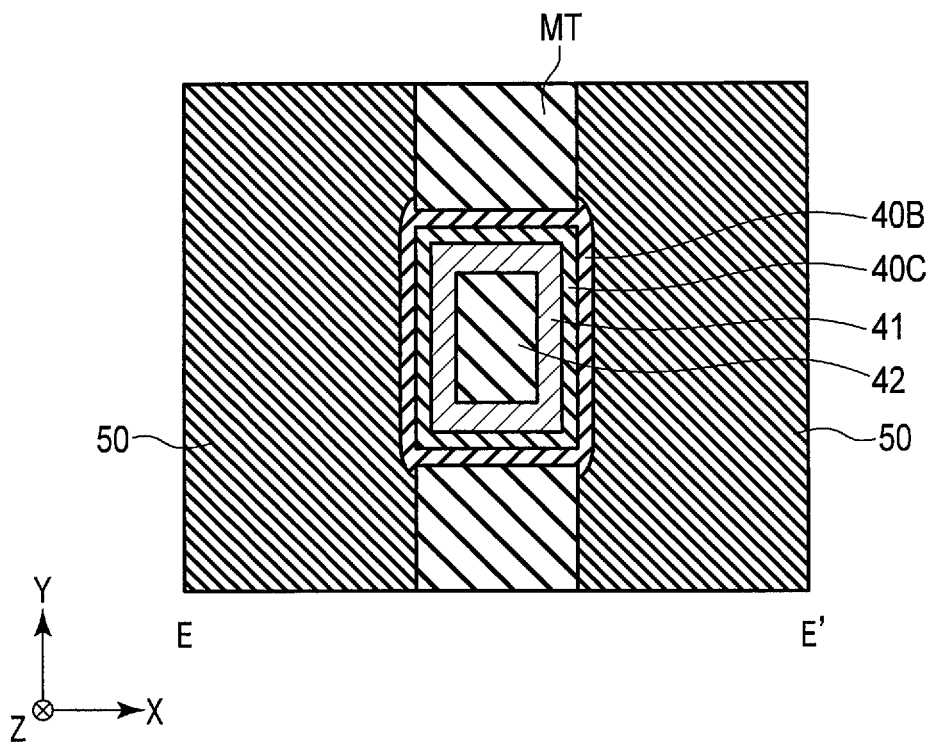
F I G. 49
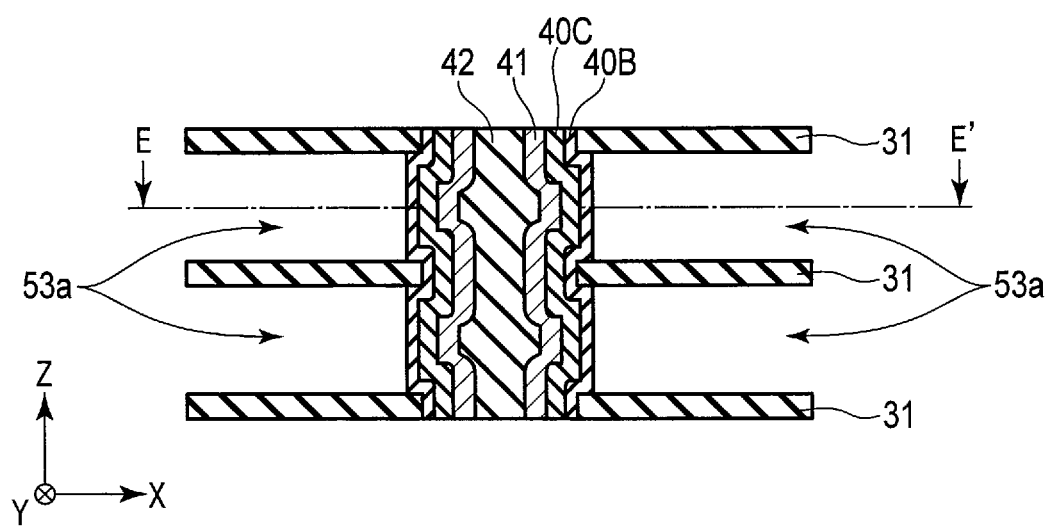
F I G. 50

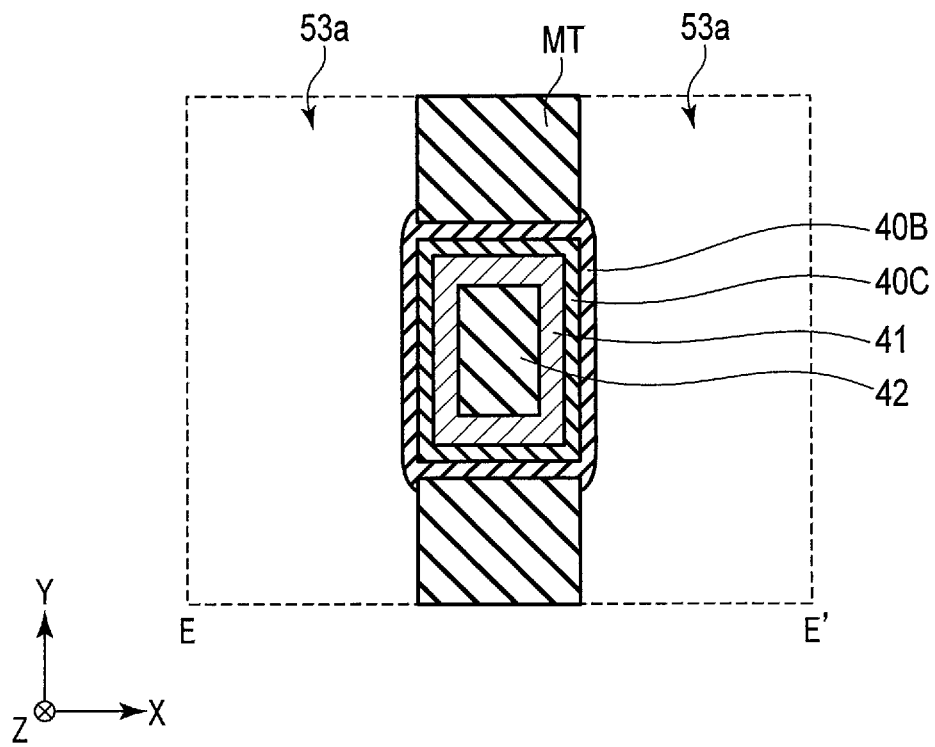
F I G. 51
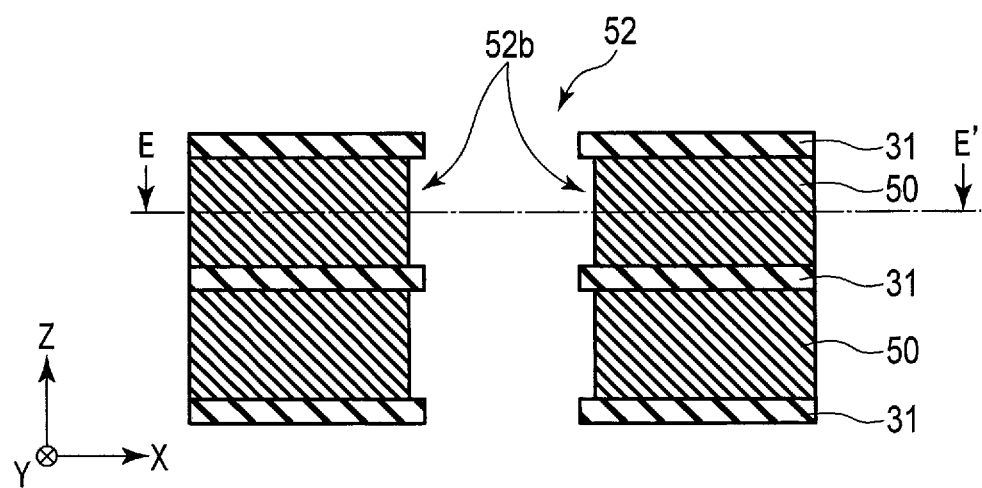
F I G. 52

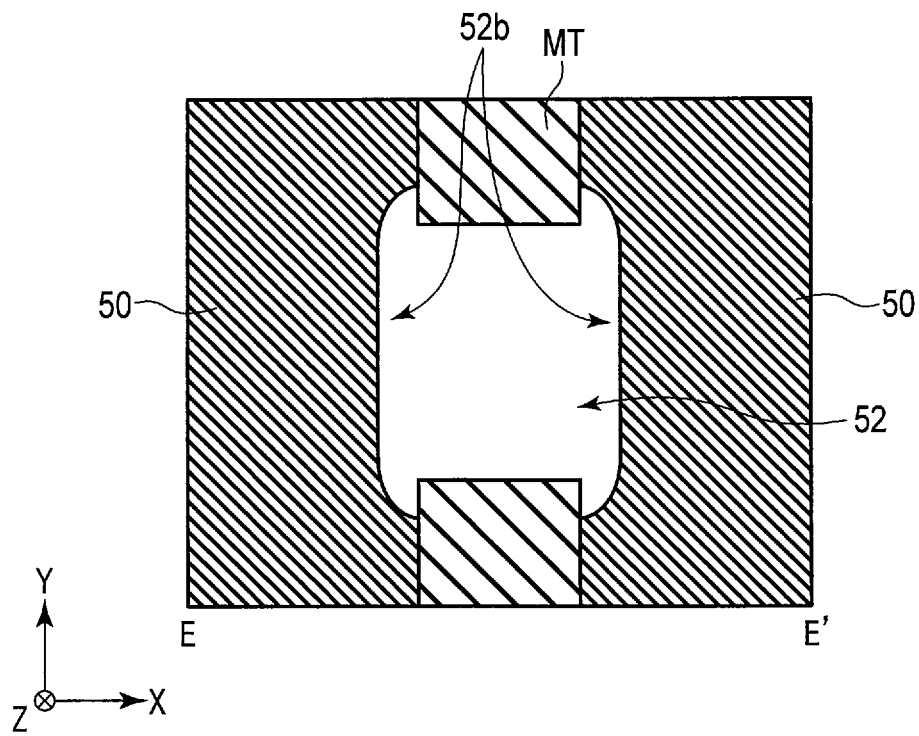
F I G. 53
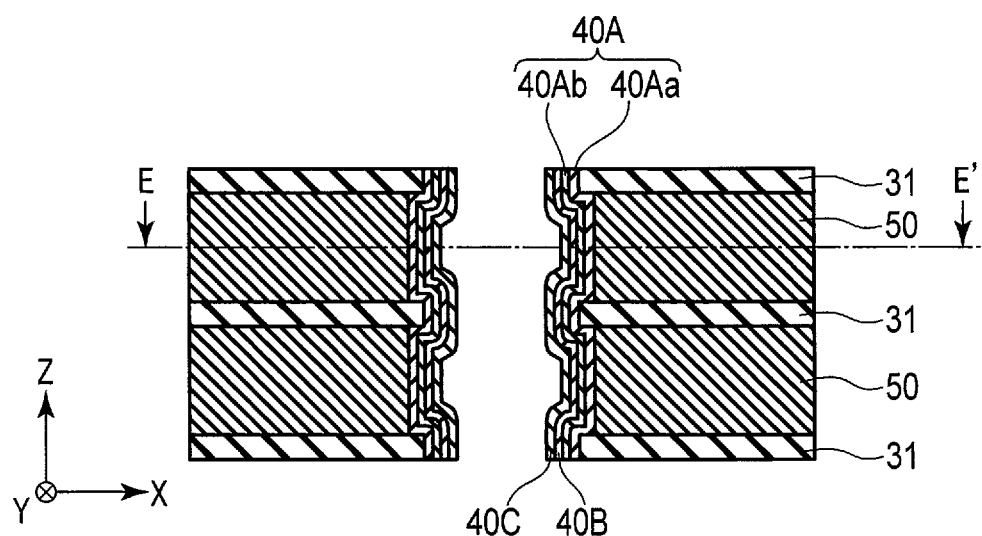
F I G. 54

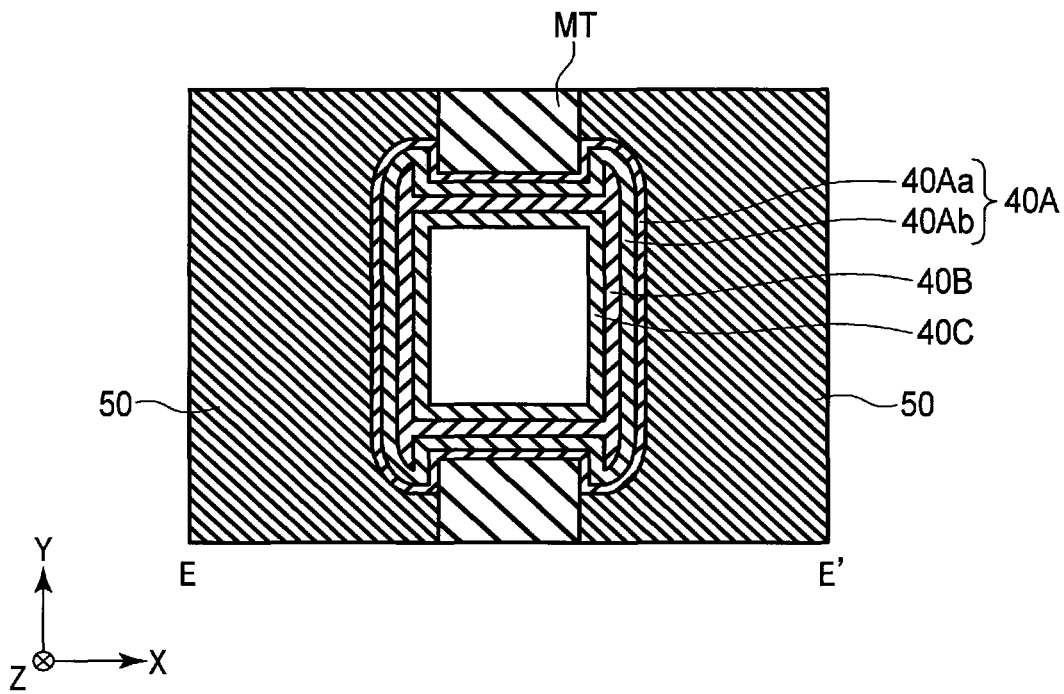
F I G. 55
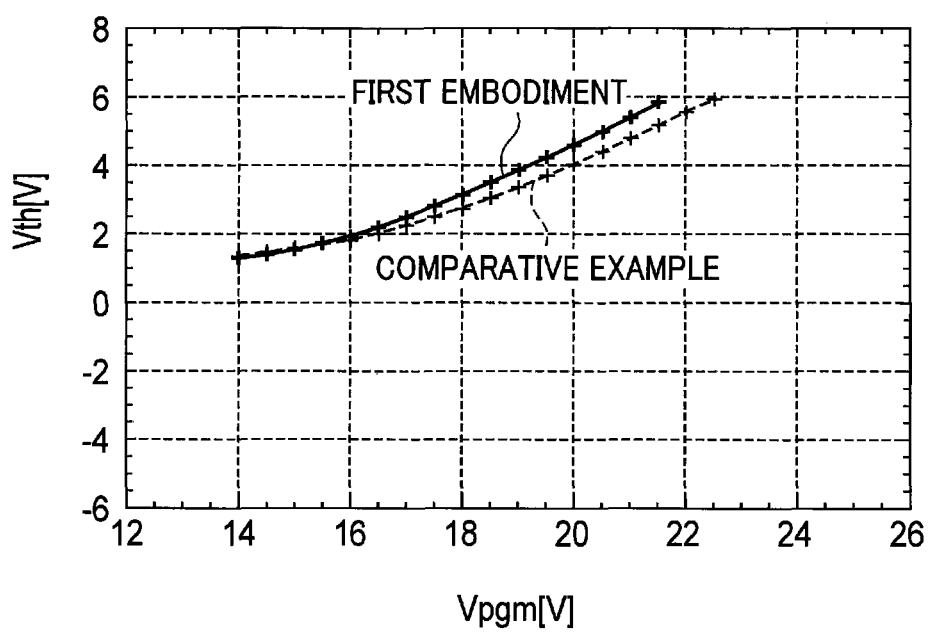
F I G. 56

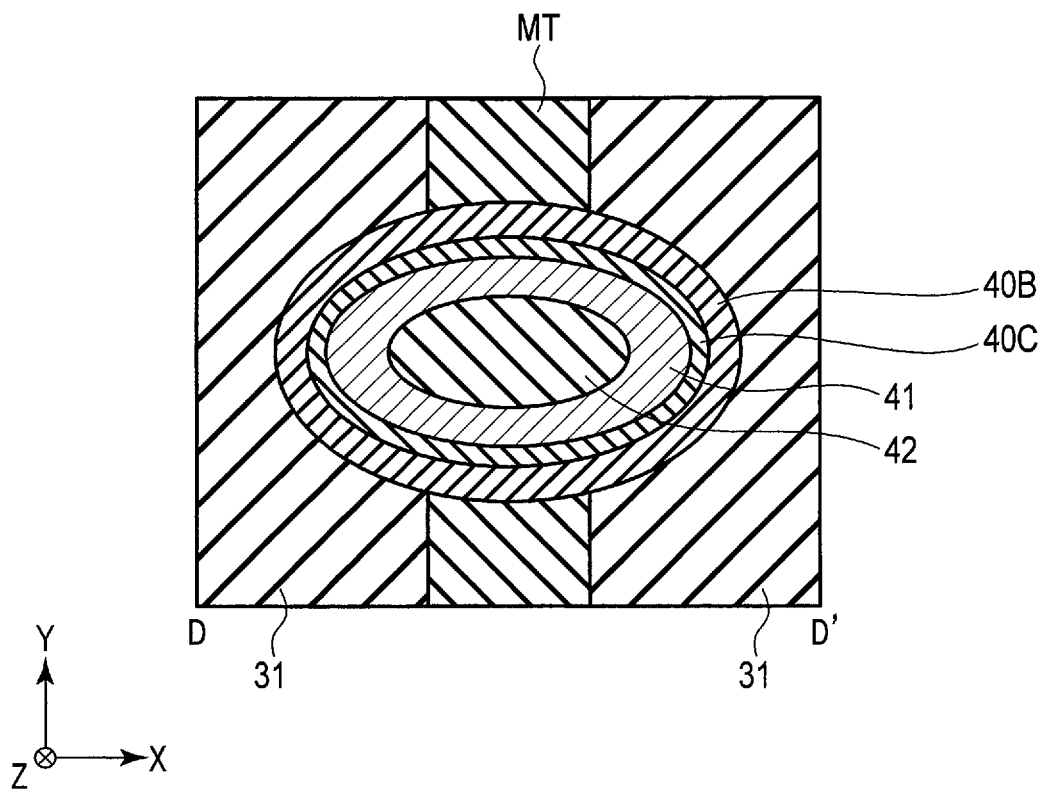
F I G. 62
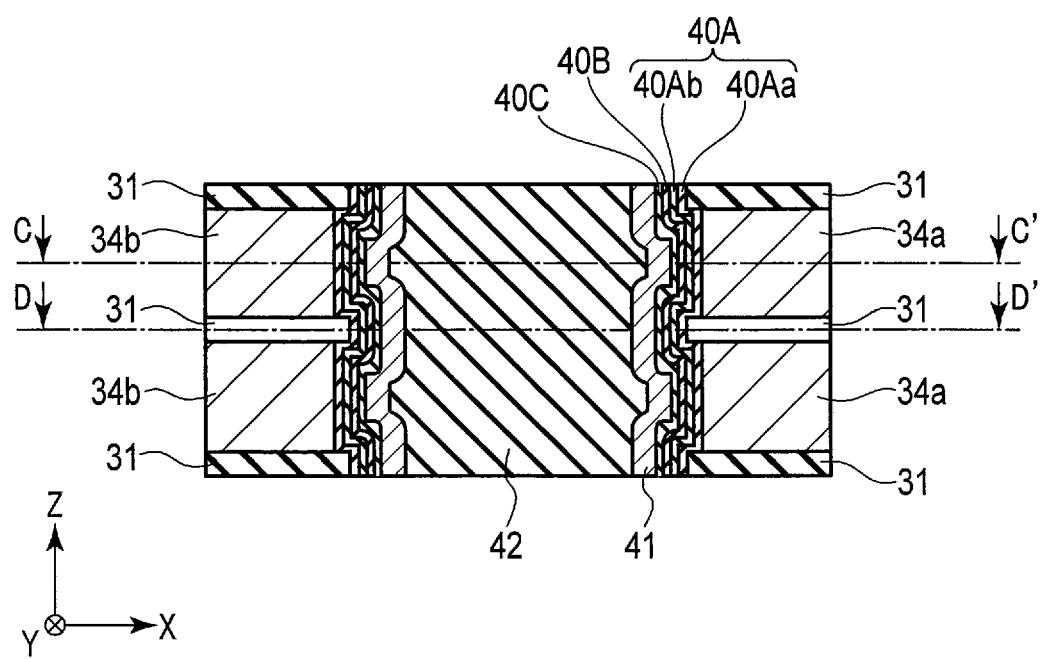
F I G. 63

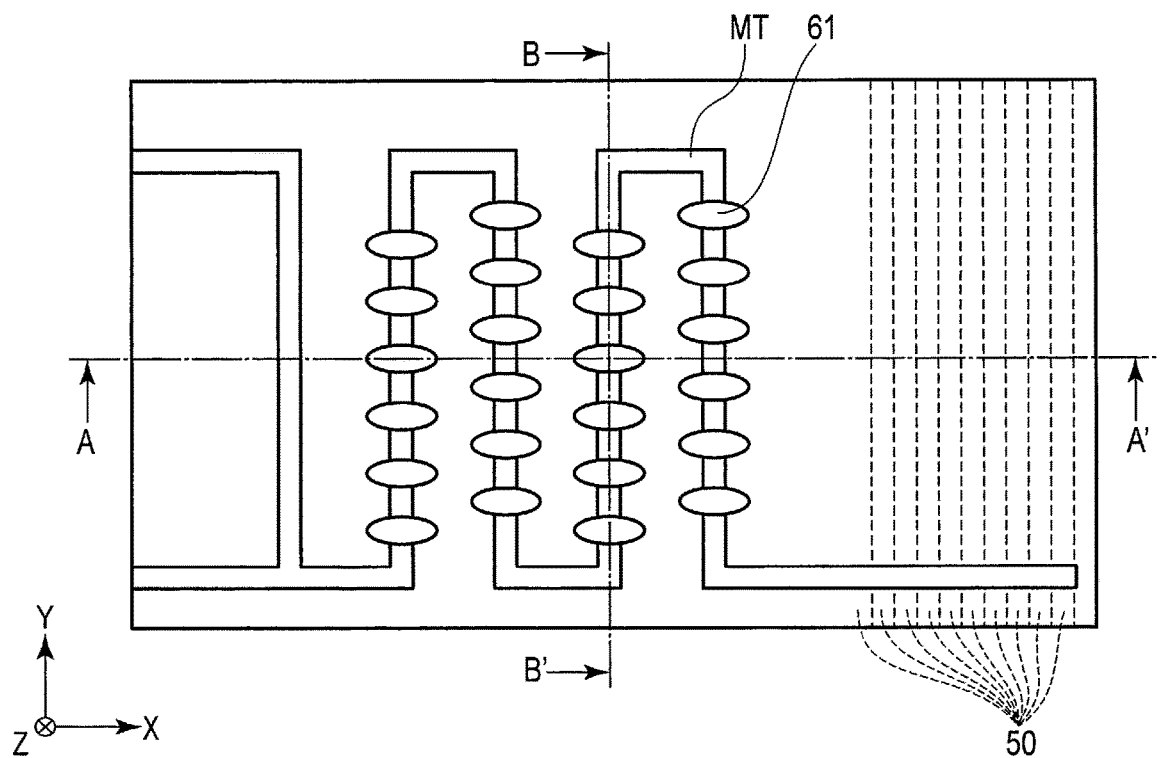
F I G. 66
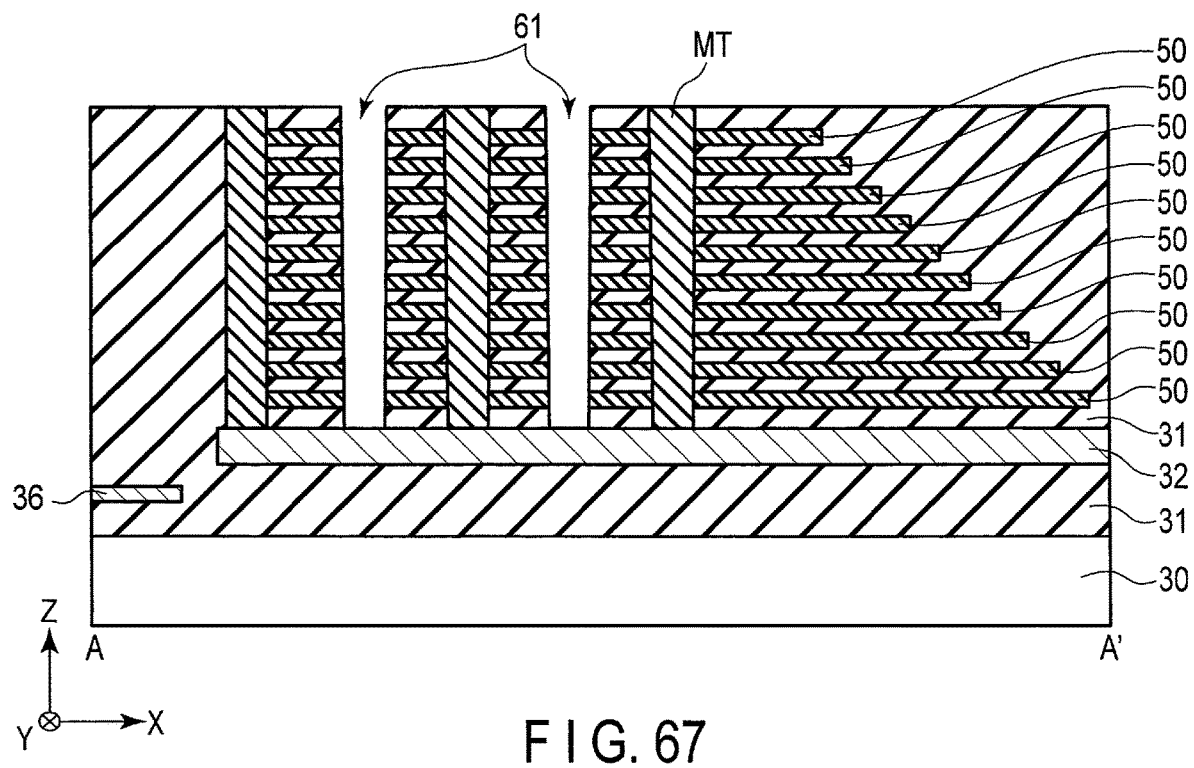
F I G. 67

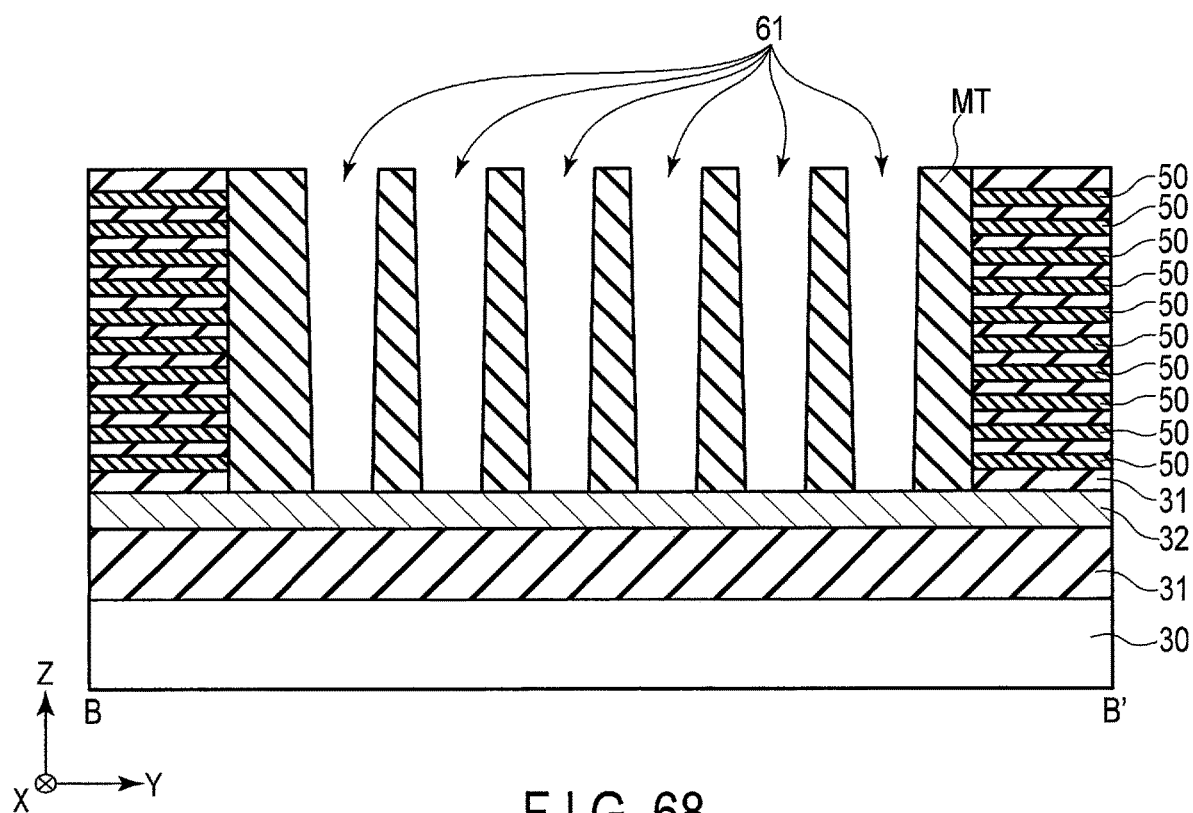
F I G. 68
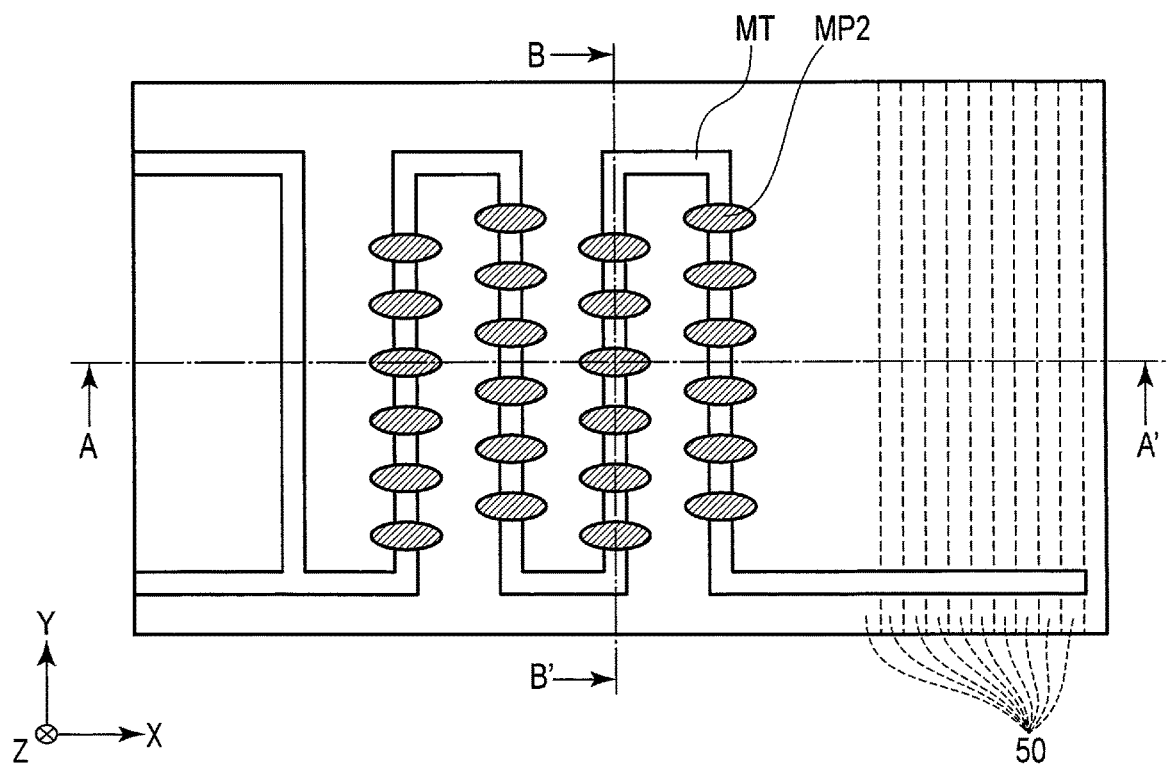
F I G. 69

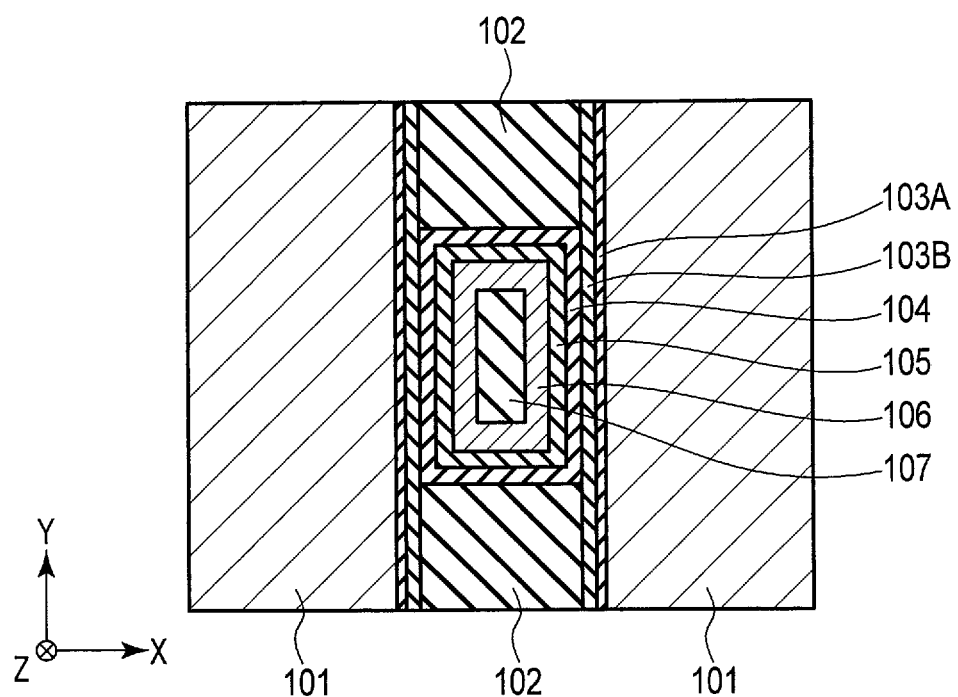
F I G. 74

SEMICONDUCTOR MEMORY DEVICE

CROSS-REFERENCE TO RELATED APPLICATIONS

This application is based upon and claims the benefit of priority from the Japanese Patent Application No. 2018-176315, filed Sep. 20, 2018, the entire contents of which are incorporated herein by reference.

FIELD

Embodiments described herein relate generally to a semiconductor memory device.

BACKGROUND

A semiconductor memory device having three-dimensionally arranged memory cells is known.

BRIEF DESCRIPTION OF THE DRAWINGS

FIG. 1 is a block diagram showing a configuration of a semiconductor memory device of a first embodiment.

FIG. 2 is a circuit diagram of a block included in a memory cell array in the first embodiment.

FIG. 6 is a cross-sectional view of a memory pillar, taken along plane XZ in the first embodiment.

FIG. 9 is a cross-sectional view taken along line D-D' shown in FIG. 7.

FIG. 10 is a detailed cross-sectional view showing a modification of the memory pillar, taken along plane XZ in the first embodiment.

FIG. 31 is a plan view of a structure of the semiconductor memory device in a manufacturing step.

FIG. 32 is a cross-sectional view of the structure of the semiconductor memory device in the manufacturing step, taken along line A-A'.

FIG. 33 is a cross-sectional view of the structure of the semiconductor memory device in the manufacturing step, taken along line B-B'.

FIG. 38 is a cross-sectional view of the structure of the semiconductor memory device in the manufacturing step, taken along line A-A'.

FIG. 43 is a cross-sectional view of the structure of the memory pillar in the manufacturing step, taken along line E-E'.

FIG. 44 is a cross-sectional view of a structure of the memory pillar in a manufacturing step, taken along plane XZ.

FIG. 47 is a cross-sectional view of the structure of the memory pillar in the manufacturing step, taken along line E-E'.

FIG. 48 is a cross-sectional view of a structure of the memory pillar in a manufacturing step, taken along plane XZ.

FIG. 49 is a cross-sectional view of the structure of the memory pillar in the manufacturing step, taken along line E-E'.

FIG. 50 is a cross-sectional view of a structure of the memory pillar in a manufacturing step, taken along plane XZ.

FIG. 51 is a cross-sectional view of the structure of the memory pillar in the manufacturing step, taken along line E-E'.

FIG. 52 is a cross-sectional view of a structure of the modification of the memory pillar in a manufacturing step, taken along plane XZ.

FIG. 53 is a cross-sectional view of the structure of the modification of the memory pillar in the manufacturing step, taken along line E-E'.

FIG. 54 is a cross-sectional view of a structure of the modification of the memory pillar in a manufacturing step, taken along plane XZ.

FIG. 55 is a cross-sectional view of the structure of the modification of the memory pillar in the manufacturing step, taken along line E-E'.

FIG. 56 is a diagram showing write characteristics of the first embodiment and a comparative example in a write operation.

FIG. 62 is a cross-sectional view taken along line D-D' shown in FIG. 60.

FIG. 63 is a detailed cross-sectional view showing a modification of the memory pillar, taken along plane XZ in the second embodiment.

FIG. 66 is a plan view of a structure of the semiconductor memory device in a manufacturing step in the second embodiment.

FIG. 67 is a cross-sectional view of the structure of the semiconductor memory device in the manufacturing step, taken along line A-A'.

FIG. 68 is a cross-sectional view of the structure of the semiconductor memory device in the manufacturing step, taken along line B-B'.

FIG. 69 is a plan view of a structure of the semiconductor memory device in a manufacturing step.

FIG. 74 is a cross-sectional view showing a structure of a memory pillar of a comparative example.

DETAILED DESCRIPTION

Figure 3:
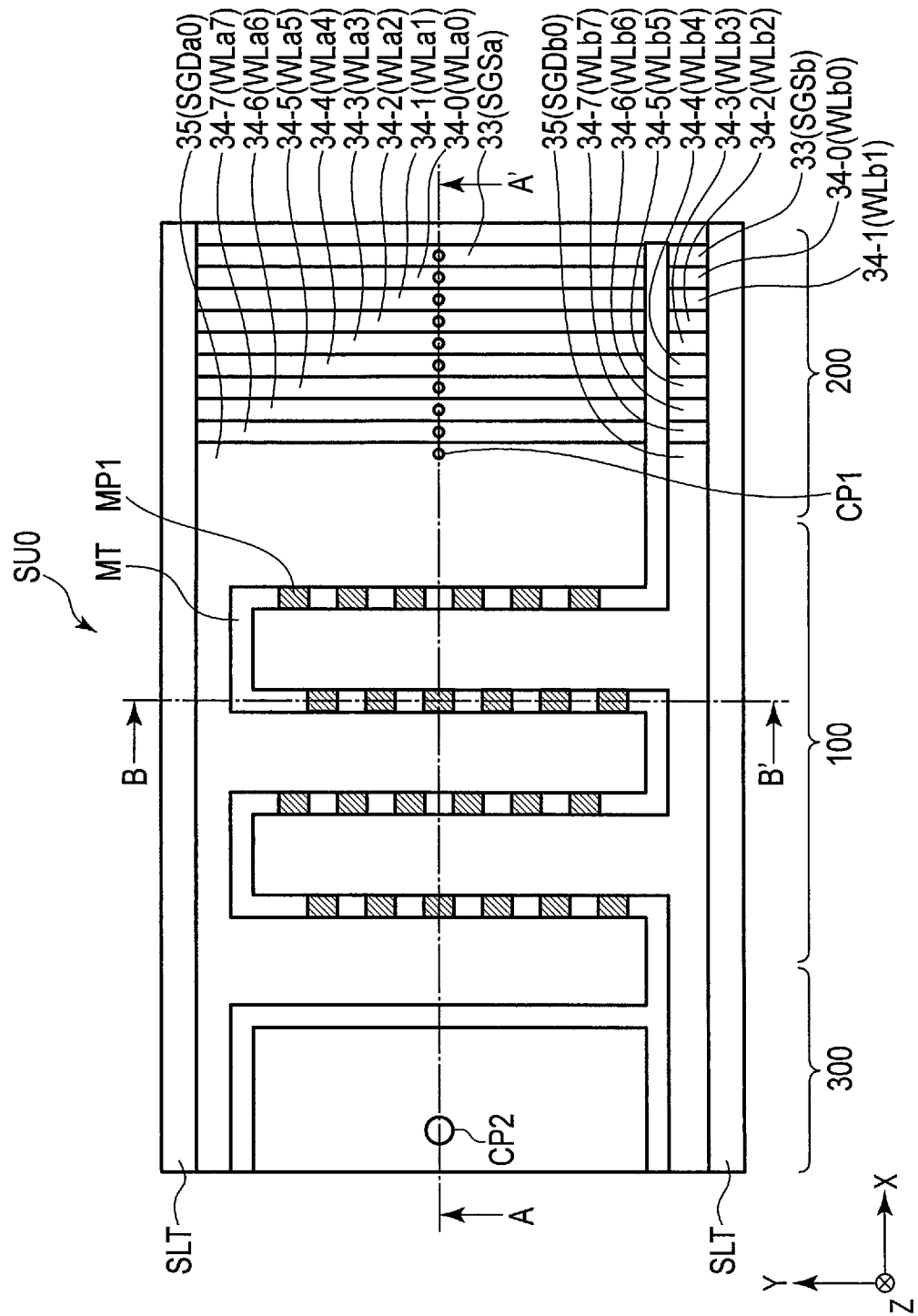
FIG. 3 is a plan view showing an example of the memory cell array in the first embodiment.

In general, according to one embodiment, a semiconductor memory device comprises: first conductive layers stacked in a first direction; second conductive layers stacked in the first direction and spaced from at least the first conductive layers in a second direction crossing the first direction; insulation regions provided between the first conductive layers and the second conductive layers, the insulation regions extending in the first direction; and a pillar arranged between the first conductive layers and the second conductive layers, the pillar being arranged between the insulation regions, and extending in the first direction. The pillar includes a charge storage film, a first insulation film, and a semiconductor layer, which are provided sequentially from the first conductive layers. A second insulation film is provided between the charge storage film and the first conductive layers. A portion of the charge storage film is provided between one of the insulation regions and the first conductive layers at an end of a portion where the first conductive layers and the pillar face each other.

Embodiments will be described with reference to the accompanying drawings. In the descriptions below, structural elements having the same functions and configurations will be denoted by the same reference symbols. Each of the embodiments described below merely shows an exemplary apparatus or method for implementing the technical idea of the embodiment. The materials, shapes, structures, arrangements, and the like, of the components are not limited to those described below.

Each of the function blocks can be implemented in the form of hardware, computer software, or a combination thereof. The function blocks do not have to be categorized as in the example described below. For example, some functions may be implemented by a function block other than the exemplary function blocks. In addition, the exemplary function blocks may be further divided into function sub-blocks. In the embodiments, a three-dimensionally stacked NAND flash memory with memory cell transistors three-dimensionally stacked above a semiconductor substrate will be described as an example of a nonvolatile semiconductor memory device.

1. First Embodiment

A semiconductor memory device of the first embodiment will be described below.

1.1. Configuration of Semiconductor Memory Device

First, a block configuration of the semiconductor memory device of the first embodiment will be described. FIG. 1 is a block diagram showing a configuration of the semiconductor memory device of the embodiment. In FIG. 1, some of the couplings between blocks are indicated by directional lines, but the couplings between blocks are not limited thereto.

A semiconductor memory device 1 includes a memory cell array 11, a row decoder 12, a sense amplifier 13, a voltage generator 14, and a sequencer 15, as shown in FIG. 1.

1.1.1. Configuration of Each Block

A configuration of each block will be described below.

The memory cell array 11 includes a plurality of blocks BLK0, BLK1, BLK2, . . . , BLKn (n being an integer of 0 or greater). Hereinafter, the "block BLK" denotes each of blocks BLK0 to BLKn. The block BLK is associated with interconnects extending in a row direction and a column direction, and includes a plurality of three-dimensionally arranged memory cell transistors. The memory cell array 11 and the block BLK will be detailed later.

The row decoder 12 decodes a row address received from an external controller (not shown). The row decoder 12 selects one of the blocks BLK based on a result of decoding a row address, and selects a word line in the selected block BLK. Specifically, the row decoder 12 applies voltages to various interconnects for selecting a word line.

In a data read operation, the sense amplifier 13 senses data read from any of the blocks BLK and performs a necessary arithmetic operation. In a data write operation, the sense amplifier 13 transfers a voltage corresponding to write data to the memory cell array 11.

The voltage generator 14 generates voltages necessary for a write operation, a read operation, and an erase operation, and supplies the voltages to the row decoder 12, the sense amplifier 13, etc.

The sequencer 15 controls the operation of the entire semiconductor memory device 1. Specifically, the sequencer 15 controls the voltage generator 14, the row decoder 12, the sense amplifier 13, etc., when a write operation, a read operation, and an erase operation are performed based on commands from the external controller.

1.1.2. Circuit Configuration of Memory Cell Array 11

The memory cell array 11 includes blocks BLK0 to BLKn, as described above. The blocks BLK0 to BLKn have the same configuration. A circuit configuration of one block BLK will be described below.

FIG. 2 is a circuit diagram of a block BLK included in the memory cell array 11. The block BLK includes a plurality of string units SU0, SU4, . . . . . Hereinafter, the "string unit SU" denotes each of the plurality of string units. The string unit SU includes a plurality of memory groups MG. Each memory group MG includes two memory strings, MSa and MSb, coupled to each other in parallel. Hereinafter, the memory strings MSa and MSb will be referred to as memory strings MS, unless they are specified.

The memory string MSa includes, for example, eight memory cell transistors (hereinafter also referred to as "memory cells") MCa0 to MCa7 and select transistors STa1 and STa2. Likewise, the memory string MSb includes, for example, eight memory cell transistors (hereinafter also referred to as "memory cells") MCb0 to MCb7 and select transistors STb1 and STb2. Hereinafter, the memory cell transistors MCa0 to MCa7 and MCb0 to MCb7 will be referred to as "memory cell transistors MC", unless they are specified. Also, the select transistors STa1 and STb1 will be referred to as "select transistors ST1", and the select transistors STa2 and STb2 will be referred to as "select transistors ST2", unless they are specified.

Each memory cell transistor MC includes a control gate and a charge storage film, and stores data in a nonvolatile manner. Each memory cell transistor MC may be of a MONOS type that uses an insulation layer for the charge storage film, or of an FG type that uses a conductive layer for the charge storage film. In the embodiment, a MONOS-type memory cell transistor will be described as an example.

The number of memory cell transistors MC included in each memory string MS may be, but is not limited to, 16, 32, 48, 64, 96, 128, etc. The number of select transistors ST1 and ST2 included in each memory string MS is also discretionary as long as at least one select transistor ST1, and at least one select transistor ST2, are provided.

The memory cell transistors MC and select transistors ST1 and ST2 included in the memory string MS are coupled in series. Specifically, in the memory string MSa, the current paths of the select transistor STa2, the memory cell transistors MCa0 through MCa7, and the select transistor STa1 are coupled in series in the order mentioned. Likewise, in the memory string MSb, the current paths of the select transistor STb2, the memory cell transistors MCb0 through MCb7, and the select transistor STb1 are coupled in series in the order mentioned.

The drain of the select transistor STa1 and the drain of the select transistor STb1 included in one memory group MG are coupled to one of a plurality of bit lines BL0, BL (m-1) ((m-1) being an integer of 2 or greater) Hereinafter, the "bit line BL" denotes each of bit lines BL0 to BL(m-1). The bit lines BL are independently controlled by the sense amplifier 13. The source of the select transistor STa2 and the source of the select transistor STb2 included in one memory group MG are coupled to a source line SL.

Each of the gates of the select transistors STa1 in the string units SU is coupled to a select gate line SGDa (SGDa0 or SGDa1, . . . ). Each of the gates of the select transistors STb1 is coupled to a select gate line SGDb (SGDb0 or SGDb1, . . . ). Specifically, in the string unit SU0, the gates of the select transistors STa1 are coupled to the select gate line SGDa0, and the gates of the select transistors STb1 are coupled to the select gate line SGDb0. Likewise, in the string unit SU1, the gates of the select transistors STa1 are coupled to the select gate line SGDa1, and the gates of the select transistors STb1 are coupled to the select gate line SGDb1. Hereinafter, the select gate lines SGDa and SGDb will be referred to as "select gate lines SGD", unless they are specified. Each select gate line SGD is independently controlled by the row decoder 12.

In each block BLK, the gates of the select transistors STa2 are coupled to the select gate line SGSa, and the gates of the select transistors STb2 are coupled to the select gate line SGSb. The select gate lines SGSa and SGSb may be, for example, similarly controlled by the row decoder 12 or independently controlled by the row decoder 12. Hereinafter, the select gate lines SGSa and SGSb will be referred to as "select gate lines SGS", unless they are specified.

In each block BLK, the control gates of the memory cell transistors MCa0 through MCa7 are coupled in common to word lines WLa0 through WLa7, respectively, that are provided in each block ELK, and the control gates of the memory cell transistors MCb0 through MCb7 are coupled in common to word lines WLb0 through WLb7, respectively, that are provided in each block BLK. The word lines WLa0 through WLa7 and WLb0 through WLb7 are independently controlled by the row decoder 12. Hereinafter, the "word line WLa" denotes each of the word lines WLa0 to WLa7, and the "word line WLb" denotes each of the word lines WLb0 to WLb7. Also, the word lines WLa and WLb will be referred to as "word lines WL", unless they are specified.

The block BLK is a unit of data erasure, for example, and data stored in the memory cell transistors MC included in each block BLK is erased in a batch. A write operation and a read operation are performed in a batch on the memory cell transistors MC coupled to one word line WL of one string unit SU.

In the memory cell array 11, the drains of the select transistors STa1 and STb1 in the memory groups MG arranged in the same row are coupled to one bit line BL. Namely, each bit line BL couples together its corresponding memory groups MG in the respective string units SU. Each string unit SU includes a plurality of memory groups MG coupled to different bit lines BL and coupled to the same select gate lines SGD.

Each block BLK includes a plurality of string units SU sharing the word lines WL. The memory cell array 11 includes a plurality of blocks BLK sharing the bit lines BL. In the memory cell array 11, the select gate lines SGS, the word lines WL, and the select gate lines SGD are stacked above the semiconductor substrate, so that the memory cell transistors MC are three-dimensionally stacked.

1.1.3. Planar Configuration of Memory Cell Array 11

Next, a planar configuration of the memory cell array 11 will be described with reference to FIG. 3. FIG. 3 is a plan view showing an example of the memory cell array 11, and shows a part of the string unit SU0. In FIG. 3 and the subsequent drawings, two directions perpendicular to (or crossing) each other and parallel to a semiconductor substrate surface are defined as direction X and direction Y, and a direction perpendicular to (or crossing) direction X and direction Y (plane XY) is defined as direction Z.

The string unit SU0 includes a cell region 100, a hookup region 200, and a contact region 300, as shown in FIG. 3. Specifically, the hookup region 200, the cell region 100, and the contact region 300 are provided, in the order mentioned, from one end of the string unit SU0 to the other end of the string unit SU0 in direction X parallel to the semiconductor substrate. The hookup region 200 may be provided on both ends of the string unit SU0. A plurality of cell regions 100 and contact regions 300 may be provided in direction X.

In the memory cell array 11, a conductive layer 33, conductive layers 34-0, 34-1, 34-2, 34-3, 34-4, 34-5, 34-6, and 34-7, and a conductive layer 35 are stacked in direction Z perpendicular to the semiconductor substrate surface. The conductive layer 33 functions as the select gate line SGS. The conductive layers 34-0 to 34-7 function as the word lines WL0 to WL7, respectively. The conductive layer 35 functions as the select gate line SGD.

Each of the conductive layer 33, the conductive layers 34-0 to 34-7, and the conductive layer 35 is divided into two by a memory trench MT. A plurality of memory pillars MP1 are provided along the memory trench MT. The memory pillar MP1 will be detailed later. Specifically, the conductive layer 35, for example, is divided into two conductive layers by the memory trench MT, and the two conductive layers function as the select gate lines SGDa0 and SGDb0, respectively. Likewise, each of the conductive layers 34-0 to 34-7 is divided into two conductive layers by the memory trench MT, and the two conductive layers function as the word lines WLa0 to WLa7 and WLb0 to WLb7, respectively. The conductive layer 33 is divided into two conductive layers by the memory trench MT, and the two conductive layers function as the select gate lines SGSa and SGSb, respectively. An insulation material such as silicon oxide is embedded in the memory trench MT.

The conductive layer 35 corresponding to the select gate line SGDa0 and the conductive layer 35 corresponding to the select gate line SGDb0 are alternately arranged via the memory trench MT in direction X. In other words, the select gate lines SGDa0 and SGDb0 each have a comb shape in the cell region 100. The portion of the select gate line SGDa0 (conductive layer 35) having a comb teeth shape and the portion of the select gate line SGDb0 (conductive layer 35) having a comb teeth shape are alternately arranged face-to-face in direction X so as to engage with each other. The same applies to the conductive layers 33 and 34-0 to 34-7, i.e., the select gate lines SGS and the word lines WL0 to WL7. Thus, the memory trench MT has a shape of a rectangular wave extending in direction X in the cell region 100.

In the cell region 100, a plurality of memory pillars MP1 corresponding to the memory groups MG are provided along the memory trench MT, as described above. Each memory pillar MP1 is arranged in a rectangular hole formed in the memory trench MT. Each memory pillar MP1 includes a plurality of memory cell transistors arranged in direction Z.

In this embodiment, six memory pillars MP1 are arranged in direction Y between the conductive layer 35 as the select gate line SGDa0 and the adjacent conductive layer 35 as the select gate line SGDb0, as shown in FIG. 3, for example. The six memory pillars MP1 are arranged in four rows in a staggered manner in direction X. In this embodiment, the memory pillars MP1 are arranged along the shape of the rectangular wave of the memory trench MT, but the form of the arrangement of the memory pillars MP1 in the cell region 100 is discretionary.

In the hookup region 200, end portions of the conductive layers 33, 34-0 to 34-7, and 35 are drawn out in a stepwise manner in direction X. Hereinafter, the area where the end portions of the conductive layers 33, 34-0 to 34-7, and 35 are drawn out in a stepwise manner is referred to as a "hookup area." FIG. 3 shows an example in which the hookup areas corresponding to the select gate line SGSa, the word lines WLa0 to WLa7, and the select gate line SGDa0 are provided at one end of the string unit. SU0, and the hookup areas corresponding to the select gate line SGSb, the word lines WLb0 to WLb7, and the select gate line SGDb0 are provided at the other end (not shown) of the string unit SU0.

A contact plug CP1 is provided on each hookup area, so that the contact plug CP1 is coupled to the hookup area. Namely, the hookup area functions as a coupling with the contact plug CP1. The contact plug CP1 electrically couples the hookup area and an upper interconnect (not shown) that is provided above the memory cell array 11.

In the contact region 300, a plurality of contact plugs CP2 are provided in an area surrounded by the memory trench MT. The contact plug CP2 passes through the memory cell array 11, and electrically couples an upper interconnect that is provided above the memory cell array 11 and a circuit, such as the row decoder 12 or the sense amplifier 13 (not shown), that is provided below the memory cell array 11.

The area surrounded by the memory trench MT is formed of an insulation layer so that the contact plug CP2 does not contact the word lines WL and the select gate lines SGD and SGS. The number of contact plugs CP2 arranged in the area surrounded by the memory trench MT is discretionary.

Two slits SLT extending in direction X are provided so that the slits are respectively in contact with two sides of the string unit SU0 extending in direction X. An insulation material such as silicon oxide is embedded in each slit SLT. The side surface of the slit SLT is in contact with the side surfaces of the conductive layers 33, 34-0 to 34-7, and 35.

1.1.4. Cross-Sectional Configuration of Memory Cell Array 11

Figure 4:
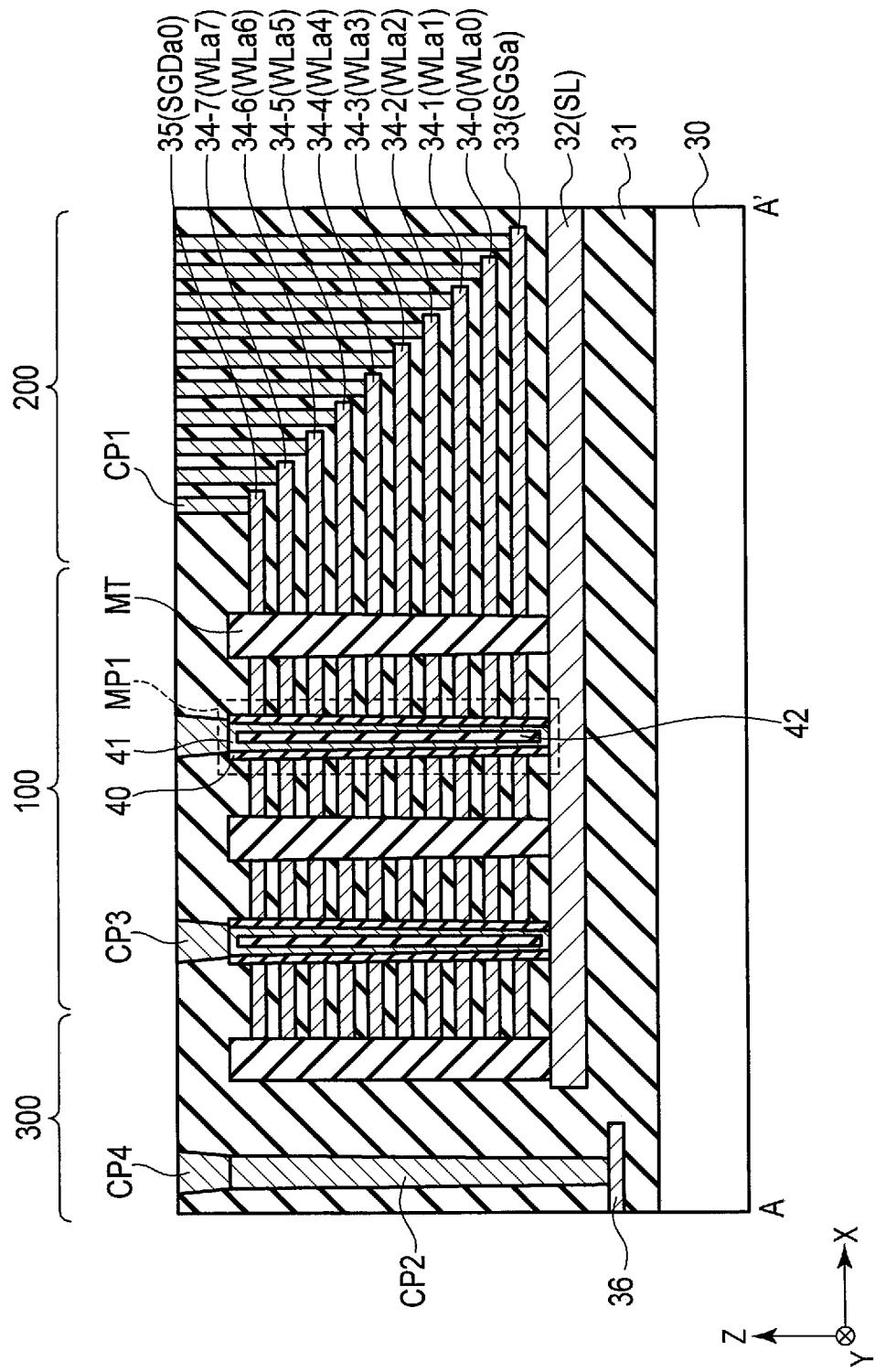
FIG. 4 is a cross-sectional view taken along line A-A' shown in FIG. 3.
Figure 5:
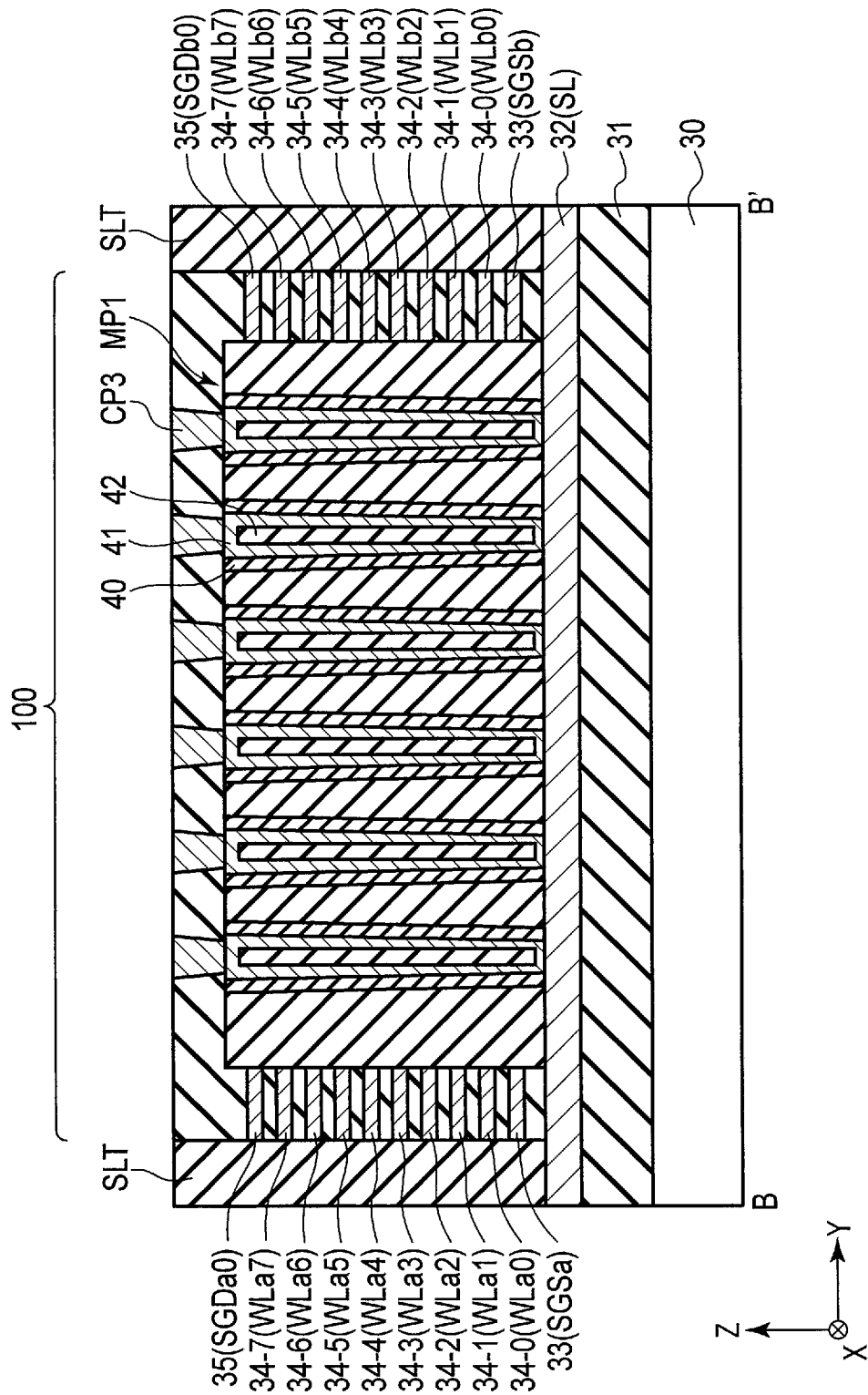
FIG. 5 is a cross-sectional view taken along line B-B' shown in FIG. 3.

Next, a cross-sectional structure of the memory cell array 11 will be described. FIG. 4 is a cross-sectional view taken along line A-A' shown in FIG. 3. FIG. 5 is a cross-sectional view taken along line B-B' shown in FIG. 3. To simplify the description, the bit lines BL are omitted in FIGS. 4 and 5.

An insulation layer 31 is provided on a semiconductor substrate 30, as shown in FIG. 4. The semiconductor substrate 30 includes, for example, a silicon semiconductor substrate. The insulation layer 31 includes, for example, a silicon oxide layer.

The memory cell array is provided on the insulation layer 31. Specifically, a conductive layer 32 is provided on the insulation layer 31 in the cell region 100 and the hookup region 200. The conductive layer 32 functions as the source line SL. The conductive layer 32 includes, for example, a metallic material such as tungsten (W) or titanium nitride (TiN), or a semiconductor such as polycrystalline silicon or monocrystalline silicon.

The insulation layer 31 and each of the conductive layer 33 (SGS), the conductive layers 34-0 to 34-7 (WL0 to WL7), and the conductive layer 35 (SGD) are alternately stacked on the conductive layer 32 to form a stack. Namely, the conductive layers 33, 34-0 to 34-7, and 35 are arranged in direction Z with the insulation layer 31 interposed between the respective layers. The conductive layers 33, 34-0 to 34-7, and 35 include, for example, a metallic material such as W or TiN, or a semiconductor such as polycrystalline silicon or monocrystalline silicon. TiN functions as a barrier layer or an adhesion layer when W is formed. In the embodiment, an example in which W is used for the conductive layers 33, 34-0 to 34-7, and 35, will be described below.

In the cross section shown in FIG. 4, the memory pillars MP1 and the memory trench MT are alternately provided in direction X in the cell region 100. Each the memory pillar MP1 passes through the conductive layers 33, 34-0 to 34-7, and 35 to extend, so that the bottom surface of the memory pillar MP1 contacts the conductive layer 32. Each memory pillar MP1 includes a cell insulation film 40, a semiconductor layer 41, and a core insulation film 42. In this embodiment, the core insulation film 42 is provided in the semiconductor layer 41; however, there is a case where the core insulation film 42 is not provided in the semiconductor layer 41.

A contact plug CP3 electrically coupled to the semiconductor layer 41 is provided on each memory pillar MP1. Also, a bit line BL (not shown) extending in direction Y is provided on the contact plug CP3. Namely, each memory pillar MP1 is electrically coupled to the bit line BL via the contact plug CP3. The contact plug CP3 includes a conductive material such as W or titanium (Ti). For example, titanium is used to form a silicide layer in the interface with the semiconductor layer 41 and to reduce a resistance value in the interface with the semiconductor layer 41.

In the contact region 300, the contact plug CP2 is provided in the insulation layer 31. The bottom surface of the contact plug CP2 is in contact with a conductive layer 36 arranged below the conductive layer 32, and the side surface of the contact plug CP2 is in contact with the insulation layer 31. The conductive layer 36 is coupled to a circuit (peripheral circuit, etc.) such as the row decoder 12 or the sense amplifier 13 (not shown). The position of the bottom surface of the contact plug CP2 is lower than that of the bottom surface of the conductive layer 32, and the position of the upper surface of the contact plug CP2 is higher than that of the upper surface of the conductive layer 35. The contact plug CP2 includes a metallic material such as W, Ti, or TiN. A contact plug CP4 to be coupled to an upper interconnect (not shown) is provided on the contact plug CP2. The contact plug CP4 includes a metallic material such as W, Ti, or TiN. The memory trench MT is provided between the contact region 300 and the cell region 100.

The hookup region 200 includes the areas where the conductive layers 33, 34-0 to 34-7, and 35 are drawn out in a stepwise manner in direction X. The contact plug CP1 is provided on each hookup area. For example, the upper end of the contact plug CP1 is coupled to the row decoder 12, which is provided below the memory cell array 11, via a contact plug (CP2, etc.) and an upper interconnect provided above the memory cell array 11. The contact plug CP1 includes a metallic material such as W, Ti, or TiN.

A cross-sectional structure of the memory cell array will be described with reference to FIG. 5. In the cell region 100, a plurality of memory pillars MP1 are provided along the memory trench MT extending in direction Y. In the example shown in FIG. 5, the conductive layers 33, 34-0 to 34-7, and 35 arranged on side B of the cross section with respect to the memory trench MT (hereinafter, the conductive layers will be referred to as "a-side conductive layers 34a") function as the select gate line SGSa, the word lines WLa0 to WLa7, and the select gate line SGDa0, respectively. On the other hand, the conductive layers 33, 34-0 to 34-7, and 35, arranged on side B' of the cross section with respect to the memory trench MT (hereinafter, the conductive layers will be referred to as "b-side conductive layers 34b"), function as the select gate line SGSb, the word lines WLb0 to WLb7, and the select gate line SGDb0, respectively.

Slits SLT extending in direction X are provided on both sides of the string unit SU as viewed in direction Y. The bottom surface of the slit SLT reaches the upper surface of the conductive layer 32. The side surface of the slit SLT is in contact with the side surfaces of the conductive layers 33, 34-0 to 34-7, and 35. The slit SLT includes an insulation layer in which an insulation material such as silicon oxide is embedded.

1.1.5. Configuration of Memory Pillar MP1

Next, a configuration of the memory pillar MP1 of the semiconductor memory device according to the first embodiment will be described. A general cross-sectional configuration of the memory pillar MP1 will be described first, and a detailed cross-sectional configuration of the memory pillar MP1 will be described afterwards.

FIG. 6 is a cross-sectional view of the memory pillar MP1 taken along plane XZ. The insulation layer 31 is omitted in this figure.

As shown in FIG. 6, the conductive layer 33 (select gate lines SGSa and SGSb), the conductive layers 34-0 to 34-7 (word lines WLa0 to WLa7, and WLb0 to WLb7), and the conductive layer 35 (select gate lines SGDa0 and SGDb0), which are stacked with a space therebetween, are provided on the conductive layer 32. The memory pillar MP1 passing through the conductive layers 33, 34-0 to 34-7, and 35 is provided in these conductive layers. The conductive layer 33, as the select gate line SGSa, and the conductive layer 33, as the select gate line SGSb, are separated from each other by the memory pillar MP1 and the memory trench MT. Likewise, the conductive layers 34-0 to 34-7, as the word lines WLa0 to WLa7, and the conductive layers 34-0 to 34-7, as the word lines WLb0 to WLb7, are separated from each other by the memory pillar MP1 and the memory trench MT. The conductive layer 35, as the select gate line SGDa0, and the conductive layer 35, as the select gate line SGDb0, are separated from each other by the memory pillar MP1 and the memory trench MT.

The memory string MSa is formed in a portion where the conductive layer 33 (select gate line SGSa), the conductive layers 34-0 to 34-7 (word lines WLa0 to WLa7), and the conductive layer 35 (select gate line SGDa0) intersect with the memory pillar MP1. The memory string MSb is formed in a portion where the conductive layer 33 (select gate line SGSb), the conductive layers 34-0 to 34-7 (word lines WLb0 to WLb7), and the conductive layer 35 (select gate line SGDb0) intersect with the memory pillar MP1.

The memory pillar MP1 includes, for example, the cell insulation film 40, the semiconductor layer 41, and the core insulation film 42, as described above. The cell insulation film 40 includes a block insulation film 40A, a charge storage film 40B, and a tunnel insulation film (or tunnel oxide film) 40C. The block insulation film 40A includes, for example, an aluminum oxide film 40Aa and a silicon oxide film 40Ab. Specifically, the aluminum oxide film 40Aa and the silicon oxide film 40Ab as the block insulation film 40A are provided on the inner wall of the a-side conductive layers 34a and the b-side conductive layers 34b in the order mentioned. The charge storage film 40B is provided on the inner wall of the silicon oxide film 40Ab. The tunnel insulation film 40C is provided on the inner wall of the charge storage film 40B. The semiconductor layer 41 is provided on the inner wall of the tunnel insulation film 40C. The core insulation film 42 is provided inside the semiconductor layer 41.

A portion in which the memory pillar MP1 intersects with the conductive layer 33, as the select gate line SGSa, functions as the select transistor STa2. Portions in which the memory pillar MP1 intersects with the conductive layers 34-0 to 34-7, as the word lines WLa0 to WLa7, function as the memory cell transistors MCa0 to MCa7, respectively. A portion in which the memory pillar MP1 intersects with the conductive layer 35, as the select gate line SGDa0, functions as the select transistor STa1.

Likewise, a portion in which the memory pillar MP1 intersects with the conductive layer 33, as the select gate line SGSb, functions as the select transistor STb2. Portions in which the memory pillar MP1 intersects with the conductive layers 34-0 to 34-7, as the word lines WLb0 to WLb7, function as the memory cell transistors MCb0 to MCb7, respectively. A portion in which the memory pillar MP1 intersects with the conductive layer 35, as the select gate line SGDb0, functions as the select transistor STb1.

The semiconductor layer 41 functions as a channel layer of the memory cell transistors MCa and MCb and select transistors STa1, STa2, STb1, and STb2. The semiconductor layer 41 includes, for example, a polycrystalline silicon layer.

In the memory cell transistors MCa and MCb, the charge storage film 40B functions as a charge storage film that stores an electric charge injected from the semiconductor layer 41. The charge storage film 40B includes, for example, a silicon nitride film.

The tunnel insulation film 40C functions as a potential barrier when an electric charge is injected from the semiconductor layer 41 to the charge storage film 40B, or when the electric charge stored in the charge storage film 40B is discharged to the semiconductor layer 41. The tunnel insulation film 40C includes, for example, a silicon oxide film.

The block insulation film 40A prevents the electric charge stored in the charge storage film 40B from being diffused to the conductive layers 34-0 to 34-7 (word lines WL). The block insulation film 40A includes, for example, the aluminum oxide film 40Aa and the silicon oxide film 40Ab, as described above.

1.1.5.1. Detailed Cross-Sectional Configuration of Memory Pillar MP1

Figure 7:
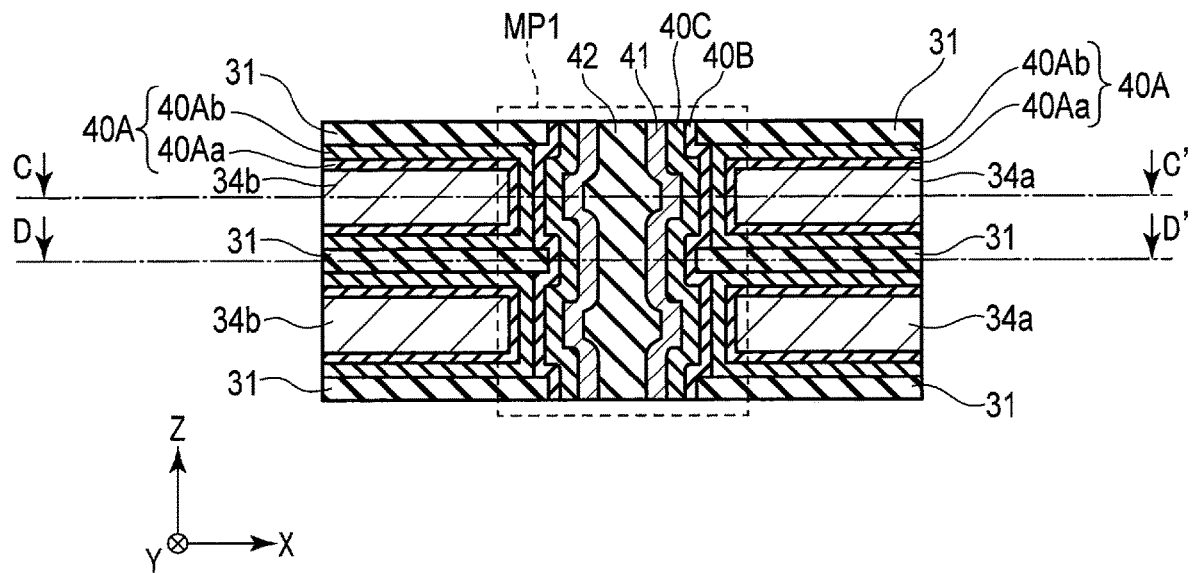
FIG. 7 is a detailed cross-sectional view of the memory pillar, taken along plane XZ.
Figure 8:
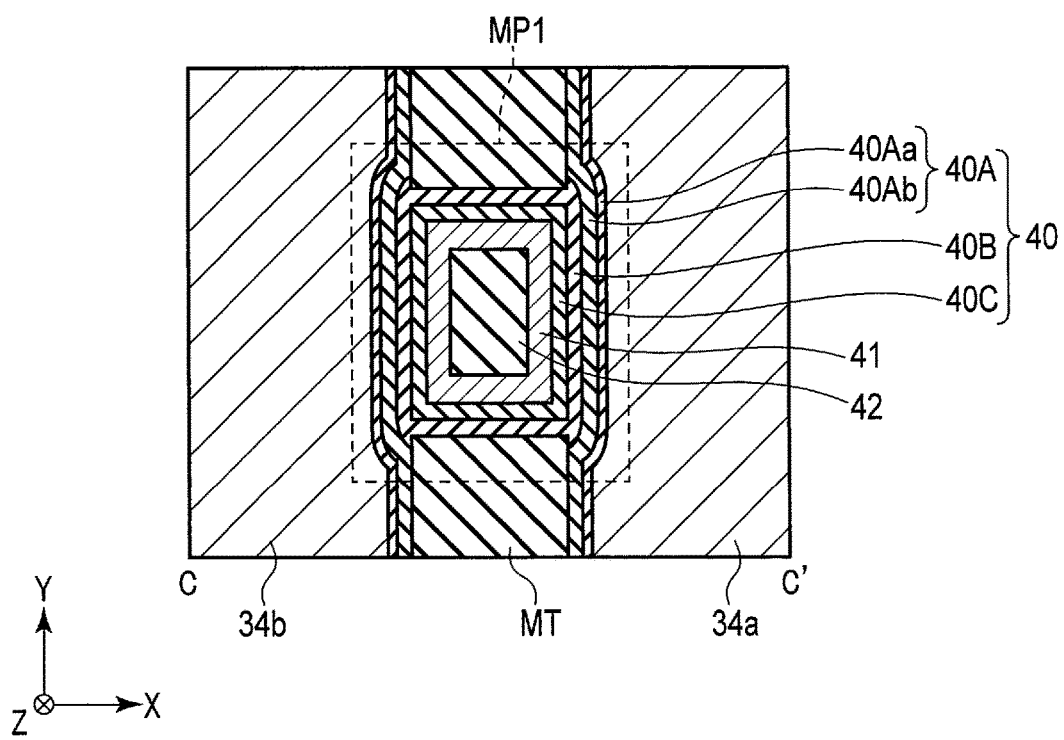
FIG. 8 is a cross-sectional view taken along line C-C' shown in FIG. 7.

Next, a detailed cross-sectional configuration of the memory pillar MP1 will be described. FIGS. 7 to 9 are cross-sectional diagrams showing the detailed configuration of the memory pillar MP1. FIG. 7 shows a cross section of the memory pillar MP1 taken along plane XZ. FIG. 8 shows cross sections of the memory pillar MP1, the a-side conductive layers 34a, and the b-side conductive layers 34b, taken along line C-C' (plane XY) in FIG. 7. FIG. 9 shows cross sections of the memory pillar MP1 and the insulation layers 31, taken along line D-D' (plane XY) in FIG. G.

A plurality of insulation layers 31 and a plurality of a-side conductive layers 34a are alternately stacked in direction Z, as shown in FIGS. 6 and 7. Likewise, a plurality of insulation layers 31 and a plurality of b-side conductive layers 34b are alternately stacked in direction Z. The aluminum oxide film 40Aa and the silicon oxide film 40Ab are arranged to cover the a-side conductive layers 34a and the b-side conductive layers 34b, that is, the aluminum oxide film 40Aa and the silicon oxide film 40Ab are arranged on the side surfaces, upper surfaces, and lower surfaces of the a-side conductive layers 34a and the b-side conductive layers 34b.

One end of the stack of the insulation layers 31 and the a-side conductive layers 34a has a linear portion as viewed in direction Y. Likewise, one end of the stack of the insulation layers 31 and the b-side conductive layers 34b has a linear portion as viewed in direction Y. The linear portion of the a-side conductive layers 34a and the linear portion of the b-side conductive layers 34b are arranged to face each other, and the memory trench MT is arranged between the linear portion of the a-side conductive layers 34a and the linear portion of the b-side conductive layers 34b. The memory pillar MP1 is arranged between the linear portion of the a-side conductive layers 34a and the linear portion of the b-side conductive layers 34b, and between areas of the memory trench MT.

The a-side conductive layers 34a and the block insulation film 40A (aluminum oxide film 40Aa and silicon oxide film 40Ab) on the side surface of the a-side conductive layers 34a are arranged to be positioned away from the memory pillar (or b-side conductive layers) in direction X. Likewise, the b-side conductive layers 34b and the block insulation film 40A on the side surface of the b-side conductive layers 34b are arranged to be positioned away from the memory pillar (or a-side conductive layers) in direction X. In other words, the a-side conductive layers 34a and the block insulation film 40A on the side surface of the a-side conductive layers 34a are recessed to be farther from the center of the memory pillar than the side surface of the insulation layers 31. Likewise, the b-side conductive layers 34b and the block insulation film 40A on the side surface of the b-side conductive layers 34b are recessed to be farther from the center of the memory pillar than the side surface of the insulation layers 31.

The charge storage film 40B is fitted in the recessed portion provided by the insulation layers 31, as well as the a-side conductive layers 34a and the block insulation film 40A on the side surface of the a-side conductive layers 34a. Also, the tunnel insulation film 40C and the semiconductor layer 41 are arranged, in the order mentioned, on the side surface of the charge storage film 40B provided on the a-side conductive layers 34a. Likewise, the charge storage film 40B is fitted in the recessed portion provided by the insulation layers 31 as well as the b-side conductive layers 34b and the block insulation film 40A on the side surface of the b-side conductive layers 34b. Also, the tunnel insulation film 40C and the semiconductor layer 41 are arranged, in the order mentioned, on the side surface of the charge storage film 40B provided on the b-side conductive layers 34b. The core insulation film 42 is arranged on the side surface of the semiconductor layer 41.

As shown in FIGS. 8 and 9, the memory cell transistors MCa and MCb provided in the memory pillar MP1 have a rectangular shape as viewed in the cross section along plane XY.

In the cross sections of the memory pillar MP1, the a-side conductive layers 34a, and the b-side conductive layers 34b shown in FIG. 8, the charge storage film 40B, the tunnel insulation film 40C, the semiconductor layer 41, and the core insulation film 42 are provided in the order mentioned from the side surface of the memory trench MT. Namely, the charge storage film 40B and the tunnel insulation film 40C are arranged between the memory trench MT and the semiconductor layer 41 in the order mentioned from the side surface of the memory trench MT.

In the cross sections of the memory pillar MP1 and the insulation layers 31 shown in FIG. 9, the charge storage film 40B, the tunnel insulation film 40C, the semiconductor layer 41, and the core insulation film 42 are provided in the order mentioned from the side surface of the memory trench MT. Namely, the charge storage film 40B and the tunnel insulation film 40C are arranged between the memory trench MT and the semiconductor layer 41 in the order mentioned from the side surface of the memory trench MT.

At one end of a portion where the a-side conductive layers 34a and the memory pillar MP1 face each other (or a boundary portion where the a-side conductive layers 34a and the memory pillar MP1 come into contact with each other), a part of the charge storage film 40B is arranged between the memory trench MT and the a-side conductive layers 34a. In other words, a part of the charge storage film 40B is fitted into the recessed portion provided between the memory trench MT and the a-side conductive layers 34a. Likewise, at one end of a portion where the b-side conductive layers 34b and the memory pillar MP1 face each other (or a boundary portion where the b-side conductive layers 34b and the memory pillar MP1 come into contact with each other), a part of the charge storage film 40B is arranged between the memory trench MT and the b-side conductive layers 34b. Namely, a part of the charge storage film 40B is fitted into the recessed portion provided between the memory trench MT and the b-side conductive layers 34b.

In the cross section along plane XY, the length along direction X, of the cross section of the part of the charge storage film 40B arranged between the memory trench MT and the a-side conductive layers 34a, and between the memory trench MT and the b-side conductive layers 34b, is no greater than the length along direction X, of the cross section of the charge storage film 40B between the tunnel insulation film 40C of the memory pillar MP and the a-side conductive layers 34a (or the b-side conductive layers 34b). Without being limited to the above, the length along direction X, of the cross section of the part of the charge storage film 40B arranged between the memory trench MT and the a-side conductive layers 34a (or the b-side conductive layers 34b), may be equal to or less than twice the length along direction X, of the cross section of the charge storage film 40B between the tunnel insulation film 40C of the memory pillar MP and the a-side conductive layers 34a (or the b-side conductive layers 34b). On the other hand, in the cross section of the insulation layers 31 shown in FIG. 9, a recessed portion is not provided between the memory trench MT and the insulation layers 31 at an end of a portion where the insulation layers 31 and the memory pillar MP1 face each other (or a boundary portion where the insulation layers 31 and the memory pillar MP1 come into contact with each other). Therefore, a part of the charge storage film 40B is not arranged between the memory trench MT and the insulation layers 31.

1.1.6. Configuration of Modification of Memory Pillar MP1

Next, a configuration of a modification of the memory pillar MP1 will be described. Hereinafter, a modification of the memory pillar MP1 will be referred to as a "memory pillar MP1a." A general cross-sectional configuration of the memory pillar MP1a is the same as that shown in FIG. 6.

1.1.6.1. Detailed Cross-Sectional Configuration of Modification of Memory Pillar MP1

Figure 11:
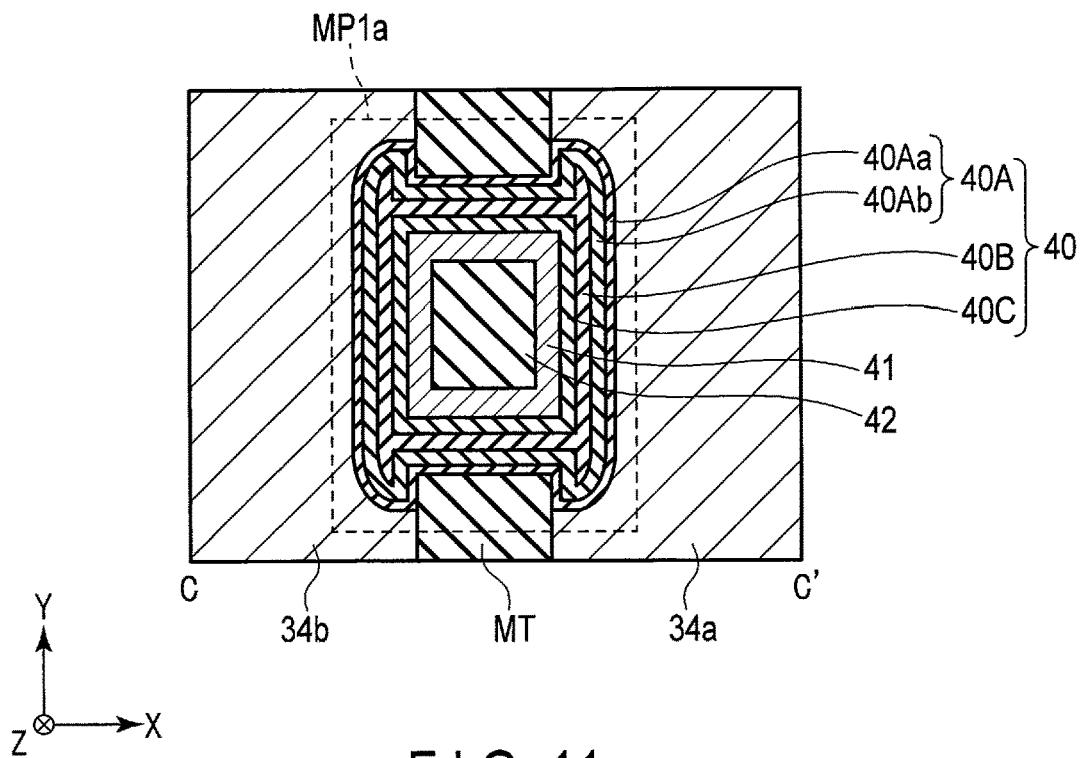
FIG. 11 is a cross-sectional view taken along line C-C' shown in FIG. 10.
Figure 12:
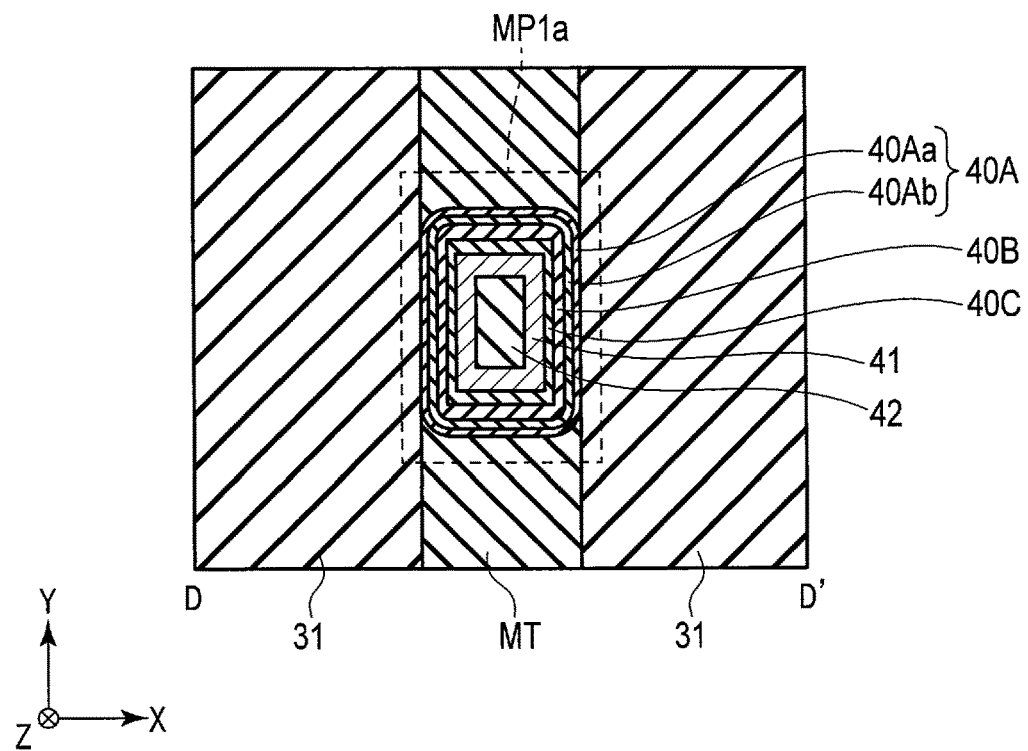
FIG. 12 is a cross-sectional view taken along line D-D' shown in FIG. 10.

Next, a detailed cross-sectional configuration of the memory pillar MP1a will be described. FIGS. 10 to 12 are cross-sectional diagrams showing the detailed configuration of the memory pillar MP1a. FIG. 10 shows a cross section of the memory pillar MP1a taken along plane XZ. FIG. 11 shows cross sections of the memory pillar MP1a, the a-side conductive layers 34a, and the b-side conductive layers 34b, taken along line C-C' (plane XY) in FIG. 10. FIG. 12 shows cross sections of the memory pillar MP1a and the insulation layers 31, taken along line D-D' (plane XY) in FIG. 10.

As shown in FIGS. 10 and 11, one end of the stack of the insulation layers 31 and the a-side conductive layers 34a has a linear portion as viewed in direction Y. Likewise, an end of the stack of the insulation layers 31 and the b-side conductive layers 34b has a linear portion as viewed in direction Y. The linear portion of the a-side conductive layers 34a and the linear portion of the b-side conductive layers 34b are arranged to face each other, and the memory trench MT is arranged between the linear portion of the a-side conductive layers 34a and the linear portion of the b-side conductive layers 34b. The memory pillar MP1a is arranged between the linear portion of the a-side conductive layers 34a and the linear portion of the b-side conductive layers 34b, and between areas of the memory trench MT.

The a-side conductive layers 34a are arranged to be positioned away from the memory pillar (or b-side conductive layers) in direction X. Likewise, the b-side conductive layers 34b are arranged to be away from the memory pillar (or a-side conductive layers) in direction X. In other words, the a-side conductive layers 34a are recessed to be farther from the center of the memory pillar than the side surface of the insulation layers 31. Likewise, the b-side conductive layers 34b are recessed to be farther from the center of the memory pillar than the side surface of the insulation layers 31.

The block insulation film 40A and the charge storage film 40B are fitted into the recessed portion provided by the insulation layers 31 and the a-side conductive layers 34a. Also, the tunnel insulation film 40C and the semiconductor layer 41 are arranged, in the order mentioned, on the side surface of the charge storage film 40B provided on the a-side conductive layers 34a. Likewise, the block insulation film 40A and the charge storage film 40B are fitted into the recessed portion provided by the insulation layers 31 and the b-side conductive layers 34b. Also, the tunnel insulation film 40C and the semiconductor layer 41 are arranged, in the mentioned order, on the side surface of the charge storage film 40B provided on the b-side conductive layers 34b. The core insulation film 42 is arranged on the side surface of the semiconductor layer 41.

As shown in FIGS. 11 and 12, the memory cell transistors MCa and MCb provided in the memory pillar MP1a have a rectangular shape as viewed in the cross section along plane XY.

In the cross sections of the memory pillar MP1a, the a-side conductive layers 34a, and the b-side conductive layers 34b shown in FIG. 11, the block insulation film 40A, the charge storage film 40B, the tunnel insulation film 40C, the semiconductor layer 41, and the core insulation film 42 are provided in the order mentioned from the side surface of the memory trench MT. Namely, the block insulation film 40A, the charge storage film 40B, and the tunnel insulation film 40C are arranged between the memory trench MT and the semiconductor layer 41 in the order mentioned from the side surface of the memory trench MT.

In the cross sections of the memory pillar MP1a and the insulation layers 31 shown in FIG. 12, the block insulation film 40A, the charge storage film 40B, the tunnel insulation film 40C, the semiconductor layer 41, and the core insulation film 42 are provided in the order mentioned from the side surface of the memory trench MT. Namely, the block insulation film 40A, the charge storage film 40B, and the tunnel insulation film 40C are arranged between the memory trench MT and the semiconductor layer 41 in the order mentioned from the side surface of the memory trench MT.

At one end of a portion where the a-side conductive layers 34a and the memory pillar MP1a face each other (or a boundary portion where the a-side conductive layers 34a and the memory pillar MP1a come into contact with each other), a part of the charge storage film 40B is arranged between the memory trench MT and the a-side conductive layers 34a. In other words, a part of the charge storage film 40B is fitted into the recessed portion provided between the memory trench MT and the a-side conductive layers 34a. Likewise, at one end of a portion where the b-side conductive layers 34b and the memory pillar MP1a face each other (or a boundary portion where the b-side conductive layers 34b and the memory pillar MP1a come into contact with each other), a part of the charge storage film 40B is arranged between the memory trench MT and the b-side conductive layers 34b. Namely, a part of the charge storage film 40B is fitted into the recessed portion provided between the memory trench MT and the b-side conductive layers 34b.

In the cross section along plane XY, the length along direction X, of the cross section of the part of the charge storage film 40B arranged between the memory trench MT and the a-side conductive layers 34a, and between the memory trench MT and the b-side conductive layers 34b, is not greater than the length along direction X, of the cross section of the charge storage film 40B between the tunnel insulation film 40C of the memory pillar MP and the a-side conductive layers 34a (or the b-side conductive layers 34b). Without being limited to the above, The length along direction X, of the cross section of the part of the charge storage film 40B arranged between the memory trench MT and the a-side conductive layers 34a (or the b-side conductive layers 34b), may be equal to or less than twice the length along direction X, of the cross section of the charge storage film 40B between the tunnel insulation film 40C of the memory pillar MP and the a-side conductive layers 34a (or the b-side conductive layers 34b).

On the other hand, in the cross section of the insulation layers 31 shown in FIG. 12, a recessed portion is not provided between the memory trench MT and the insulation layers 31 at one end of a portion where the insulation layers 31 and the memory pillar MP1a face each other (or a boundary portion where the insulation layers 31 and the memory pillar MP1a come into contact with each other). Therefore, a part of the charge storage film 40B is not arranged between the memory trench MT and the insulation layers 31.

1.2. Method of Manufacturing Semiconductor Memory Device

Next, a method of manufacturing the semiconductor memory device of the first embodiment will be described. FIG. 13 to 39 respectively show the structure of the semiconductor memory device in each manufacturing step according to the first embodiment. FIGS. 13, 16, 19, 22, 25, 28, 31, 34, and 37 are plan views of the structure of the semiconductor memory device in each manufacturing step. FIGS. 14, 17, 20, 23, 26, 29, 32, 35, and 38 are cross-sectional views of the structure of the semiconductor memory device in each manufacturing step, taken along line A-A'. FIGS. 15, 18, 21, 24, 27, 30, 33, 36, and 39 are cross-sectional views of the structure of the semiconductor memory device in each manufacturing step, taken along line B-B'.

Figure 13:
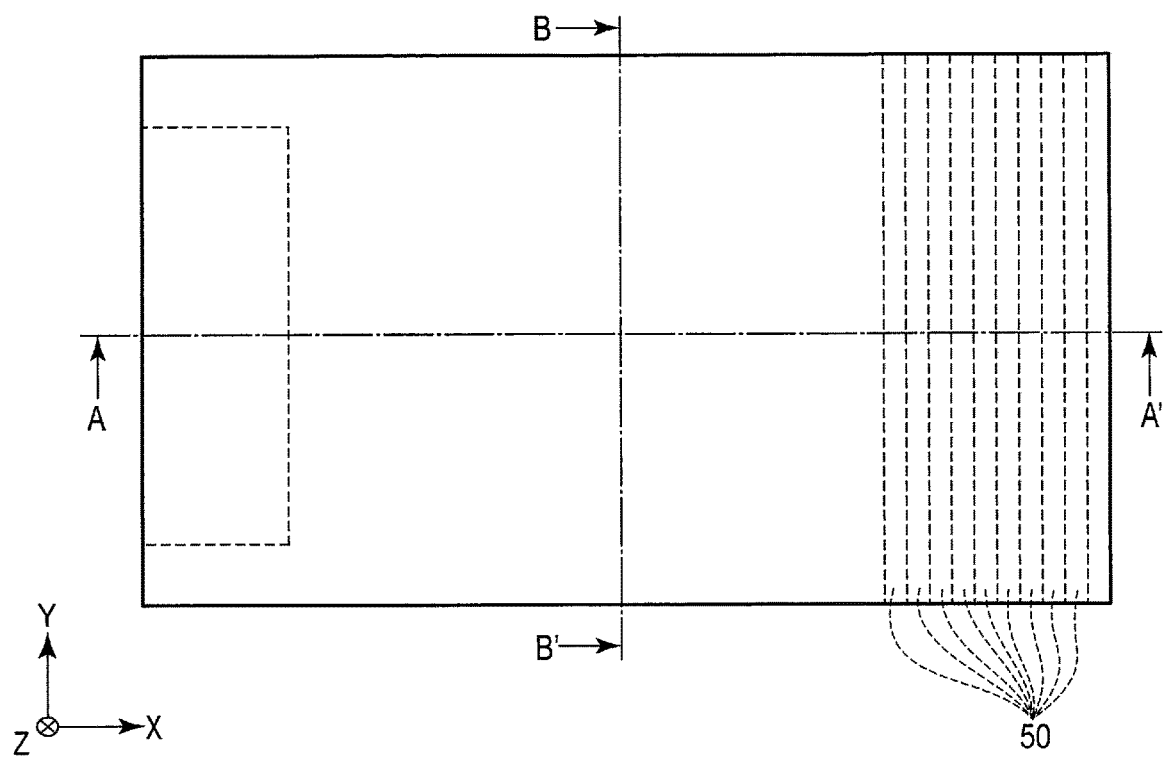
FIG. 13 is a plan view of a structure of the semiconductor memory device in a manufacturing step in the first embodiment.
Figure 14:
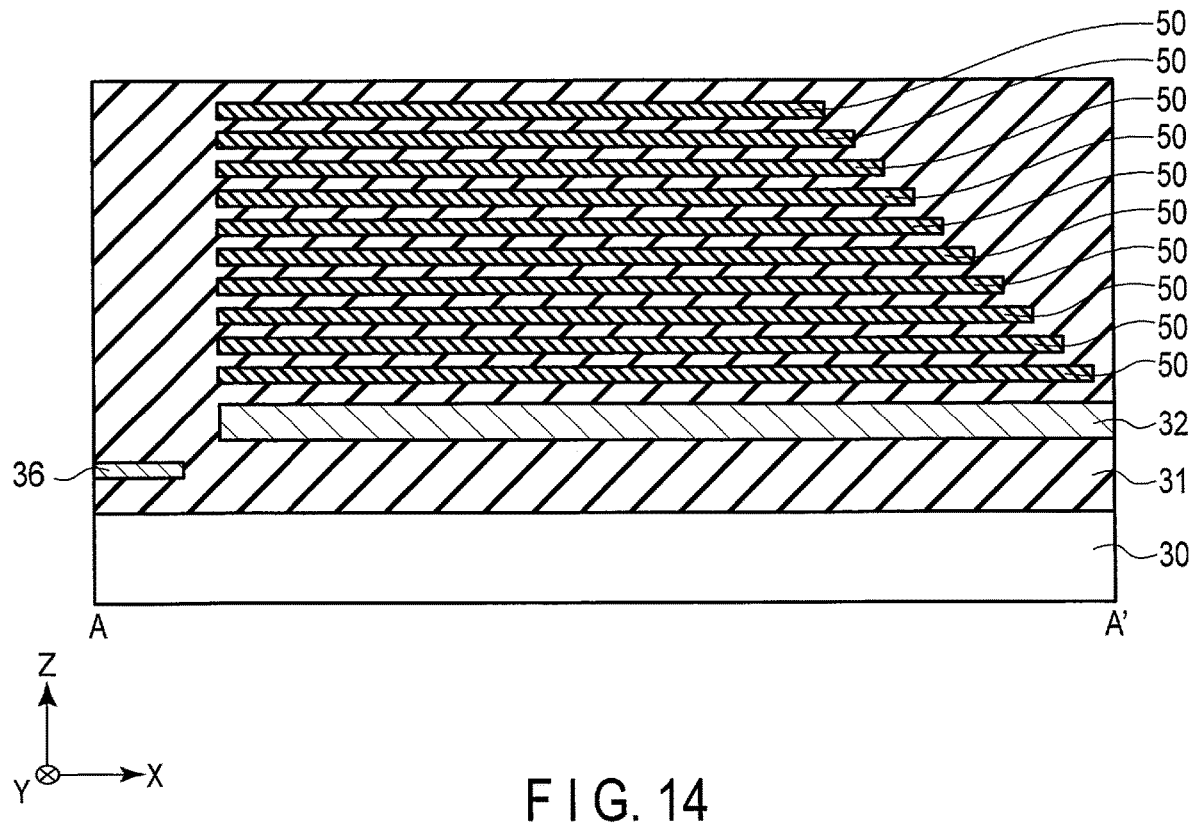
FIG. 14 is a cross-sectional view of the structure of the semiconductor memory device in the manufacturing step, taken along line A-A'.
Figure 15:
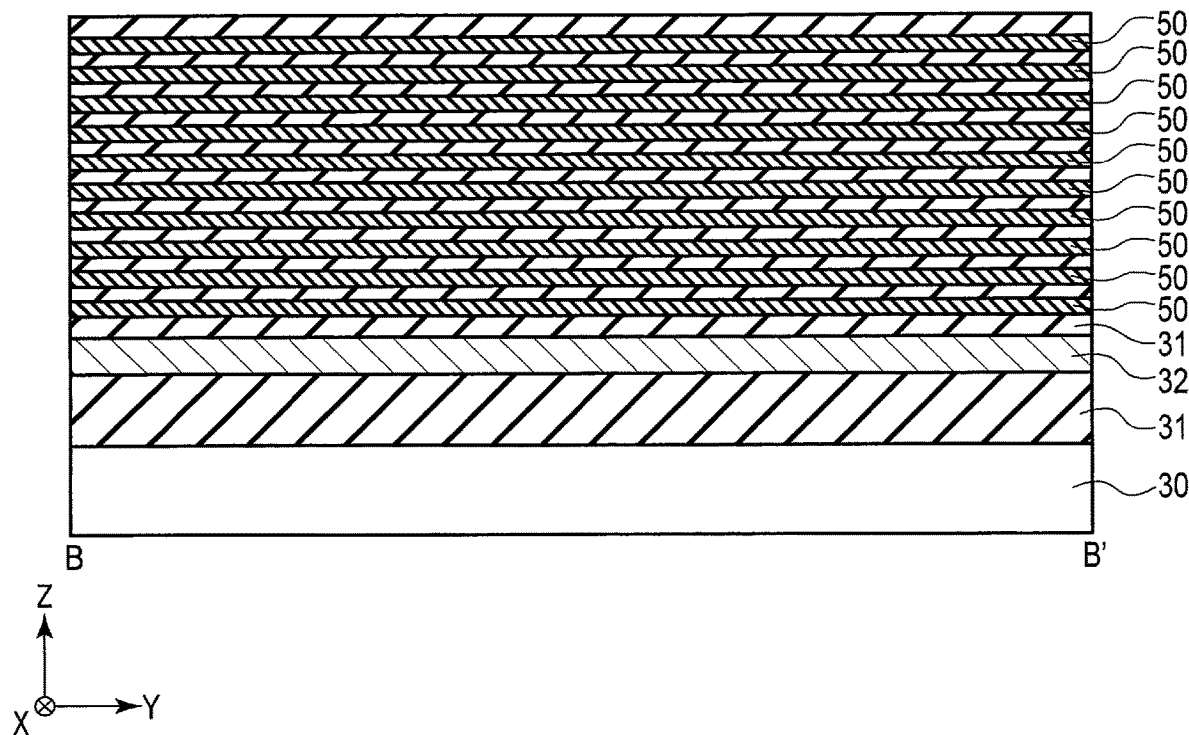
FIG. 15 is a cross-sectional view of the structure of the semiconductor memory device in the manufacturing step, taken along line B-B'.

First, the insulation layer 31, the conductive layer 32, and a stack of the insulation layers 31 and insulation layers 50 are formed above the semiconductor substrate 30, and an area in which the insulation layers 50 are drawn out in a stepwise manner is further formed, as shown in FIGS. 13 to 15. Specifically, the insulation layer 31 is formed on the semiconductor substrate 30 by, for example, the CVD (chemical vapor deposition) method (or ALD (atomic layer deposition) method), as shown in FIGS. 14 and 15. The conductive layer 36 is formed in the insulation layer 31. The conductive layer 32 is formed on the insulation layer 31. Then, a stack in which the insulation layers 31 and the insulation layers 50 are alternately stacked is formed on the conductive layer 32 by, for example, the CVD (or ALD) method. Next, an area (hookup area) in which the insulation layers 50 are sequentially drawn out in direction X in a stepwise manner is formed by the photolithography method. The insulation layer 50 includes, for example, a silicon nitride layer. A stack formed in the contact region 300 on the conductive layer 36 may be removed, so that an insulation layer such as a silicon oxide layer is formed in the part deprived of the stack.

Figure 16:
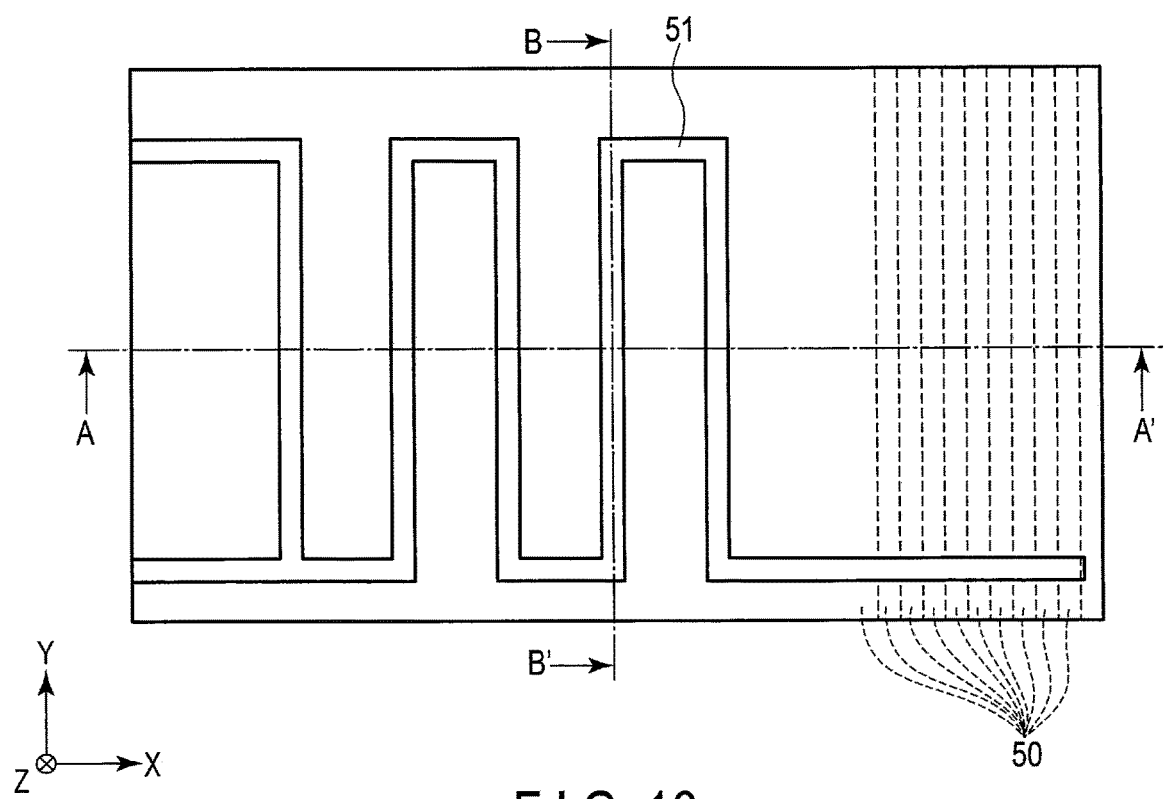
FIG. 16 is a plan view of a structure of the semiconductor memory device in a manufacturing step.
Figure 17:
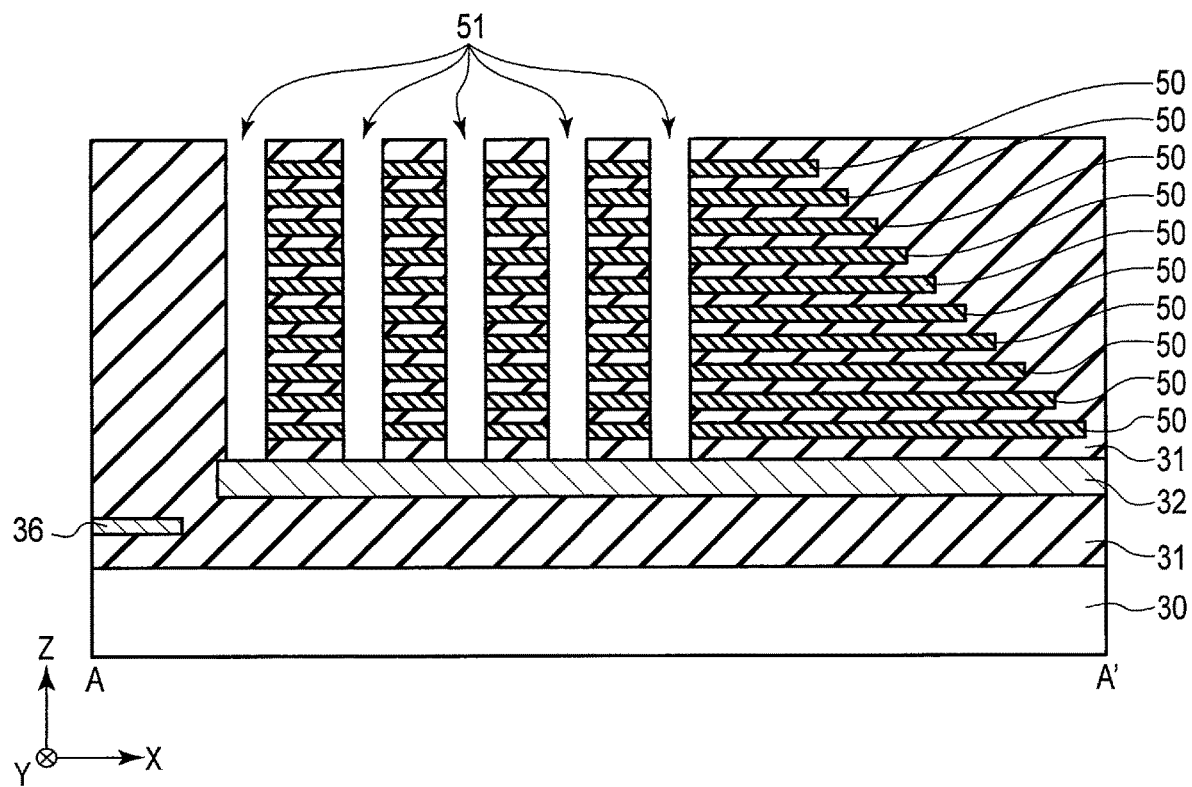
FIG. 17 is a cross-sectional view of the structure of the semiconductor memory device in the manufacturing step, taken along line A-A'.
Figure 18:
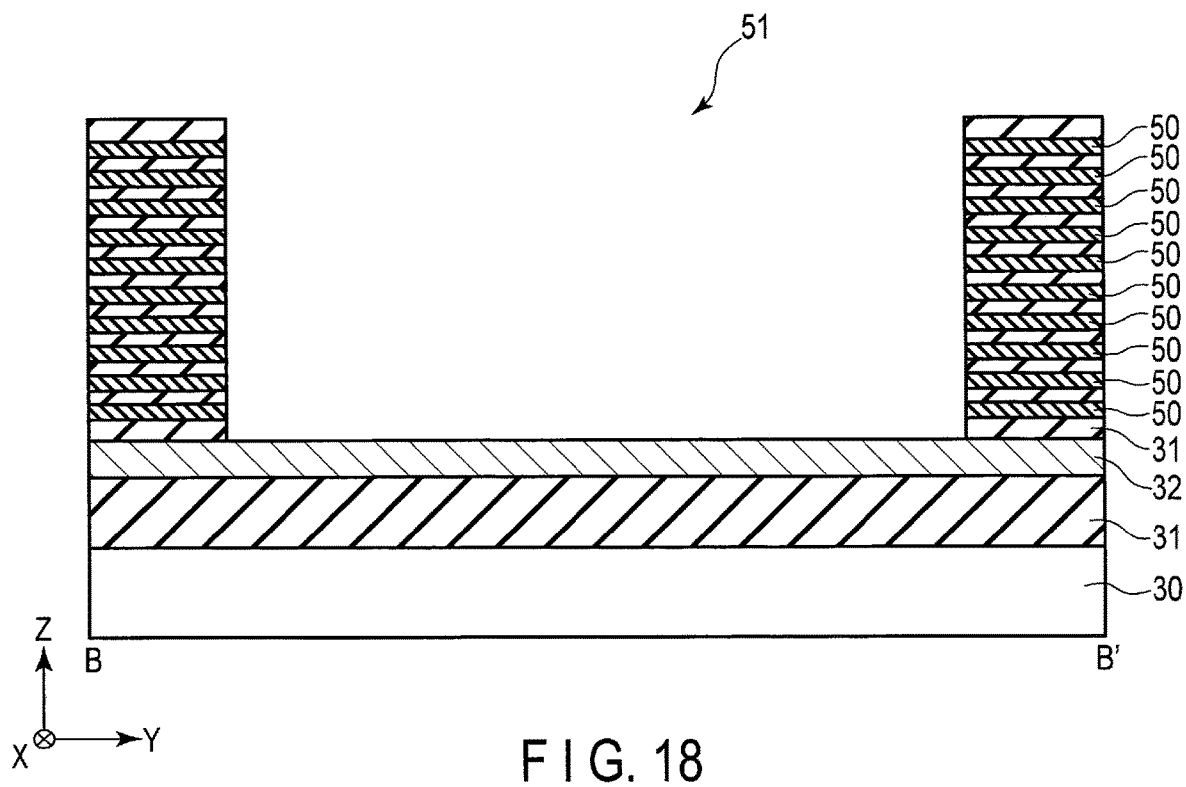
FIG. 18 is a cross-sectional view of the structure of the semiconductor memory device in the manufacturing step, taken along line B-B'.

Next, a trench 51 for dividing the insulation layers 50 of the stack is formed, as shown in FIGS. 16 to 18. Specifically, the trench 51 for dividing the insulation layers 50 of the stack is formed by, for example, the RIE (reactive ion etching) method, as shown in FIGS. 16 to 18.

Figure 19:
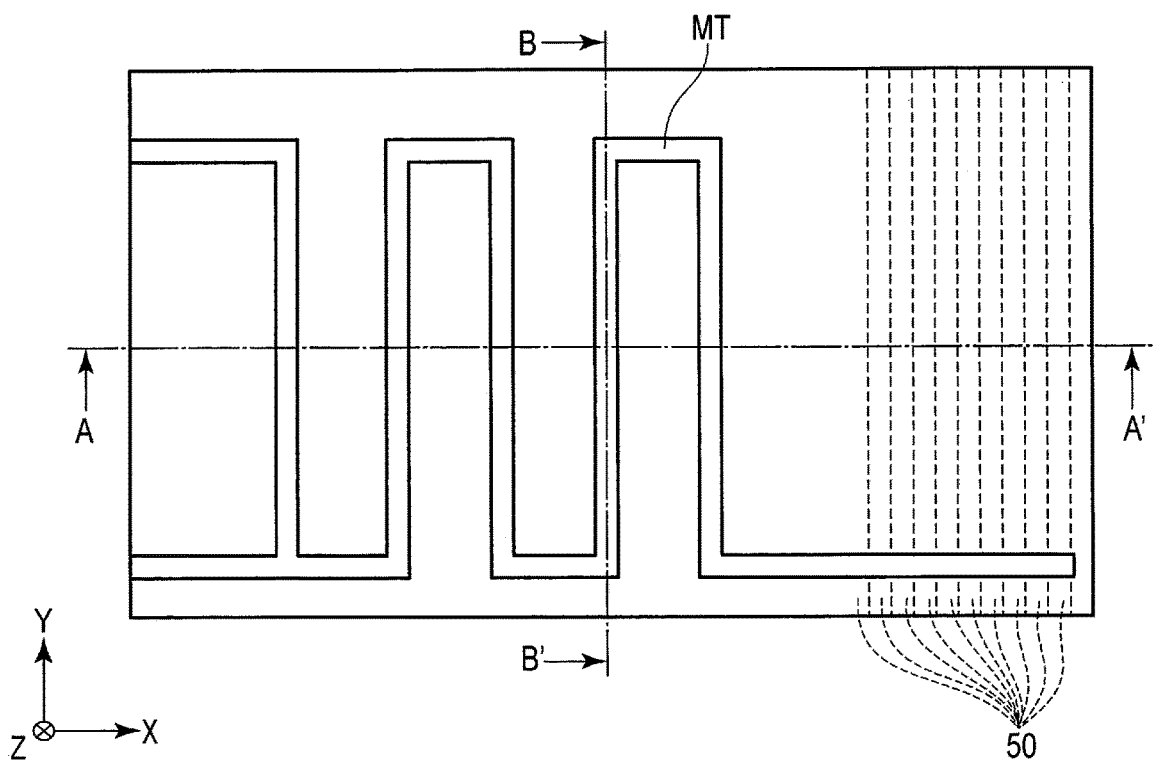
FIG. 19 is a plan view of a structure of the semiconductor memory device in a manufacturing step.
Figure 20:
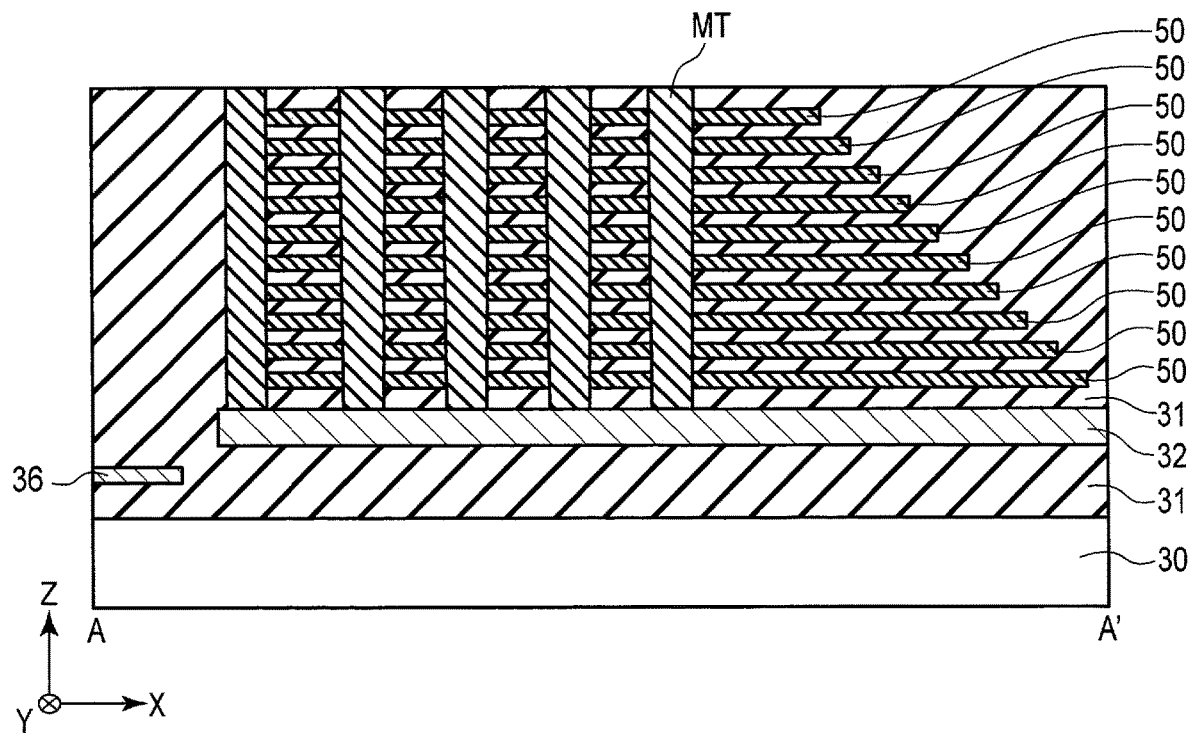
FIG. 20 is a cross-sectional view of the structure of the semiconductor memory device in the manufacturing step, taken along line A-A'.
Figure 21:
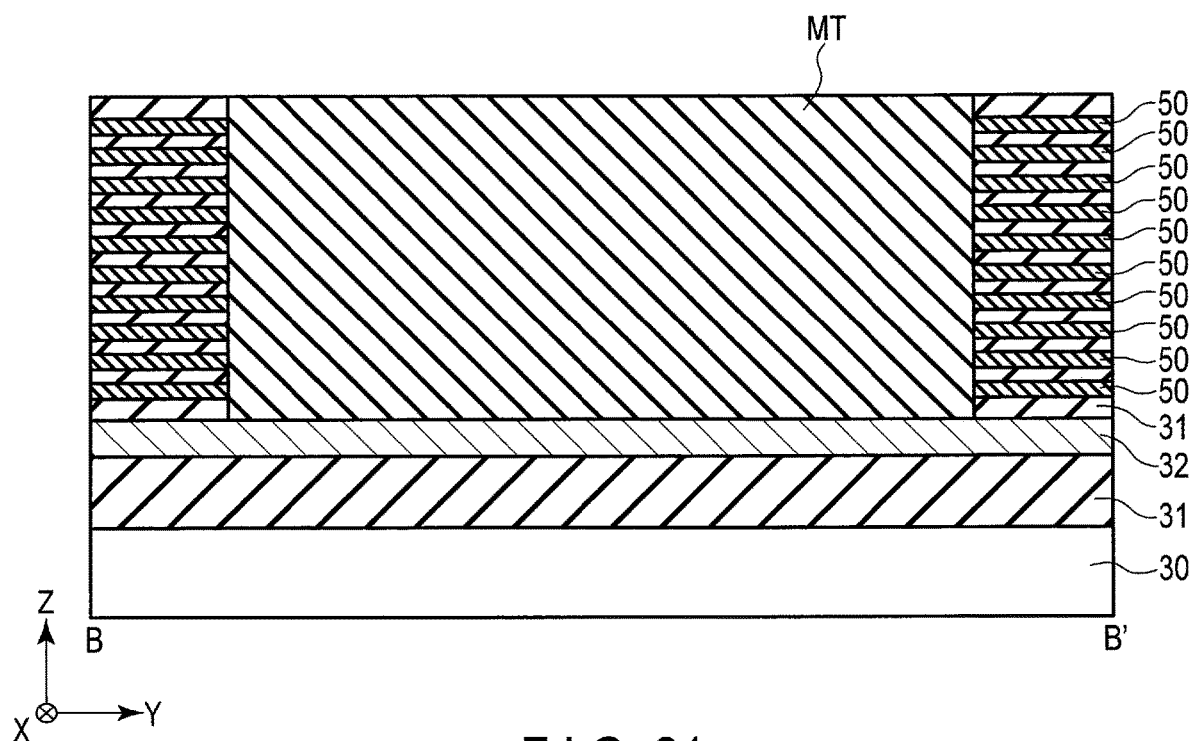
FIG. 21 is a cross-sectional view of the structure of the semiconductor memory device in the manufacturing step, taken along line B-B'.

Next, an insulation material is embedded in the trench 51 to form a memory trench MT, as shown in FIGS. 19 to 21. Specifically, an insulation material such as silicon oxide is embedded in the trench 51 by, for example, the CVD (or ALD) method, to form a memory trench MT including a silicon oxide layer.

Figure 22:
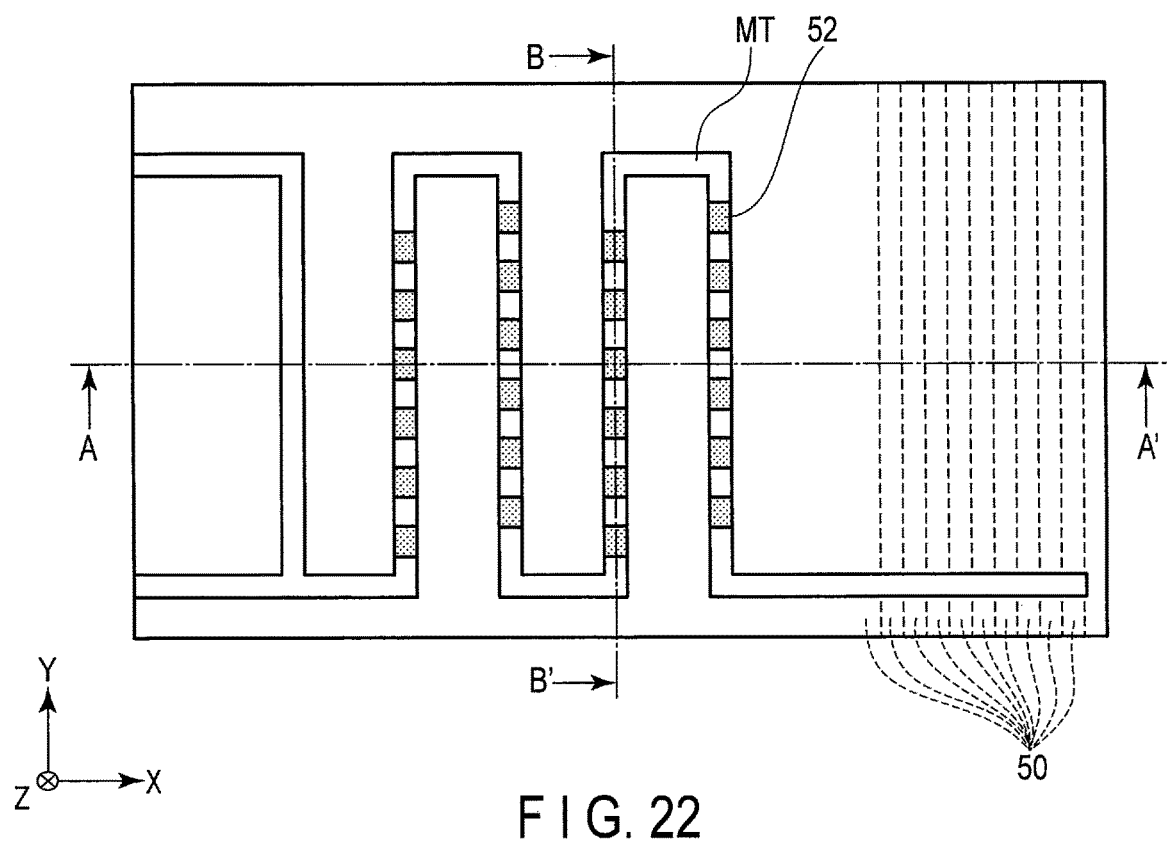
FIG. 22 is a plan view of a structure of the semiconductor memory device in a manufacturing step.
Figure 23:
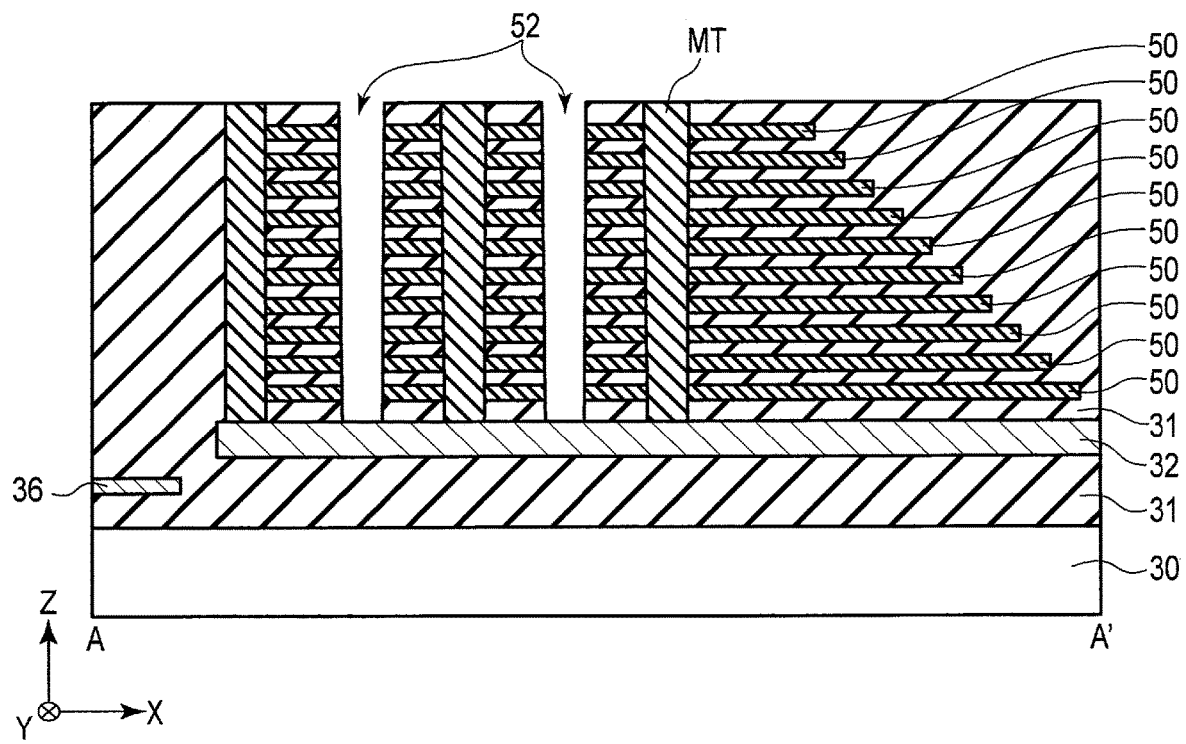
FIG. 23 is a cross-sectional view of the structure of the semiconductor memory device in the manufacturing step, taken along line A-A'.
Figure 24:
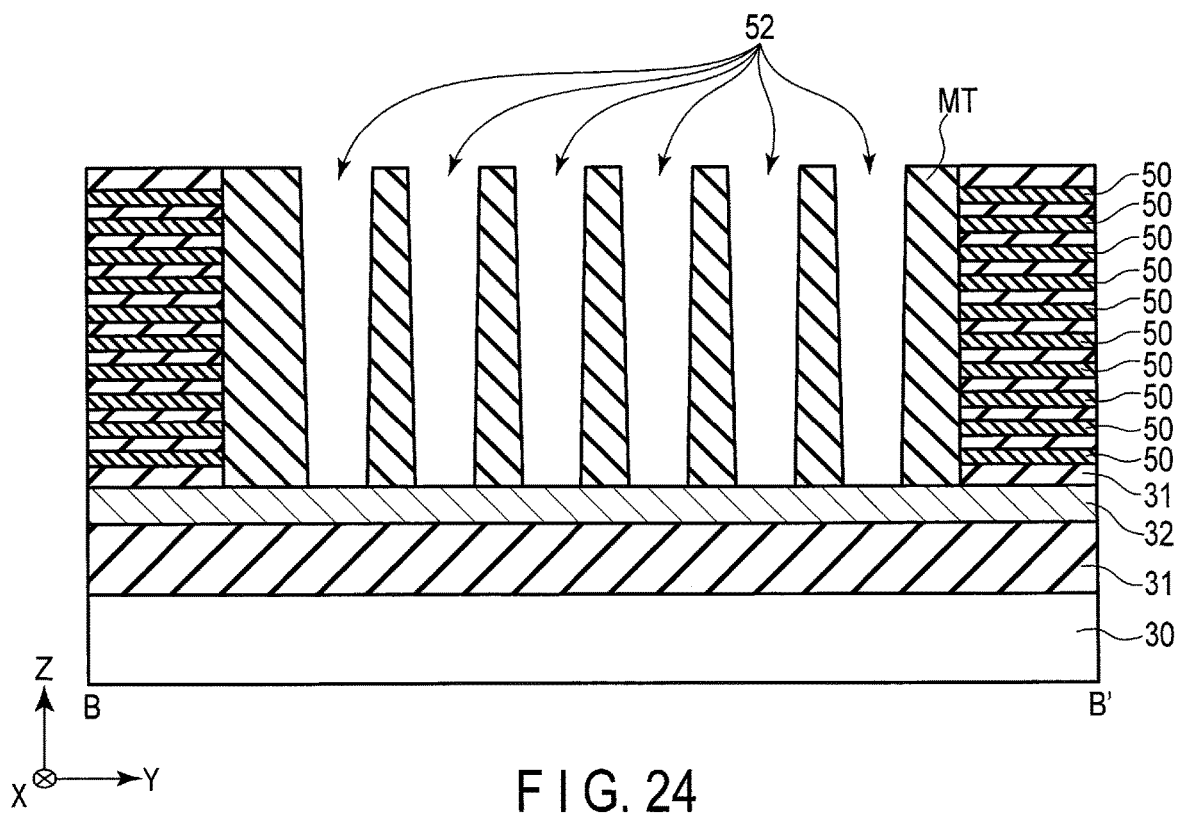
FIG. 24 is a cross-sectional view of the structure of the semiconductor memory device in the manufacturing step, taken along line B-B'.

Next, holes 52 for forming the memory pillars MP1 are formed along the memory trench MT, as shown in FIGS. 22 to 24. Specifically, the holes 52 for the memory pillars MP1 are formed along the memory trench MT with a predetermined space therebetween by, for example, the RIE method, as shown in FIGS. 22 to 24. The shape of the holes 52 is, for example, rectangular.

Figure 25:
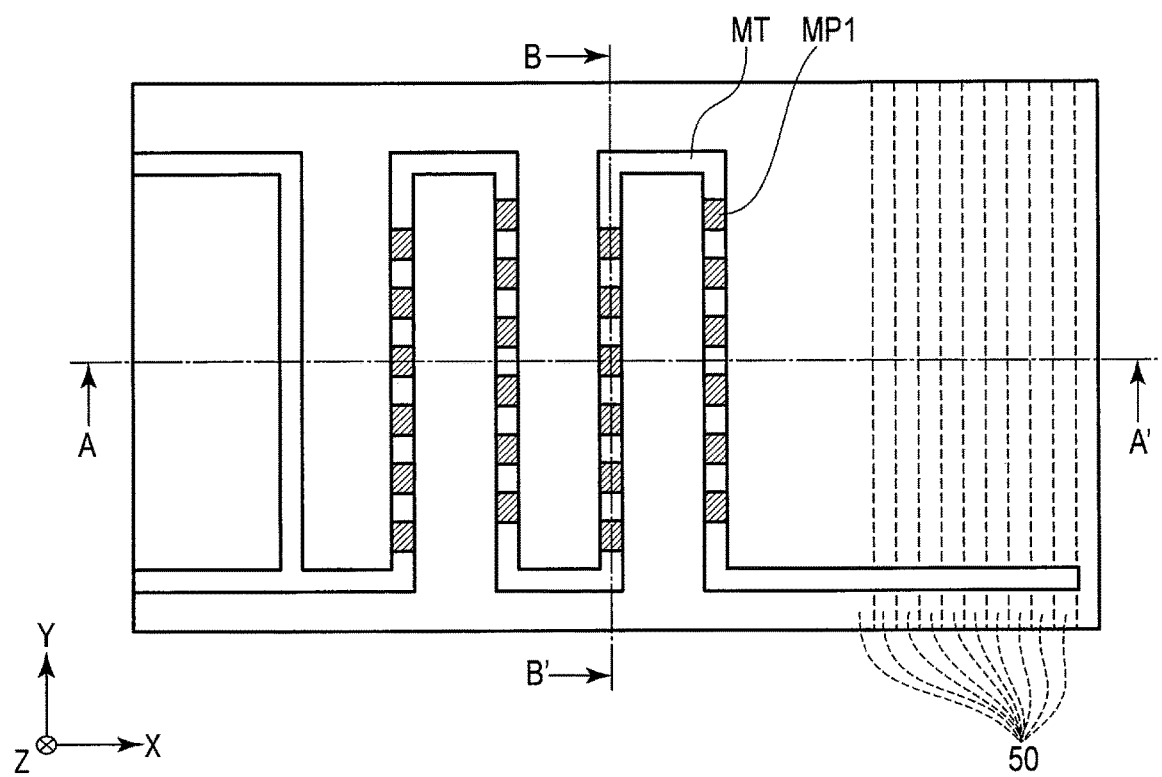
FIG. 25 is a plan view of the structure of a semiconductor memory device in a manufacturing step.
Figure 26:
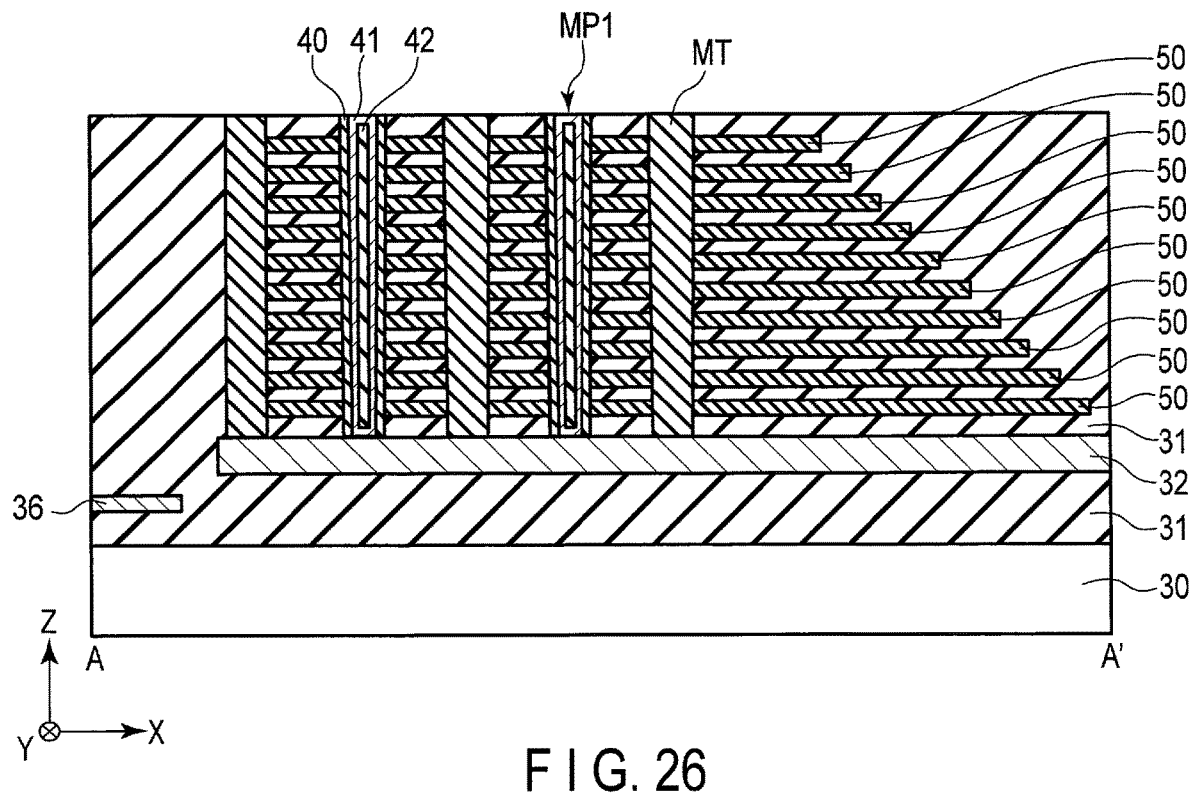
FIG. 26 is a cross-sectional view of the structure of the semiconductor memory device in the manufacturing step, taken along line A-A'.
Figure 27:
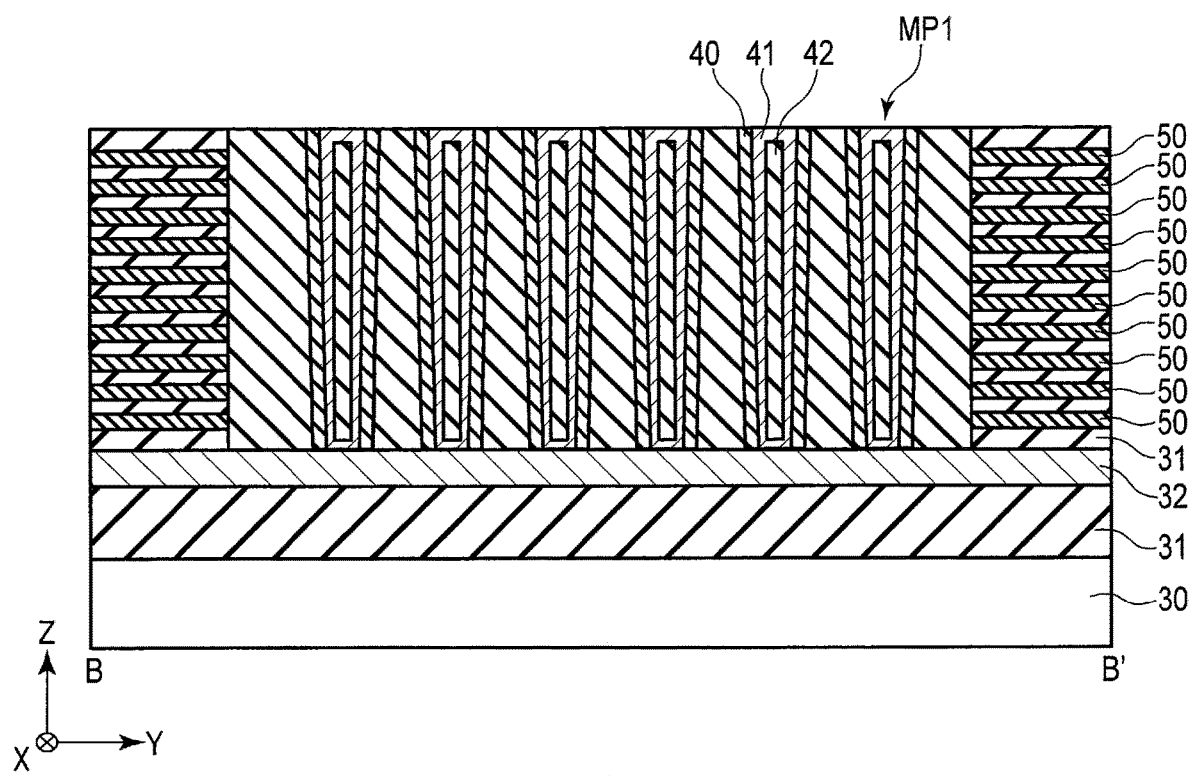
FIG. 27 is a cross-sectional view of the structure of the semiconductor memory device in the manufacturing step, taken along line B-B'.

Next, the memory pillars MP1 are formed in the holes 52, as shown in FIGS. 25 to 27. Specifically, the insulation layers (silicon nitride layers) 50 are removed by, for example, wet etching using a phosphoric acid solution introduced through the holes 52, and then the charge storage film 40B, the tunnel insulation film 40C, the semiconductor layer 41, and the core insulation film 42 are formed, in the order mentioned, on the inner wall of the holes 52 by, for example, the CVD (or ALD) method. The silicon oxide film 40Ab, which is a part of the block insulation film 40A, may also be formed in this step. In this case, the silicon oxide film 40Ab need not be further formed in the subsequent step. Thereafter, the block insulation film 40A is formed on the charge storage film 40B in a replacement step described later.

Alternatively, the insulation layers 50 are removed by wet etching using a phosphoric acid solution introduced through the holes 52, and then the block insulation film 40A, the charge storage film 40B, the tunnel insulation film 40C, the semiconductor layer 41, and the core insulation film 42 are formed, in the order mentioned, on the inner wall of the holes 52 by the CVD (or ALD) method.

Through the above-described steps, the memory pillars MP1 are formed. A detailed method of forming the memory pillars MP1 will be described later.

Figure 28:
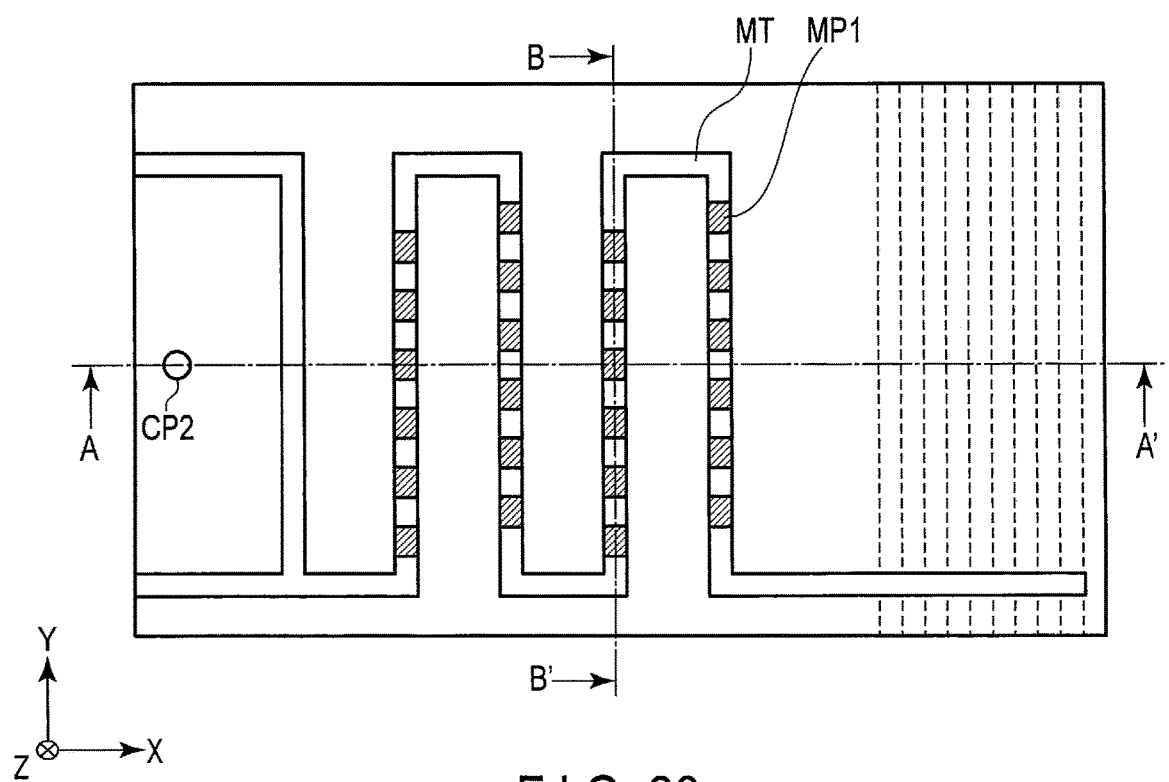
FIG. 28 is a plan view of a structure of the semiconductor memory device in a manufacturing step.
Figure 29:
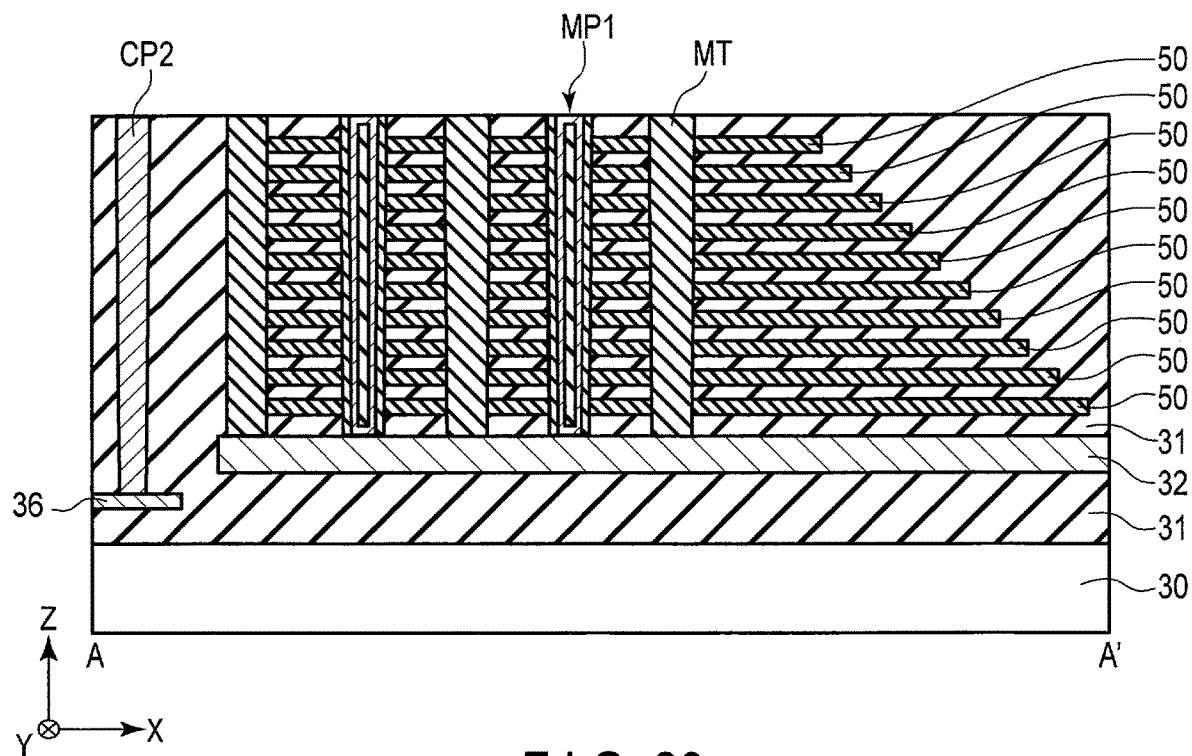
FIG. 29 is a cross-sectional view of the structure of the semiconductor memory device in the manufacturing step, taken along line A-A'.
Figure 30:
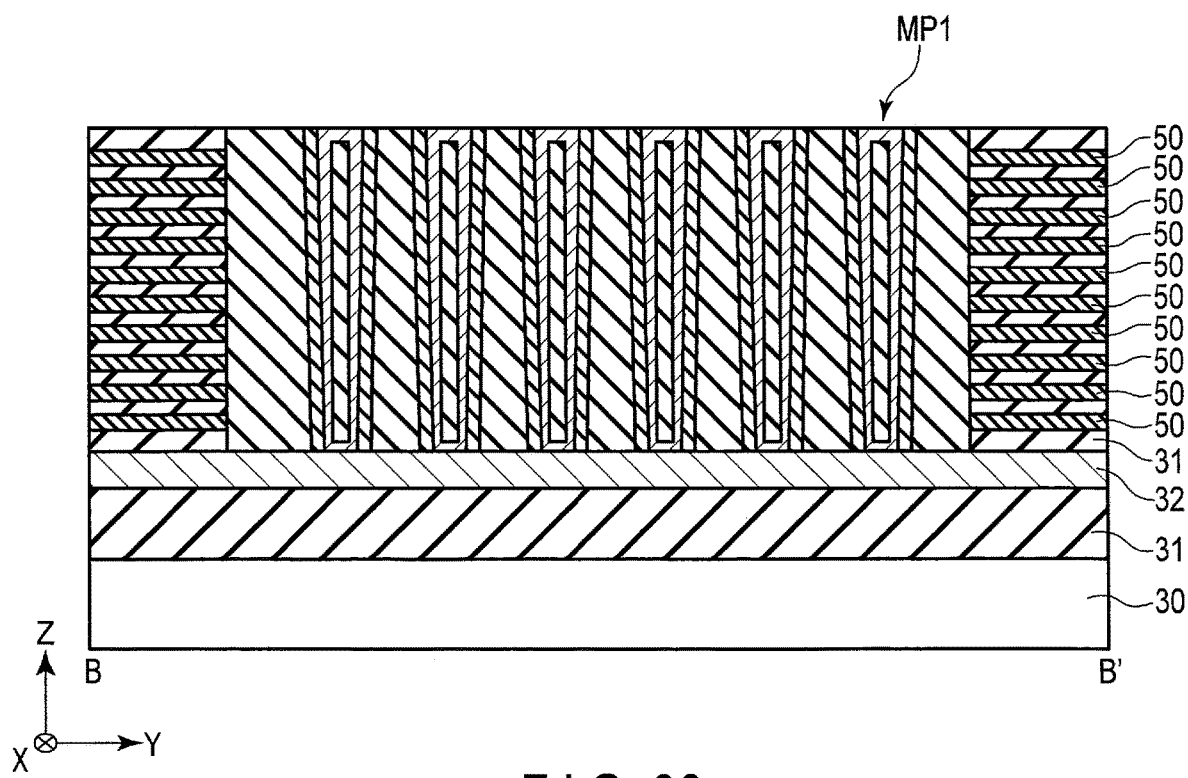
FIG. 30 is a cross-sectional view of the structure of the semiconductor memory device in the manufacturing step, taken along line B-B'.

Next, the contact plug CP2 is formed in the contact region 300, as shown in FIGS. 28 to 30.

Next, the insulation layers (silicon nitride layers) 50 are replaced by the conductive layers 33, 34-0 to 34-7, and 35, and a slit SLT for dividing the conductive layers 33, 34-0 to 34-7, and 35 is formed, as shown in FIGS. 31 to 36. Specifically, after forming the insulation layer 31 on the structure shown in FIGS. 28 to 30, grooves 53 for the slits SLT are formed in this insulation layer 31, and the stack of the insulation layers 31 and the insulation layers 50, by, for example, the RIE method, as shown in FIGS. 31 to 33. Each the groove 53 extends in direction X on both sides of the stack as viewed in direction Y, to reach the conductive layer 32 from the surface of the insulation layer 31. Then, the insulation layers (silicon nitride layers) 50 are removed by, for example, wet etching using a phosphoric acid solution introduced through the grooves 53. The insulation layers (silicon oxide layers) 31 remain without being removed by the wet etching. As a result, gaps are formed between the insulation layers 31.

Figure 34:
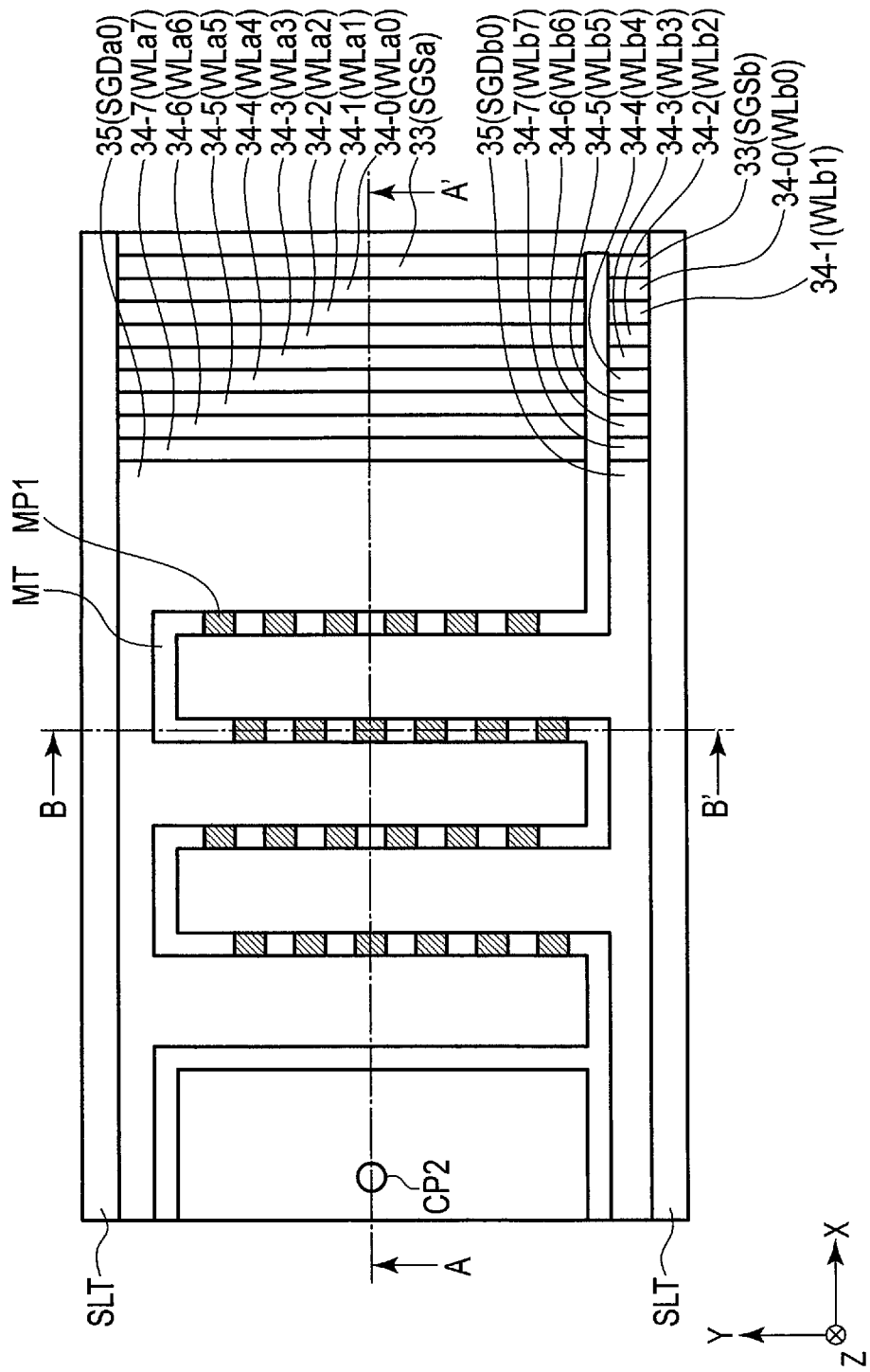
FIG. 34 is a plan view of a structure of the semiconductor memory device in a manufacturing step.
Figure 35:
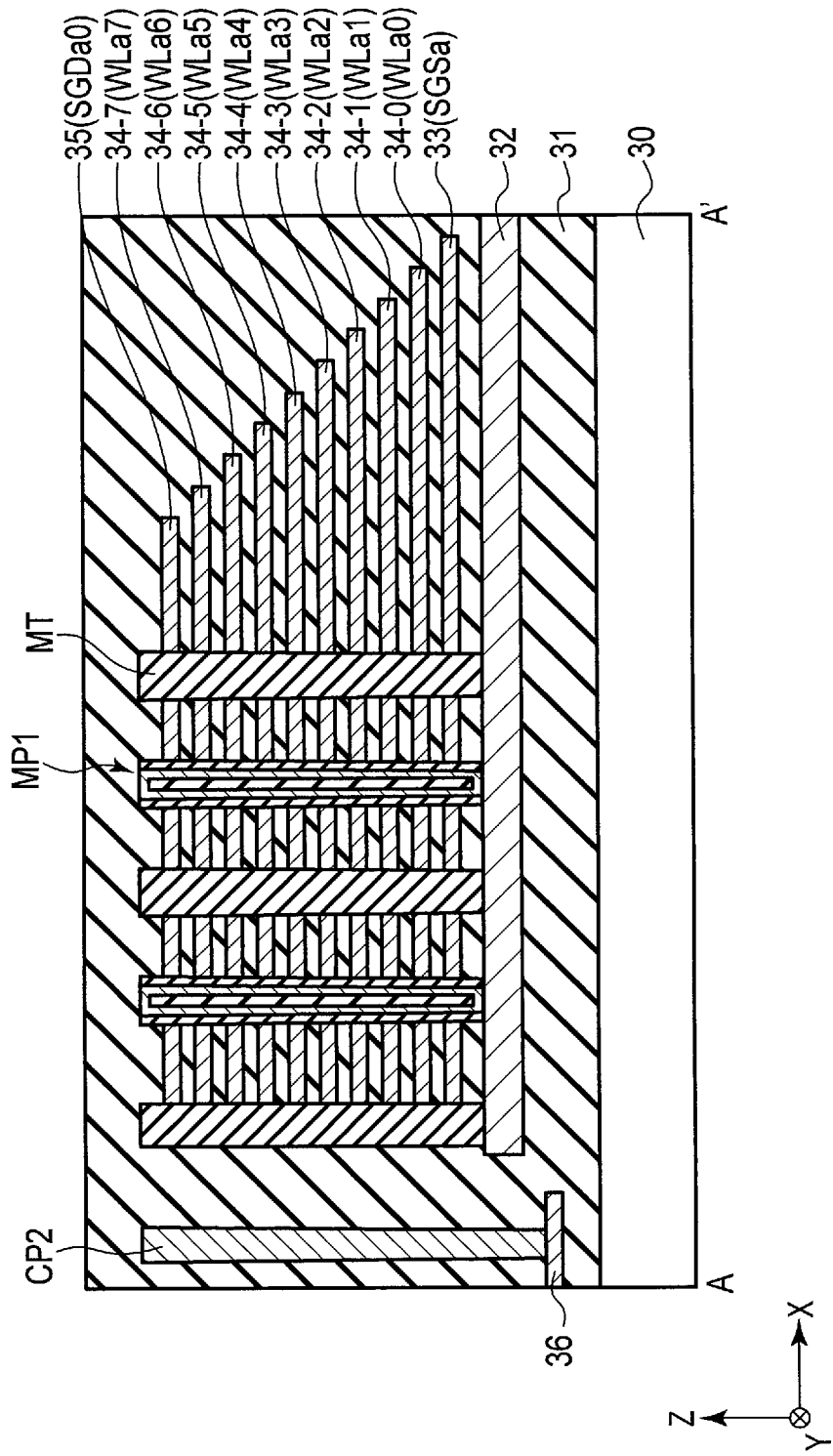
FIG. 35 is a cross-sectional view of the structure of the semiconductor memory device in the manufacturing step, taken along line A-A'.
Figure 36:
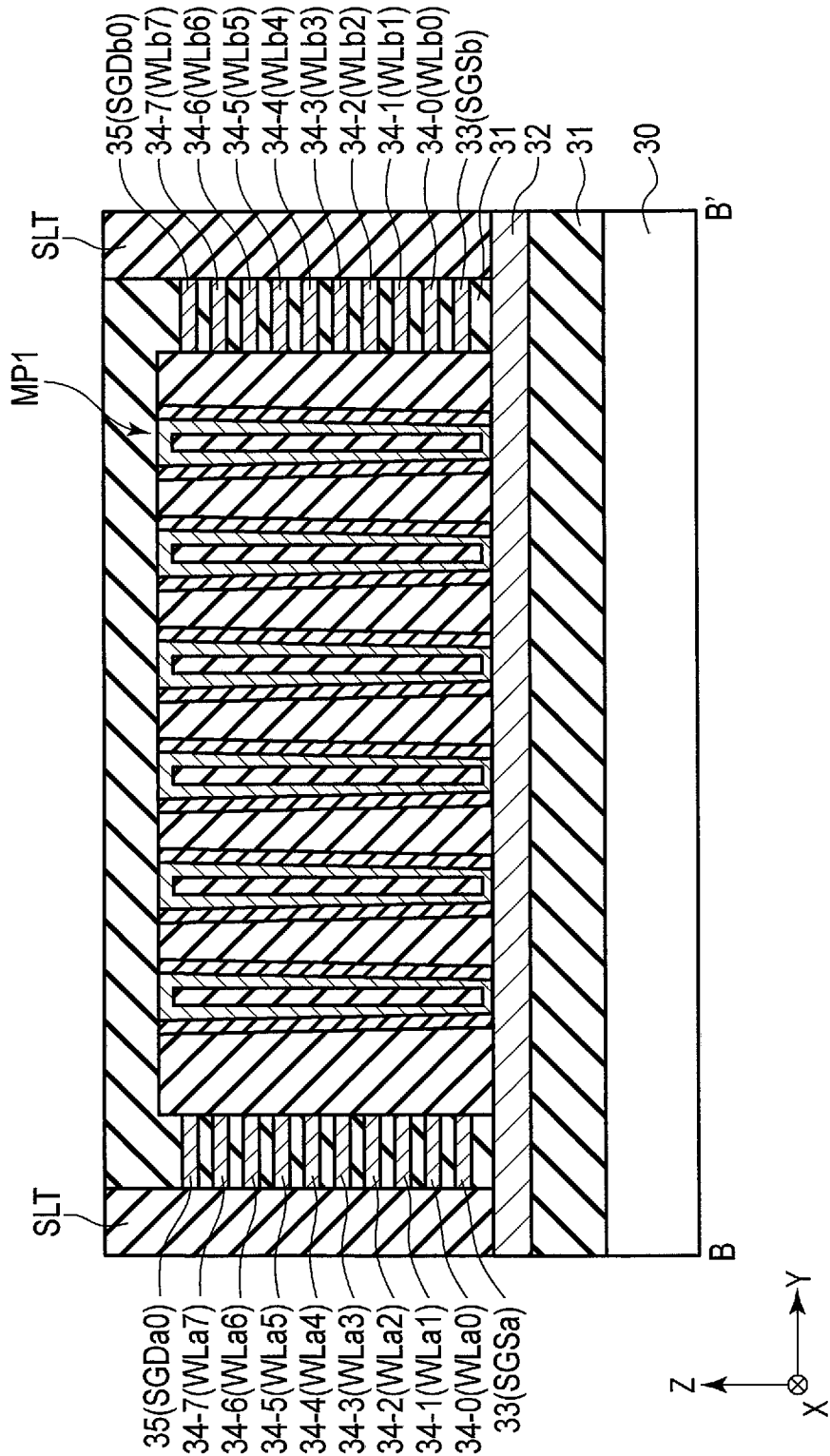
FIG. 36 is a cross-sectional view of the structure of the semiconductor memory device in the manufacturing step, taken along line B-B'.

Then, the block insulation films 40A are formed on the charge storage films 40B through the grooves 53 by, for example, the CVD (or ALD) method. Also, a conductive material, such as tungsten, is embedded in the gaps between the insulation layers 31, to form the conductive layers 33, 34-0 to 34-7, and 35 by the CVD (or ALD) method, as shown in FIGS. 34 to 36.

Alternatively, if the block insulation films 40A are already formed, the block insulation films 40A are not formed. Then, the conductive layers 33, 34-0 to 34-7, and 35 are formed by embedding a conductive material, such as tungsten, in the gaps between the insulation layers 31.

Then, after removing the conductive material remaining on the inner surfaces of the grooves 53, an insulation material, such as silicon oxide, is embedded in the grooves 53 by, for example, the CVD (or ALD) method. As a result, slits SLT including a silicon oxide layer are formed.

Figure 37:
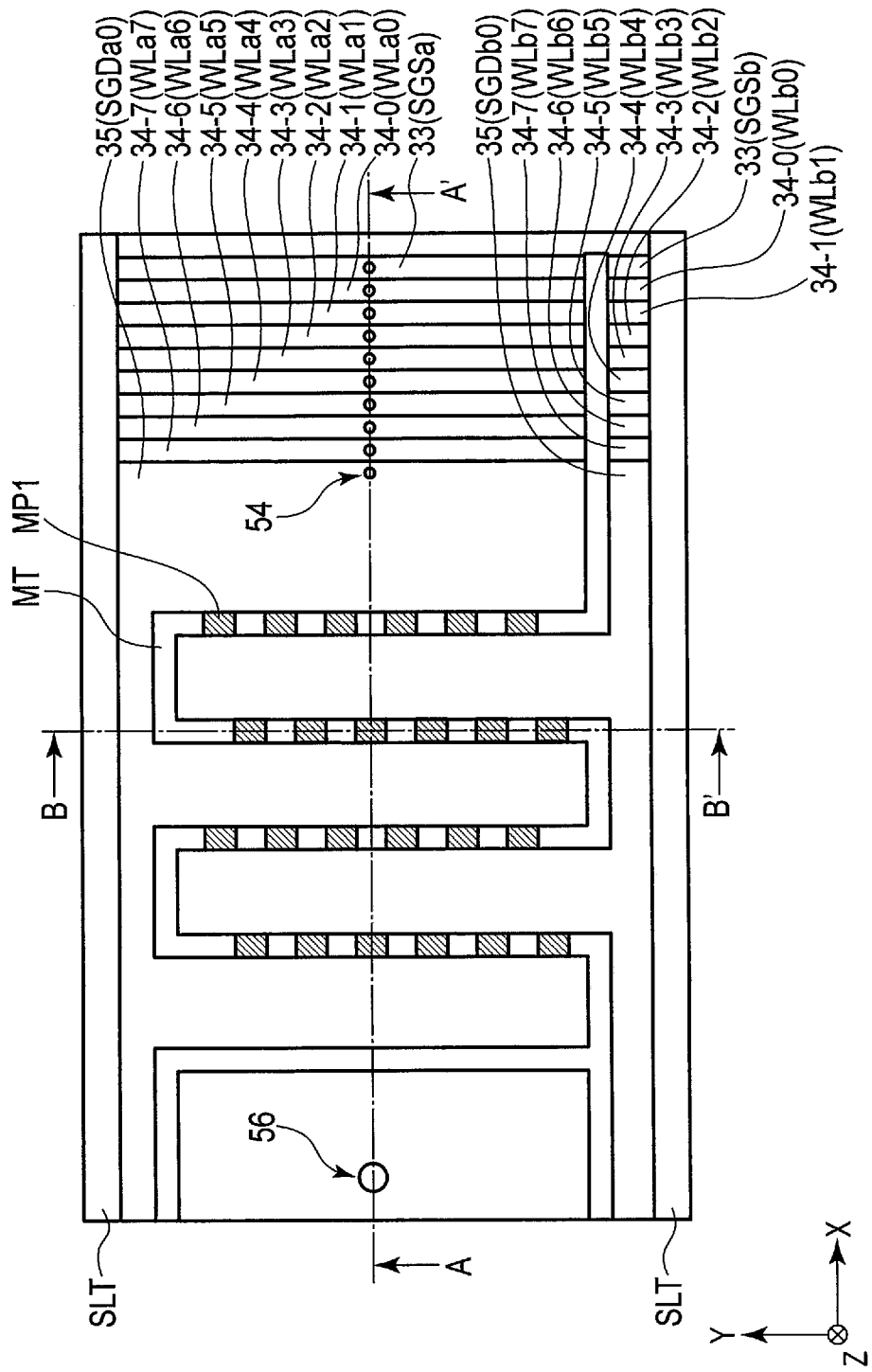
FIG. 37 is a plan view of a structure of the semiconductor memory device in a manufacturing step.
Figure 39:
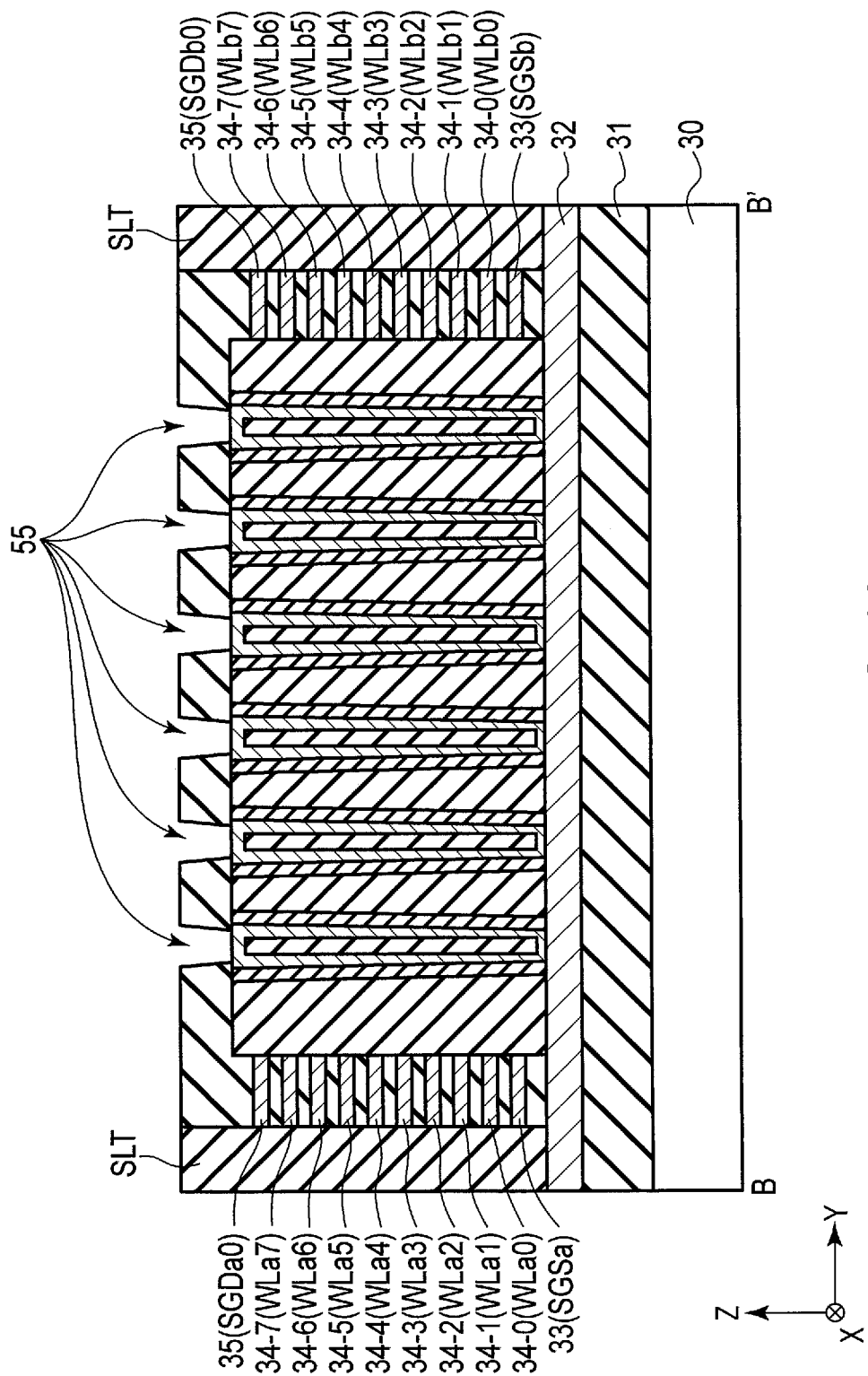
FIG. 39 is a cross-sectional view of the structure of the semiconductor memory device in the manufacturing step, taken along line B-B'.

Next, the contact plugs CP1 and CP3 are formed, as shown in FIGS. 37 to 39 and FIGS. 3 to 5. Specifically, by the RIE method, for example, holes 54 for the contact plugs CP1 are formed in the insulation layers 31 on the hookup area of the conductive layers 33, 34-0 to 34-7, and 35, holes 55 for the contact plugs CP3 are formed in the insulation layers 31 on the memory pillar MP1, and a hole 56 for the contact plug CP4 is formed in the insulation layers 31 on the contact plug CP2, as shown in FIGS. 37 to 39. Then, a conductive material, such as tungsten, is embedded in the holes 54 to 56 by, for example, the CVD (or ALD) method, as shown in FIGS. 3 to 5. Thereby, the contact plugs CP1 are formed on the hookup areas of the conductive layers 33, 34-0 to 34-7, and 35, the contact plugs CP3 are formed on the memory pillars MP1, and the contact plug CP4 is formed on the contact plug CP2.

Thereafter, the bit lines BL, other interconnects, vias, insulation layers, etc., are formed, so that the manufacturing of the semiconductor memory device is completed.

1.2.1. Method of Forming Memory Pillar MP1

Next, a method of forming the memory pillar MP1 will be described with reference to FIGS. 40 to 51. FIGS. 40 to 51 are cross-sectional views of the structure of the memory pillar MP1 in each manufacturing step. FIGS. 40, 42, 44, 46, 48, and 50 show cross sections of the structure in each manufacturing step, taken along plane XZ. FIGS. 41, 43, 45, 47, 49, and 51 show cross sections of the structure in each manufacturing step, taken along line E-E' (plane XY).

Figure 40:
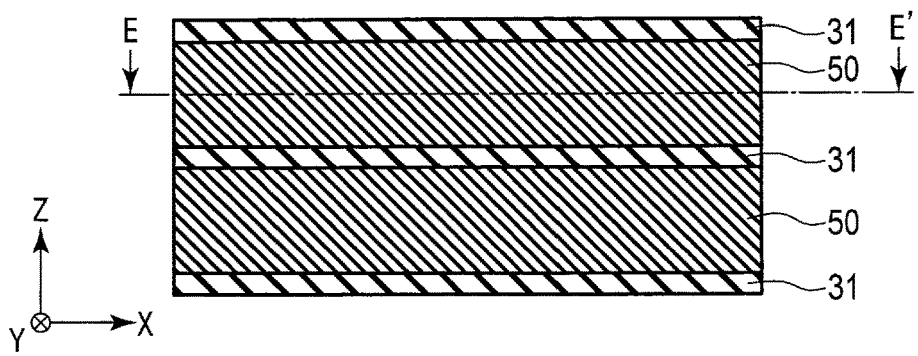
FIG. 40 is a cross-sectional view of a structure of the memory pillar in a manufacturing step, taken along plane XZ in the first embodiment.
Figure 41:
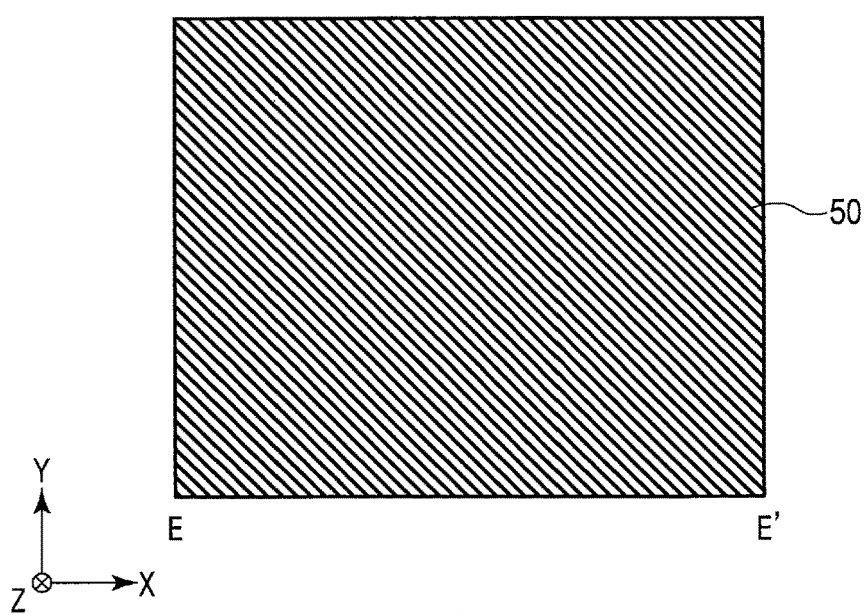
FIG. 41 is a cross-sectional view of the structure of the memory pillar in the manufacturing step, taken along line E-E'.

First, a stack of the insulation layers 31 and the insulation layers 50 is formed, as shown in FIGS. 40 and 41.

Figure 42:
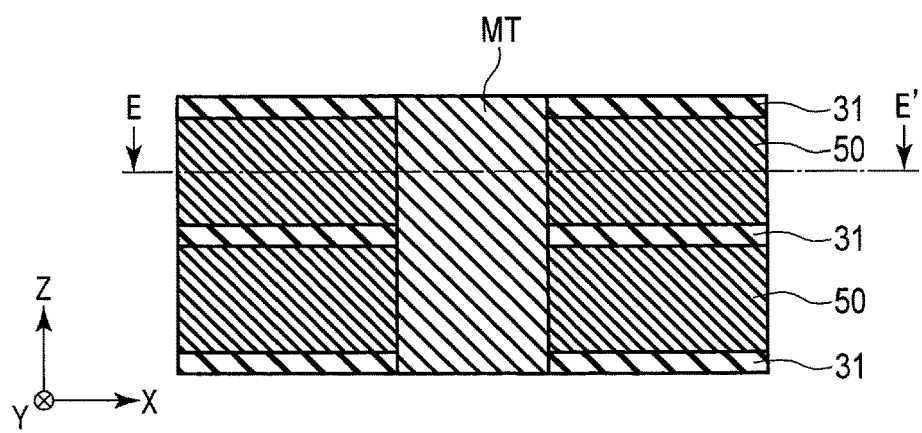
FIG. 42 is a cross-sectional view of a structure of the memory pillar in a manufacturing step, taken along plane XZ.

Next, a trench for dividing the insulation layers 50 of the stack is formed, and then an insulation material is embedded in the trench, so that the memory trench MT is formed, as shown in FIGS. 42 and 43.

Figure 45:
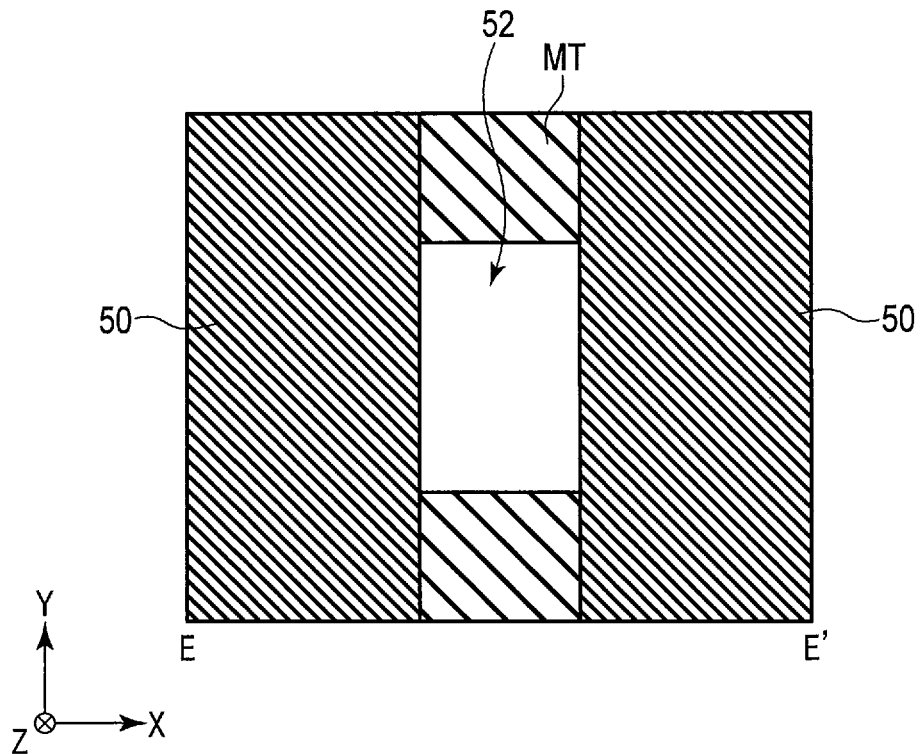
FIG. 45 is a cross-sectional view of the structure of the memory pillar in the manufacturing step, taken along line E-E'.

Next, a rectangular hole 52 is formed in the memory trench MT, as shown in FIGS. 44 and 45.

Figure 46:
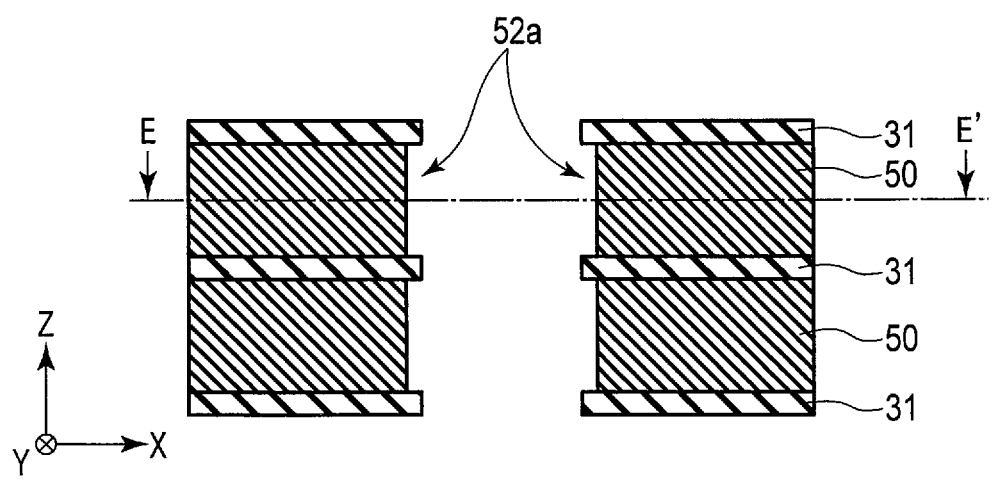
FIG. 46 is a cross-sectional view of a structure of the memory pillar in a manufacturing step, taken along plane XZ.

Next, the insulation layers (silicon nitride layers) 50, exposed to the inner wall of the hole 52, are removed, so that a recessed portion 52a is formed, as shown in FIGS. 46 and 47. Specifically, a predetermined amount of the insulation layers 50 is removed by, for example, wet etching using a phosphoric acid solution introduced through the hole 52, so that the side surfaces of the insulation layers 50 are recessed. Thereby, the recessed portions 52a of the insulation layers 50 are formed between the insulation layers 31, as shown in FIG. 46.

Next, the charge storage film 40B, the tunnel insulation film 40C, the semiconductor layer 41, and the core insulation film 42 are formed, in the order mentioned, on the inner wall of the hole 52 including the recessed portions 52a, as shown in FIGS. 48 and 49. At this time, since the recessed portions 52a are formed in the stack of the insulation layers 31 and the insulation layers 50, the charge storage film 40B is fitted into the recessed portions 52a, as shown in FIGS. 48 and 49.

Thereafter, the block insulation film 40A is formed on the side wall of the charge storage film 40B in the replacement step which involves replacing the insulation layers (silicon nitride layers) 50 with the a-side conductive layers and the b-side conductive layers (conductive layers 33, 34-0 to 34-7, and 35), as shown in FIGS. 50 and 51 and FIGS. 7 to 9. Specifically, the grooves 53 for the slits SLT are formed in the stack of the insulation layers 31 and the insulation layers 50 by the RIE method, as shown in FIGS. 31 to 33 referred to above. Then, the insulation layers 50 are removed by, for example, wet etching using a phosphoric acid solution introduced through the grooves 53. Thereby, gaps 53a are formed between the insulation layers 31, as shown in FIGS. 50 and 51. In a case where the charge storage film 40B may be damaged by the wet etching performed at this time, it is effective to oxidize the side surfaces of the insulation layers 50 after the side surfaces of the insulation layers 50 are recessed, so that silicon oxide films are formed on the side surfaces of the insulation layers 50, as shown in FIGS. 46 and 47. The silicon oxide films later become a part of the silicon oxide film 40Ab of the block insulation film 40A.

Furthermore, the silicon oxide film 40Ab and the aluminum oxide film 40Aa are formed, in the mentioned order, on the inner surfaces of the gaps 53a between the insulation layers 31 by the CVD (or ALD) method, as shown in FIGS. 7 and 8. Thereafter, a conductive material such as tungsten is embedded in the gaps 53a to form the a-side conductive layers 34a and the b-side conductive layers 34b.

Through the above steps, the memory pillar MP1 that includes the aluminum oxide film 40Aa, the silicon oxide film 40Ab, the charge storage film 40B, the tunnel insulation film 40C, the semiconductor layer 41, and the core insulation film 42, arranged in the order mentioned, is formed on the side surfaces of the a-side conductive layers 34a and the b-side conductive layers 34b.

1.2.2. Method of Forming Modification of Memory Pillar MP1

Next, a method of forming the memory pillar MP1a as a modification of the memory pillar MP1 will be described with reference to FIGS. 52 to 55. FIGS. 52 to 55 are cross-sectional views of the structure of the memory pillar MP1a in each manufacturing step. FIGS. 52 and 54 show cross sections of the structure in each manufacturing step, taken along plane XZ. FIGS. 53 and 55 show cross sections of the structure in each manufacturing step, taken along line E-E' (plane XY).

First, the above-described steps shown in FIGS. 40 to 45 are performed to form a rectangular hole 52 in the memory trench MT.

Next, the insulation layers (silicon nitride layers) 50, exposed to the inner wall of the hole 52, are removed, so that recessed portions 52b are formed, as shown in FIGS. 52 and 53. At this time, the size of each of the recessed portions 52b in direction XY is larger than the size of each of the recessed portions 52a in direction XY.

Next, the aluminum oxide film 40Aa, the silicon oxide film 40Ab, the charge storage film 40B, the tunnel insulation film 40C, the semiconductor layer 41, and the core insulation film 42 are formed, in the order mentioned, on the inner wall of the hole 52 including the recessed portions 52b, as shown in FIGS. 54, 55, 10 and 11. Specifically, the aluminum oxide film 40Aa, the silicon oxide film 40Ab, the charge storage film 40B, and the tunnel insulation film 40C are formed on the inner wall of the hole 52 in the order mentioned by, for example, the CVD (or ALD) method, as shown in FIGS. 54 and 55. Furthermore, the semiconductor layer 41 and the core insulation film 42 are formed on the inner wall of the tunnel insulation film 40C in the order mentioned, as shown in FIGS. 10 and 11. At this time, since the recessed portions 52b are formed in the stack of the insulation layers 31 and the insulation layers 50, the aluminum oxide film 40Aa, the silicon oxide film 40Ab, and the charge storage film 40B are fitted into the recessed portions 52b, as shown in FIGS. 10 and 11.

Thereafter, the replacement step which involves replacing the insulation layers (silicon nitride layers) 50 with the a-side conductive layers and the b-side conductive layers (conductive layers 33, 34-0 to 34-7, and 35) is performed.

Through the above steps, the memory pillar MP1a that includes the aluminum oxide film 40Aa, the silicon oxide film 40Ab, the charge storage film 40B, the tunnel insulation film 40C, the semiconductor layer 41, and the core insulation film 42, arranged in the order mentioned, is formed on the side surfaces of the a-side conductive layers 34a and the b-side conductive layers 34b.

1.3. Advantageous Effects of First Embodiment

According to the first embodiment, a semiconductor memory device with memory cells that are capable of improving write characteristics can be provided.

The advantageous effects of the first embodiment will be detailed below. For example, a memory pillar (or memory cell transistor) provided between two stacks of conductive layers has various shapes; however, a configuration of a memory pillar as shown in FIG. 74 will be described below as a comparative example.

FIG. 74 shows cross sections of a memory pillar and conductive layers (word lines), taken along plane XY. As shown in FIG. 74, a memory trench 102 is provided between stacked conductive layers 101 and another stacked conductive layers 101, and a memory pillar is formed between the conductive layers 101 and between areas of the memory trench 102. The memory pillar includes an aluminum oxide film 103A, a silicon oxide film 103B, a charge storage film 104, a tunnel insulation film 105, a semiconductor layer 106, and a core insulation film 107 arranged in the order mentioned from the conductive layer 101 side. In this comparative example, the outer shape of the charge storage film 104 is arranged along the outer shape of the memory pillar as viewed in direction Y. Namely, the outer shape of the charge storage film 104 mostly corresponds to the outer shape of the memory pillar as viewed in direction Y.

In the comparative example having such a configuration, when a write voltage is applied to the conductive layers to perform a write operation, a gradient of a threshold voltage of the memory cell transistor with respect to the write voltage may be small, resulting in degradation of the write characteristics.

Accordingly, in the first embodiment, a part of the charge storage film 40B is arranged between the memory trench MT and the conductive layers 34-0 to 34-7, at one end of a portion where the memory pillar MP1 (or MP1a) and the conductive layers 34-0 to 34-7 (word lines WL) face each other (or a boundary portion where the memory pillar MP1 (or MP1a) and the conductive layers 34-0 to 34-7 (word lines WL) come into contact with each other) In other words, a part of the charge storage film 40B is fitted between the memory trench MT and the conductive layers 34-0 to 34-7. As a result, an amount of charge storage in the charge storage film 40B, arranged at the end of the portion where the memory pillar MP1 and the conductive layers 34-0 to 34-7 face each other (or the boundary portion between the memory pillar MP1 and the conductive layers 34-0 to 34-7), is increased in a write operation. This increases a threshold voltage of a parasitic transistor generated at the end of the portion where the memory pillar MP1 and the conductive layers face each other, and prevents the parasitic transistor from being turned on. Accordingly, the threshold voltage of the memory cell transistor is determined by the threshold voltage of the transistor formed in the center of the portion where the memory pillar MP1 and the conductive layers face each other, allowing for improvement of the write characteristics of the memory cell transistor.

FIG. 56 shows write characteristics of the first embodiment and the comparative example in a write operation. The write characteristics refer to a change of a threshold voltage Vth of the memory cell transistor caused by a write voltage Vpgm. As shown in FIG. 56, the write characteristics of the memory cell transistor of the first embodiment are improved as compared to the memory cell transistor of the comparative example. According to the first embodiment, a semiconductor memory device with memory cells that are capable of improving the write characteristics can be provided, as described above.

2. Second Embodiment

Next, a semiconductor memory device according to a second embodiment will be described. In the second embodiment, an example in which the cross section of the memory pillar along plane XY has an elliptical shape will be described. The description of the second embodiment will focus mainly on the points that differ from the first embodiment.

2.1. Configuration of Semiconductor Memory Device

A block configuration and a circuit configuration of a memory cell array in the semiconductor memory device according to the second embodiment are the same as those of the first embodiment.

2.1.1. Planar Configuration of Memory Cell Array 11

Figure 57:
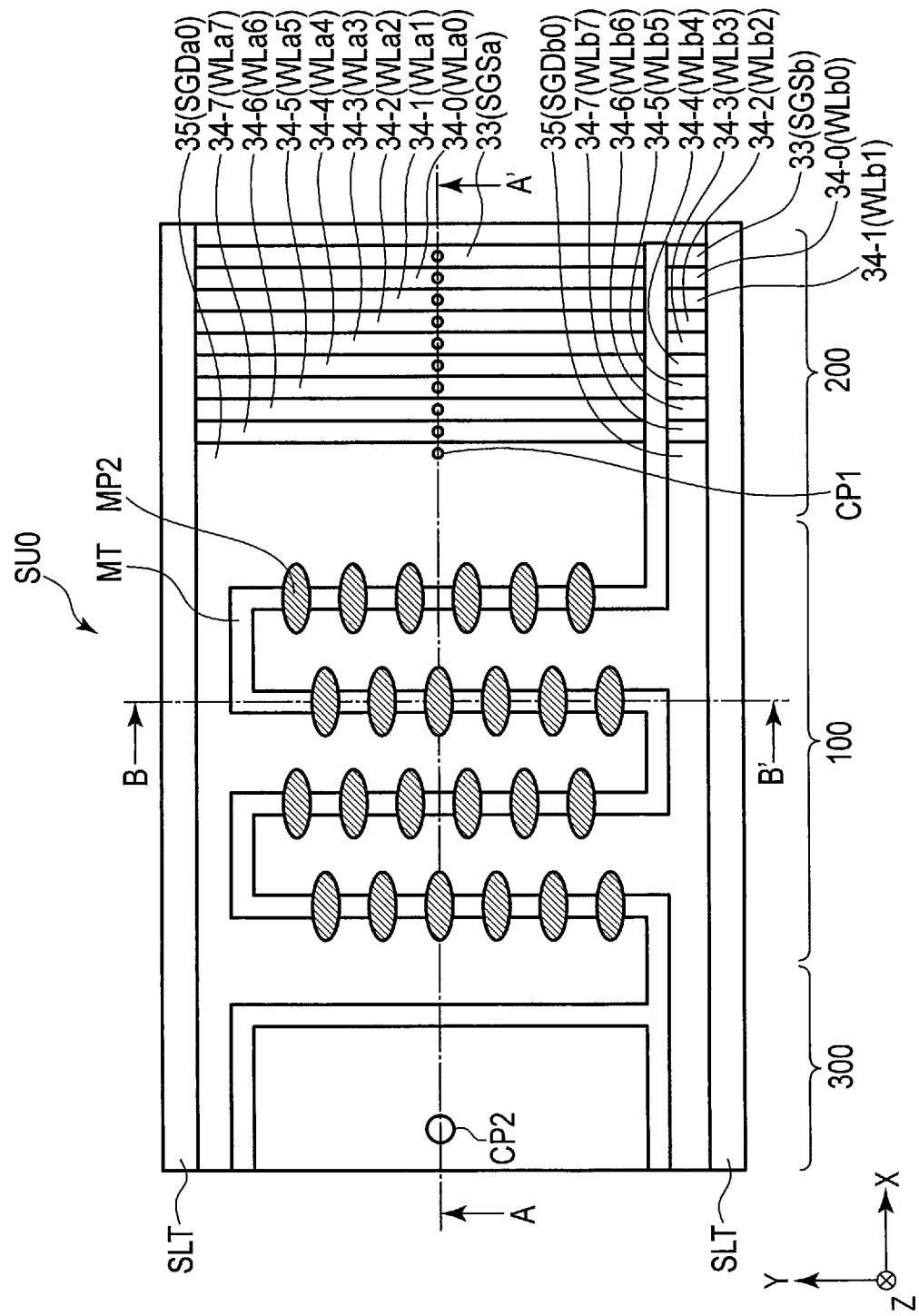
FIG. 57 is a plan view showing an example of a memory cell array of a second embodiment.

A planar configuration of the memory cell array 11 according to the second embodiment will be described with reference to FIG. 57. FIG. 57 is a plan view showing an example of the memory cell array 11. As shown in FIG. 57, a plurality of memory pillars MP2 are provided along the memory trench MT. The memory pillar MP2 has, for example, an elliptical shape. The memory pillar MP2 will be described later. The rest of the planar configuration is the same as that of the first embodiment.

2.1.2. Cross-Sectional Configuration of Memory Cell Array 11

Figure 58:
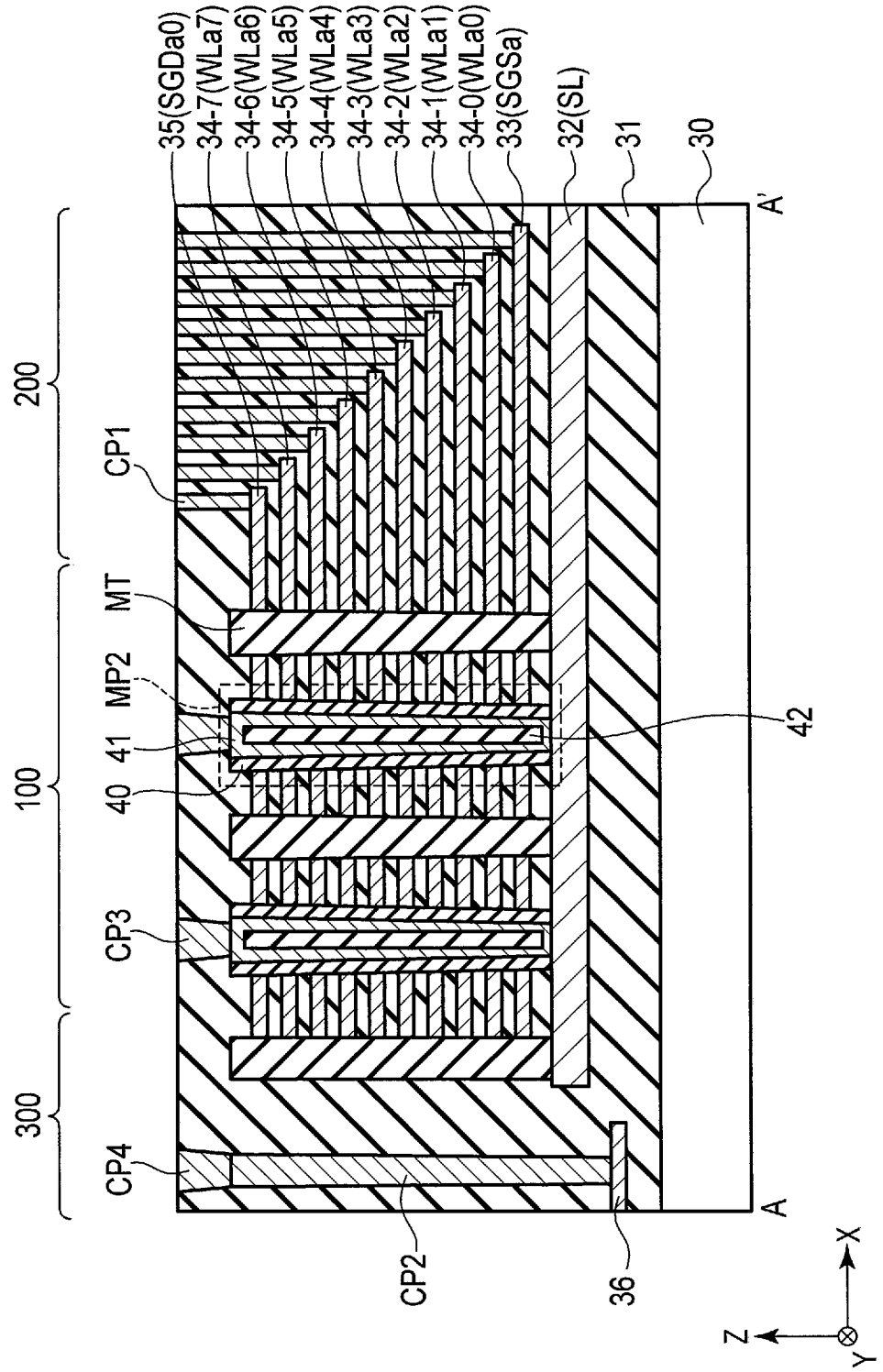
FIG. 58 is a cross-sectional view taken along line A-A' shown in FIG. 57.
Figure 59:
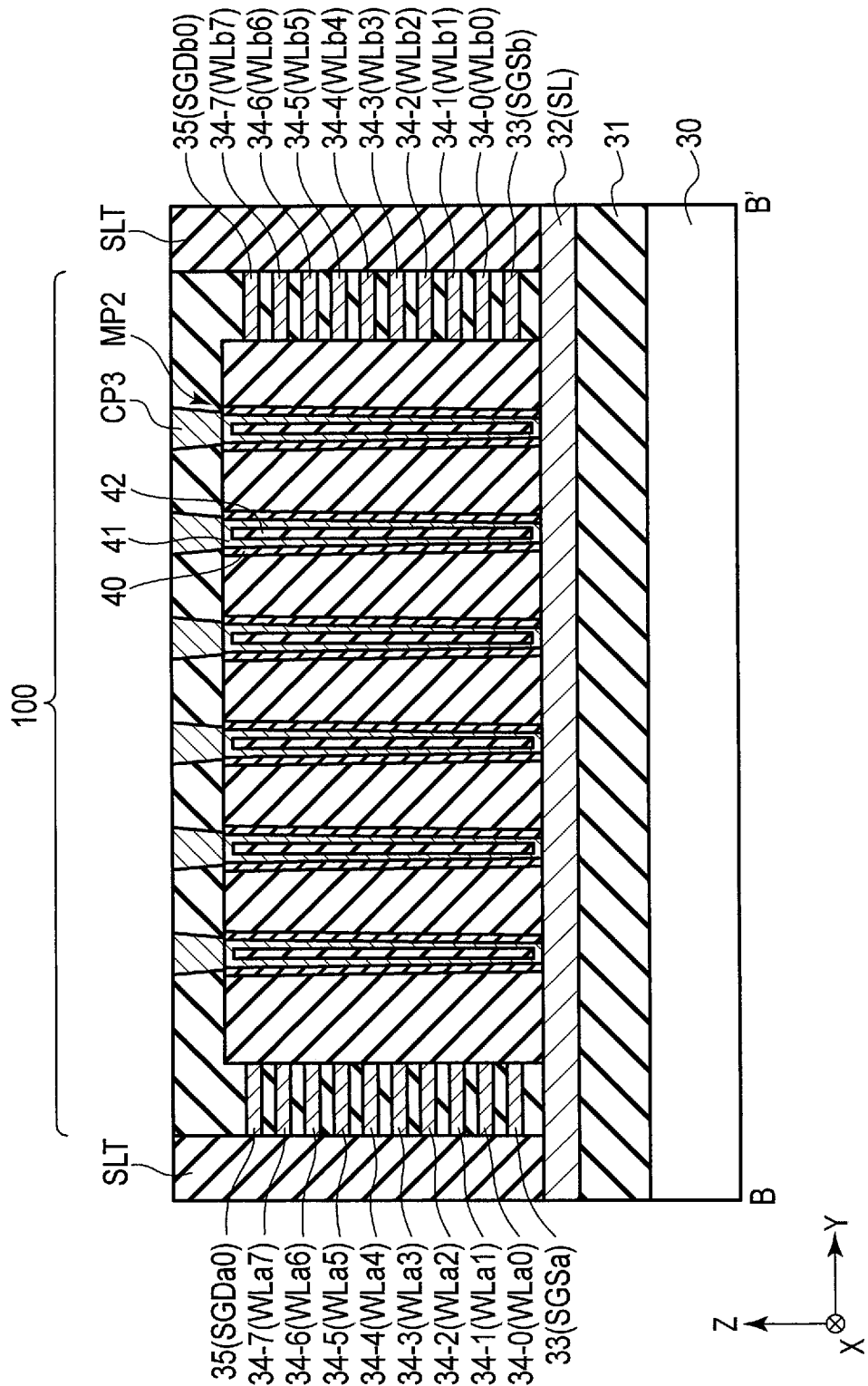
FIG. 59 is a cross-sectional view taken along line B-B' shown in FIG. 57.

Next, a cross-sectional structure of the memory cell array 11 will be described. FIG. 58 is a cross-sectional view taken along line A-A' shown in FIG. 57. FIG. 59 is a cross-sectional view taken along line B-B' shown in FIG. 57. To simplify the description, the bit lines BL are omitted in FIGS. 58 and 59.

In the cross sections shown in FIGS. 58 and 59, the memory pillar MP2 replaces the memory pillar MP1 of the first embodiment shown in FIGS. 4 and 5. The rest of the cross-sectional configuration is the same as that of the first embodiment described above.

2.1.3. Configuration of Memory Pillar MP2

Next, a configuration of the memory pillar MP2 of the semiconductor memory device according to the second embodiment will be described. A general cross-sectional configuration of the memory pillar MP2 is the same as that of the first embodiment.

2.1.3.1. Detailed Cross-Sectional Configuration of Memory Pillar MP2

Figure 60:
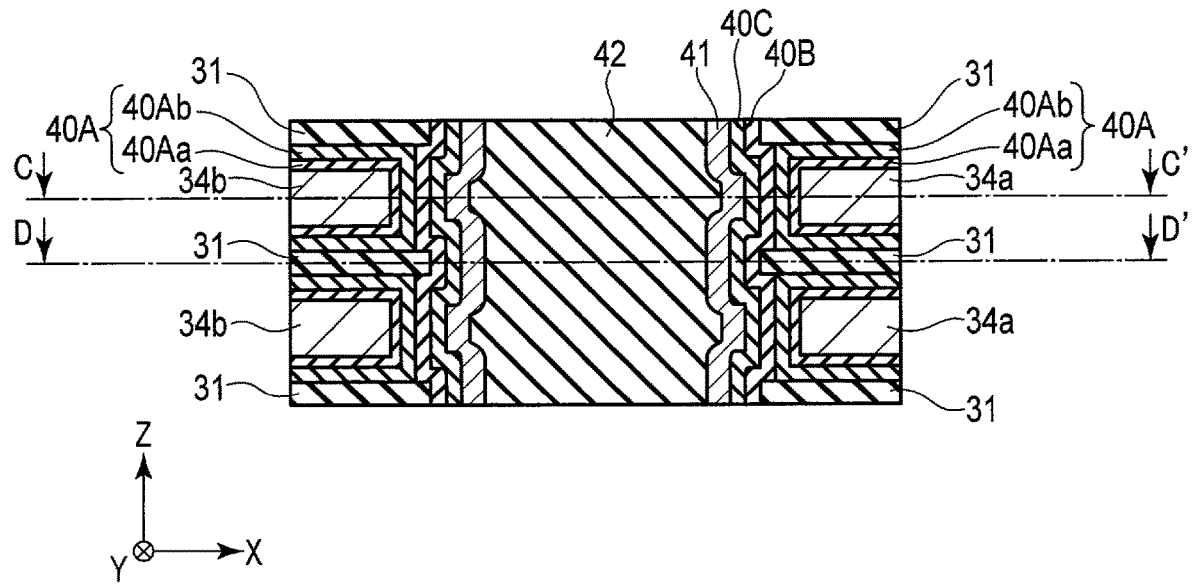
FIG. 60 is a detailed cross-sectional view of a memory pillar, taken along plane XZ in the second embodiment.
Figure 61:
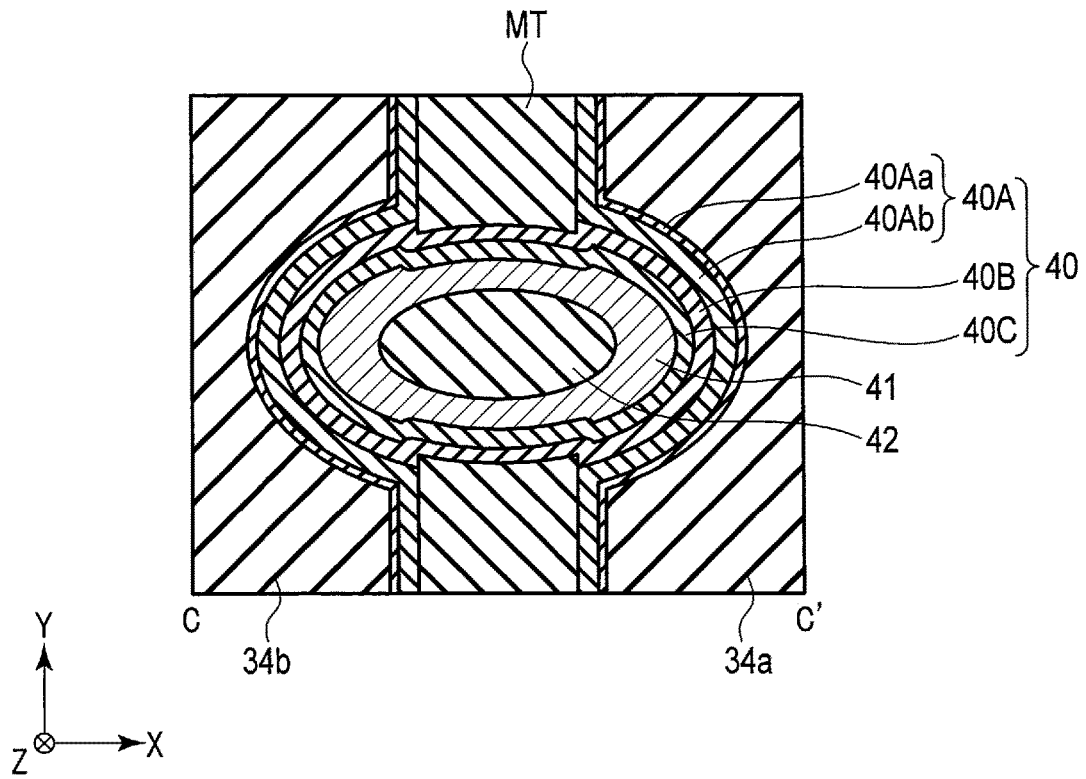
FIG. 61 is a cross-sectional view taken along line C-C' shown in FIG. 60.

A detailed cross-sectional configuration of the memory pillar MP2 will be described below. FIGS. 60 to 62 are cross-sectional diagrams showing the detailed configuration of the memory pillar MP2. FIG. 60 shows a cross section of the memory pillar MP2 taken along plane XZ. FIG. 61 shows cross sections of the memory pillar MP2, the a-side conductive layers 34a, and the b-side conductive layers 34b, taken along line C-C' (plane XY) in FIG. 60. FIG. 62 shows cross sections of the memory pillar MP2 and the insulation layers 31, taken along line D-D' (plane XY) in FIG. 60.

As shown in FIGS. 60 and 61, an end of the stack of the insulation layers 31 and the a-side conductive layers 34a includes a curved (or an arc-shaped) portion having a curved shape along direction Y and a linear portion having a linear shape along direction Y. The curved portion and the linear portion are alternately arranged in direction Y. Likewise, one end of the stack of the insulation layers 31 and the b-side conductive layers 34b includes a curved (or an arc-shaped) portion having a curved shape along direction Y and a linear portion having a linear shape along direction Y. The curved portion and the linear portion are alternately arranged in direction Y.

The linear portion of the a-side conductive layers 34a and the linear portion of the b-side conductive layers 34b are arranged to face each other, and the curved portion of the a-side conductive layers 34a and the curved portion of the b-side conductive layers 34b are arranged to face each other. The memory trench MT is arranged between the linear portion of the a-side conductive layers 34a and the linear portion of the b-side conductive layers 34b. The memory pillar MP2 is arranged between the curved portion of the a-side conductive layers 34a and the curved portion of the b-side conductive layers 34b, and between areas of the memory trench MT.

In a manner similar to the memory pillar MP1 of the first embodiment, the charge storage film 40B is fitted in the recessed portion provided by the insulation layers 31 as well as the a-side conductive layers 34a and the block insulation film 40A on the side surface of the a-side conductive layers 34a. Also, the tunnel insulation film 40C and the semiconductor layer 41 are arranged, in the order mentioned, on the side surface of the charge storage film 40B provided on the a-side conductive layers 34a. Likewise, the charge storage film 40B is fitted in the recessed portion provided by the insulation layers 31, as well as the b-side conductive layers 34b and the block insulation film 40A on the side surface of the b-side conductive layers 34b. Also, the tunnel insulation film 40C and the semiconductor layer 41 are arranged, in the order mentioned, on the side surface of the charge storage film 40B provided on the b-side conductive layers 34b. The core insulation film 42 is arranged on the side surface of the semiconductor layer 41.

As shown in FIGS. 61 and 62, the memory cell transistors MCa and MCb provided in the memory pillar MP2 have, for example, an elliptical shape or a circular shape as viewed in the cross section along plane XY.

At one end of a portion where the a-side conductive layers 34a and the memory pillar MP2 face each other (or a boundary portion where the a-side conductive layers 34a and the memory pillar MP2 come into contact with each other), a part of the charge storage film 40B is arranged between the memory trench MT and the a-side conductive layers 34a. In other words, apart of the charge storage film 40B is fitted into the recessed portion provided between the memory trench MT and the a-side conductive layers 34a. Likewise, at one end of a portion where the b-side conductive layers 34b and the memory pillar MP2 face each other (or a boundary portion where the b-side conductive layers 34b and the memory pillar MP2 come into contact with each other), a part of the charge storage film 40B is arranged between the memory trench MT and the b-side conductive layers 34b. Namely, a part of the charge storage film 40B is fitted into the recessed portion provided between the memory trench MT and the b-side conductive layers 34b.

In the cross section along plane XY, the length along direction X, of the cross section of the part of the charge storage film 40B arranged between the memory trench MT and the a-side conductive layers 34a, and between the memory trench MT and the b-side conductive layers 34b, is not greater than the length along direction X, of the cross section of the charge storage film 40B.

On the other hand, in the cross section of the insulation layers 31 shown in FIG. 62, a recessed portion is not provided between the memory trench MT and the insulation layers 31 at an end of a portion where the insulation layers 31 and the memory pillar MP2 face each other. Therefore, a part of the charge storage film 40B is not arranged between the memory trench MT and the insulation layers 31. The rest of the cross-sectional configuration is the same as that of the memory pillar MP1.

2.1.4. Configuration of Modification of Memory Pillar MP2

Next, a configuration of a modification of the memory pillar MP2 will be described. Hereinafter, the modification of the memory pillar MP2 will be referred to as a memory pillar MP2a. A general cross-sectional configuration of the memory pillar MP2a is the same as that shown in FIG. 6.

2.1.4.1. Detailed Cross-Sectional Configuration of Modification of Memory Pillar MP2

Figure 64:
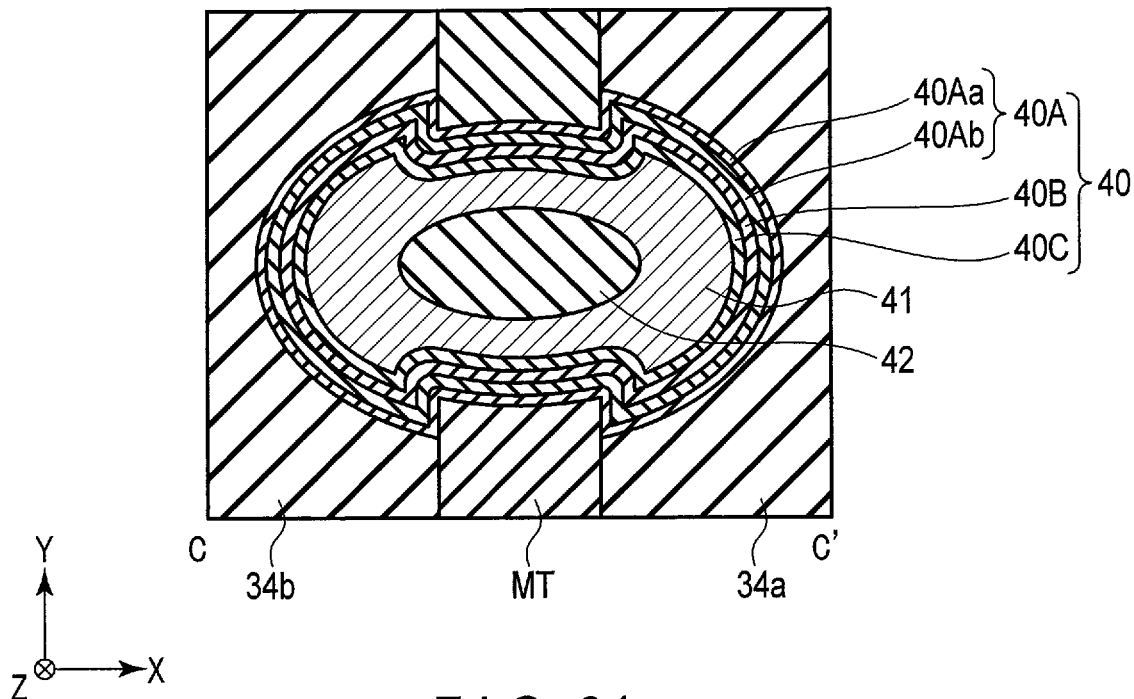
FIG. 64 is a cross-sectional view taken along line C-C' shown in FIG. 63.
Figure 65:
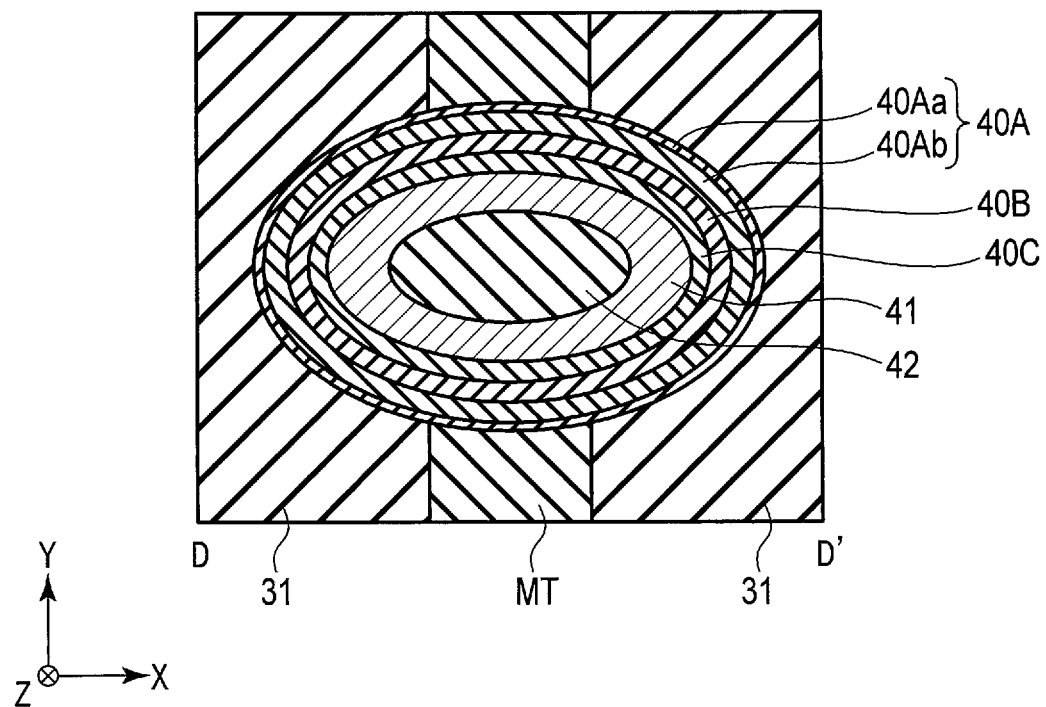
FIG. 65 is a cross-sectional view taken along line D-D' shown in FIG. 63.

Next, a detailed cross-sectional configuration of the memory pillar MP2a will be described. FIGS. 63 to 65 are cross-sectional diagrams showing a detailed configuration of the memory pillar MP2a. FIG. 63 shows a cross section of the memory pillar MP2a taken along plane XZ. FIG. 64 shows cross sections of the memory pillar MP2a, the a-side conductive layers 34a, and the b-side conductive layers 34b, taken along line C-C' (plane XY) in FIG. 63. FIG. 65 shows cross sections of the memory pillar MP2a and the insulation layers 31, taken along line D-D' (plane XY) in FIG. 63.

In a manner similar to the memory pillar MP2, the memory pillar MP2a is arranged between the curved portion of the a-side conductive layers 34a and the curved portion of the b-side conductive layers 34b, and between areas of the memory trench MT, as shown in FIGS. 63 and 64.

The block insulation film 40A and the charge storage film 40B are fitted into the recessed portion provided by the insulation layers 31 and the a-side conductive layers 34a. Also, the tunnel insulation film 40C and the semiconductor layer 41 are arranged, in the order mentioned, on the side surface of the charge storage film 40B provided on the a-side conductive layers 34a. Likewise, the charge storage film 40B is fitted into the recessed portion provided by the insulation layers 31 and the b-side conductive layers 34b. Also, the tunnel insulation film 40C and the semiconductor layer 41 are arranged, in the order mentioned, on the side surface of the charge storage film 40B provided on the b-side conductive layers 34b. The core insulation film 42 is arranged on the side surface of the semiconductor layer 41.

As shown in FIGS. 64 and 65, the memory cell transistors MCa and MCb provided in the memory pillar MP2a have, for example, an elliptical shape or a circular shape as viewed in the cross section along plane XY.

At one end of a portion where the a-side conductive layers 34a and the memory pillar MP2a face each other (or a boundary portion where the a-side conductive layers 34a and the memory pillar MP2a come into contact with each other), a part of the charge storage film 40B is arranged between the memory trench MT and the a-side conductive layers 34a. In other words, a part of the charge storage film 40B is fitted into the recessed portion provided between the memory trench MT and the a-side conductive layers 34a. Likewise, at one end of a portion where the b-side conductive layers 34b and the memory pillar MP2a face each other (or a boundary portion where the b-side conductive layers 34b and the memory pillar MP2a come into contact with each other), a part of the charge storage film 40B is arranged between the memory trench MT and the b-side conductive layers 34b. Namely, a part of the charge storage film 40B is fitted into the recessed portion provided between the memory trench MT and the b-side conductive layers 34b.

In the cross section along plane XY, the length along direction X, of the cross section of the part of the charge storage film 40B arranged between the memory trench MT and the a-side conductive layers 34a, and between the memory trench MT and the b-side conductive layers 34b, can be set to be no greater than the length along direction X, of the cross section of the charge storage film 40B.

On the other hand, in the cross section of the insulation layers 31 shown in FIG. 65, a recessed portion is not provided between the memory trench MT and the insulation layers 31 at one end of a portion where the insulation layers 31 and the memory pillar MP2a face each other (or a boundary portion where the insulation layers 31 and the memory pillar MP2a come into contact with each other). Therefore, a part of the charge storage film 40B is not arranged between the memory trench MT and the insulation layers 31.

2.2. Method of Manufacturing Semiconductor Memory Device

Figure 70:
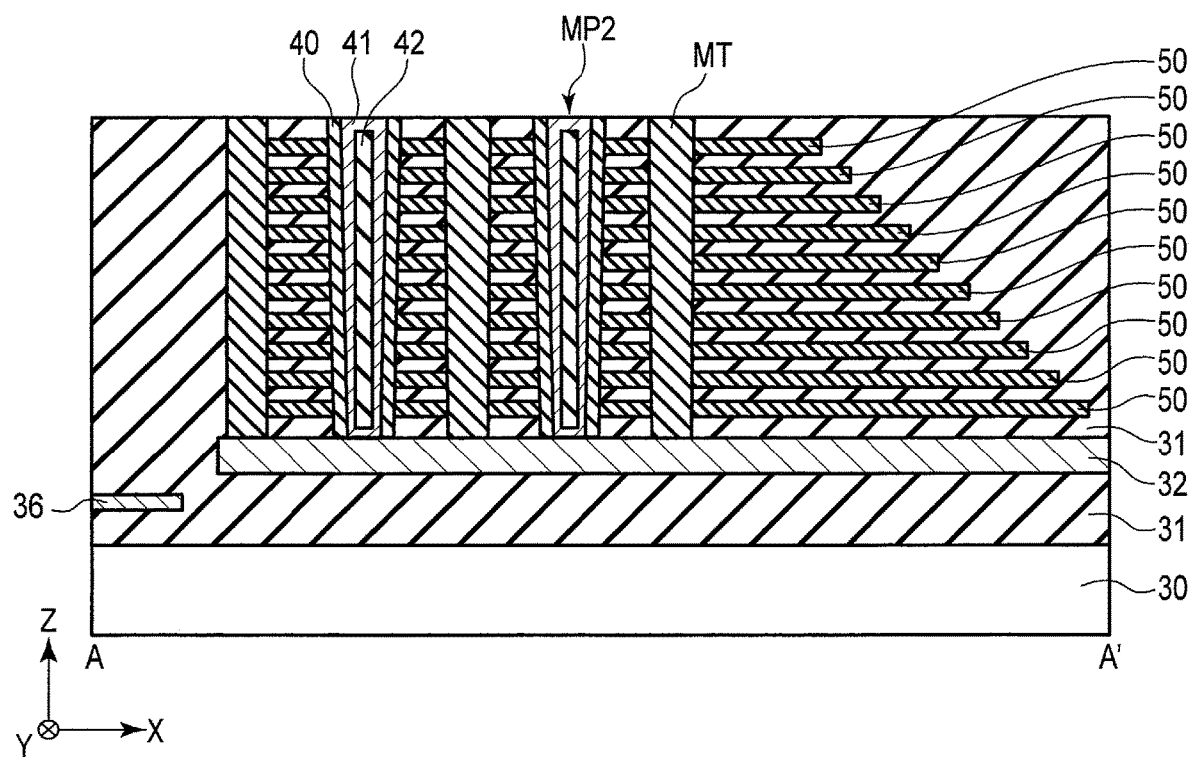
FIG. 70 is a cross-sectional view of the structure of the semiconductor memory device in the manufacturing step, taken along line A-A'.
Figure 71:
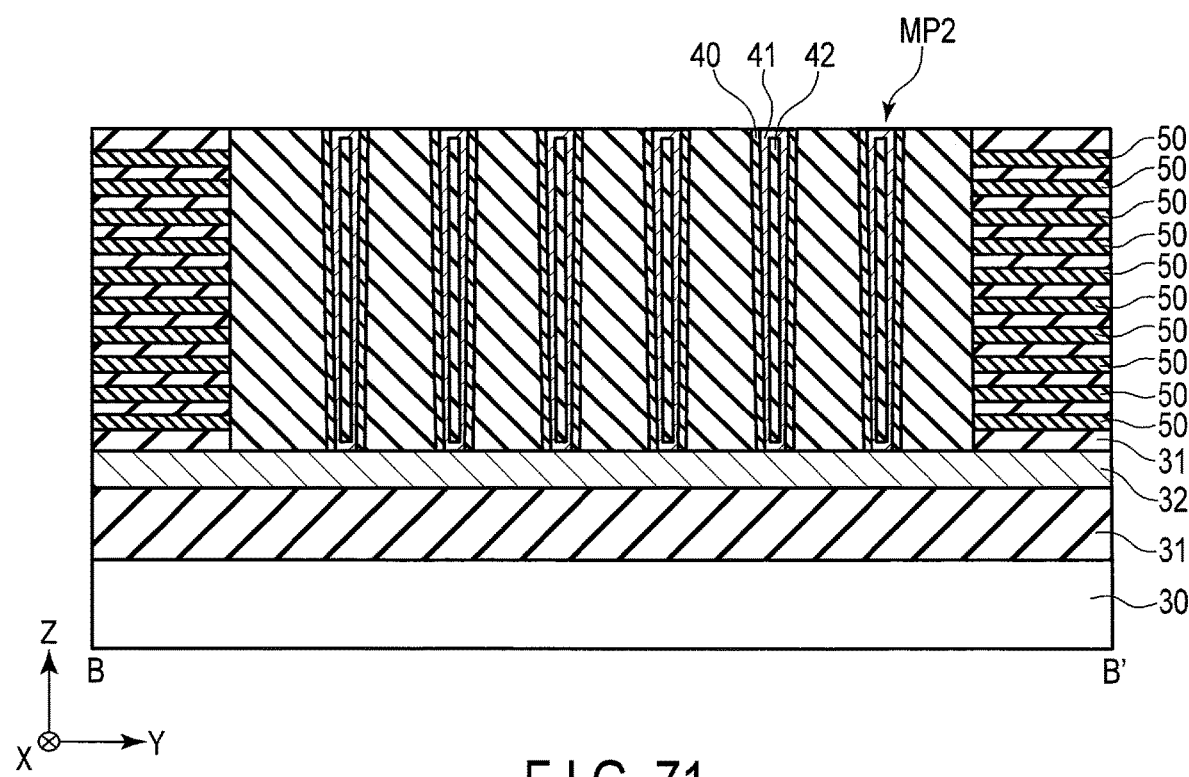
FIG. 71 is a cross-sectional view of the structure of the semiconductor memory device in the manufacturing step, taken along line B-B'.

Next, a method of manufacturing the semiconductor memory device of the second embodiment will be described. FIGS. 66 to 71 respectively show the structure of the semiconductor memory device of the second embodiment in each manufacturing step. FIGS. 66 and 69 are plan views of the structure of the semiconductor memory device in each manufacturing step. FIGS. 67 and 70 are cross-sectional views of the structure of the semiconductor memory device in each manufacturing step, taken along line A-A'. FIGS. 68 and 71 are cross-sectional views of the structure of the semiconductor memory device in each manufacturing step, taken along line B-B'.

First, the above-described steps shown in FIGS. 13 to 21 are performed in order to embed an insulation material in the trench 51 to form the memory trench MT. This step and the steps prior to this are the same as those of the manufacturing method of the first embodiment described above.

Next, holes 61 for forming the memory pillars MP2 are formed along the memory trench MT, as shown in FIGS. 66 to 68. Specifically, the holes 61 for the memory pillar MP2 are formed along the memory trench MT with a predetermined space therebetween by, for example, the RIE method, as shown in FIGS. 66 to 68. The holes 61 have, for example, an elliptical shape or a circular shape. In this embodiment, the holes 61 have an elliptical shape. The elliptical holes 61 are arranged so that the longitudinal axis of the holes 61 intersects with the direction in which the memory trench MT extends. In other words, the longitudinal axis of the holes 61 is parallel with direction X.

Next, the memory pillars MP2 are formed in the holes 61, as shown in FIGS. 69 to 71. Specifically, the insulation layers (silicon nitride layers) 50 are removed by, for example, wet etching using a phosphoric acid solution introduced through the holes 61, and then the charge storage film 40B, the tunnel insulation film 40C, the semiconductor layer 41, and the core insulation film 42 are formed, in the order mentioned, on the inner wall of the holes 61 by, for example, the CVD (or ALD) method. The silicon oxide film 40Ab, which is a part of the block insulation film 40A, may also be formed in this step. In this case, the silicon oxide film 40Ab need not be further formed in the subsequent step. Thereafter, the block insulation film 40A is formed on the charge storage film 40B in a replacement step described later.

Alternatively, the insulation layers 50 are removed by wet etching using a phosphoric acid solution introduced through the holes 61, and then the block insulation film 40A, the charge storage film 40B, the tunnel insulation film 40C, the semiconductor layer 41, and the core insulation film 42 are formed, in the order mentioned, on the inner wall of the holes 61 by the CVD (or ALD) method.

Through the above-described steps, the memory pillars MP2 are formed. A detailed method of forming the memory pillars MP2 will be described later.

Next, the same steps as those described above for the first embodiment shown in FIGS. 28 to 39 are performed. Furthermore, the contact plugs CP1 are formed on the hookup areas of the conductive layers 33, 34-0 to 34-7, and 35, the contact plugs CP3 are formed on the memory pillars MP2, and the contact plug CP4 is formed on the contact plug CP2, as shown in FIGS. 57 to 59.

Thereafter, the bit lines BL, other interconnects, vias, an insulation layers, etc., are formed, so that the manufacturing of the semiconductor memory device is completed.

2.2.1. Method of Forming Memory Pillar MP2

Figure 72:
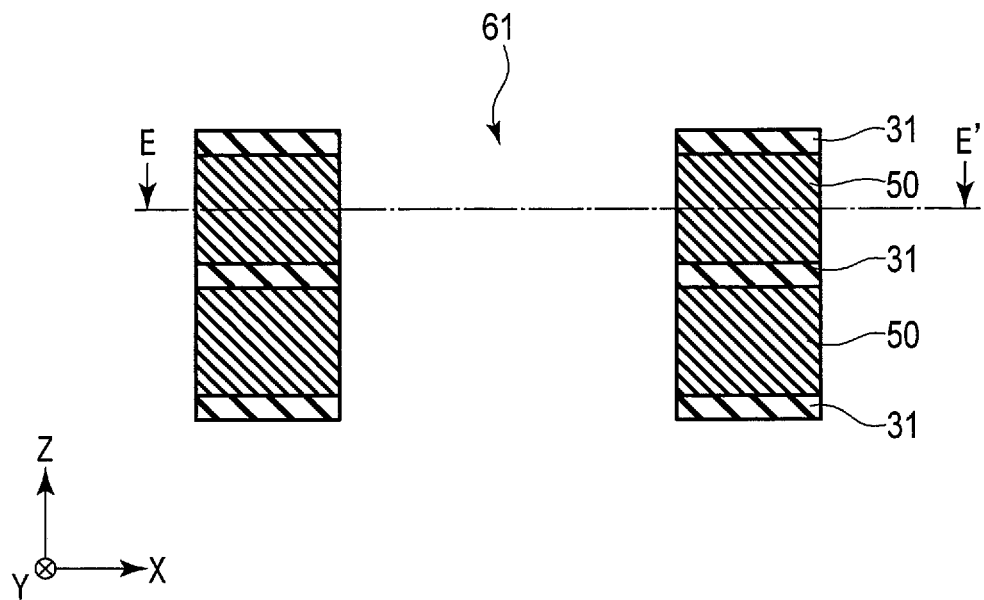
FIG. 72 is a cross-sectional view of a structure of the memory pillar in a manufacturing step, taken along plane XZ in the second embodiment.
Figure 73:
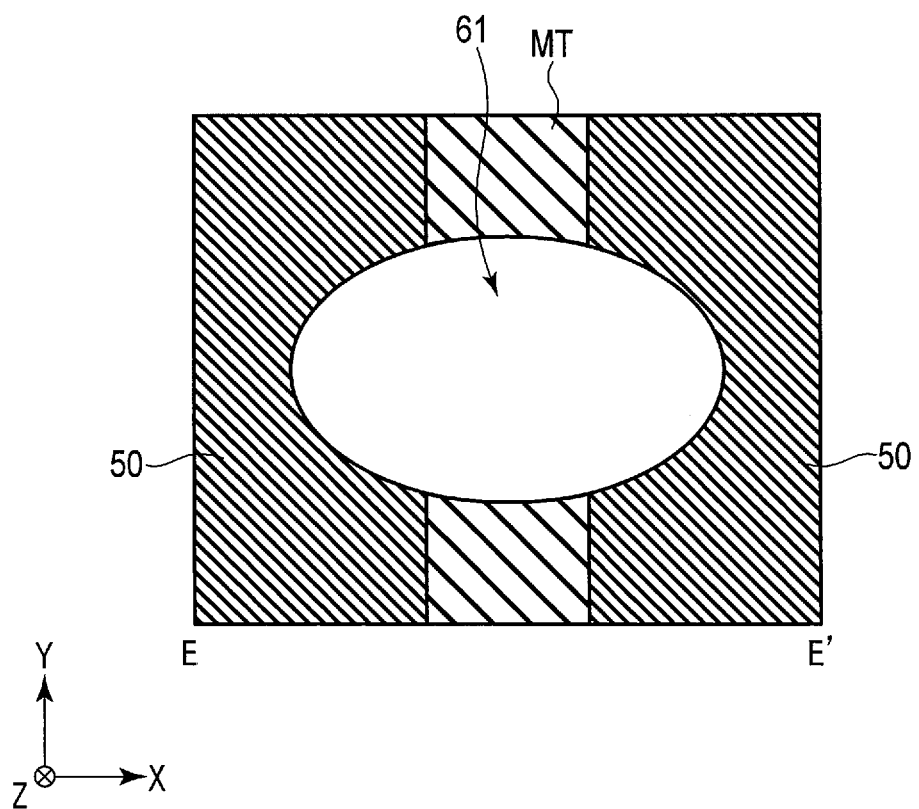
FIG. 73 is a cross-sectional view of the structure of the memory pillar in the manufacturing step, taken along line E-E'.

Next, a method of forming the memory pillar MP2 will be described. FIGS. 72 and 73 are cross-sectional views of the structure of the memory pillar MP2 in the manufacturing step. FIG. 72 shows a cross section of the structure in the manufacturing step, taken along plane XZ. FIG. 73 shows a cross section of the structure in the manufacturing step, taken along line E-E' (plane XY).

First, the above-described steps shown in FIGS. 40 to 43 are performed in order to form a trench for dividing the insulation layers 50 of the stack, and then embed an insulation material in the trench to form the memory trench MT. This step and the steps prior to this are the same as those of the method of forming the memory pillar MP1 described above.

Next, the elliptical hole 61 is formed in the memory trench MT, as shown in FIGS. 72 and 73.

Thereafter, the steps described with reference to FIGS. 46 to 51, 63, and 64 are performed in a manner similar to those for the method of forming the memory pillar MP1. Namely, the insulation layers 50 exposed to the inner wall of the holes 61 are removed, so that the recessed portions 52*a* are formed. The charge storage film 40B, the tunnel insulation film 40C, the semiconductor layer 41, and the core insulation film 42 are formed, in the mentioned order, on the inner wall of the holes 61 including the recessed portions 52*a*. Thereafter, the block insulation film 40A is formed on the side wall of the charge storage film 40B in the replacement step of replacing the insulation layers 50 with the a-side conductive layers and the b-side conductive layers (conductive layers 33, 34-0 to 34-7, and 35). Namely, the silicon oxide film 40Ab and the aluminum oxide film 40Aa are formed, in the order mentioned, on the inner surfaces of the gaps 53*a* between the insulation layers 31. Thereafter, a conductive material, such as tungsten, is embedded in the gaps 53*a* to form the a-side conductive layers 34*a* and the b-side conductive layers 34*b*.

Through the above steps, the memory pillar MP2 that includes the aluminum oxide film 40Aa, the silicon oxide film 40Ab, the charge storage film 40B, the tunnel insulation film 40C, the semiconductor layer 41, and the core insulation film 42, arranged in the order mentioned, is formed on the side surfaces of the a-side conductive layers 34*a* and the b-side conductive layers 34*b*.

2.2.2. Method of Forming Modification of Memory Pillar MP2

Next, a method of forming the memory pillar MP2*a* as a modification of the memory pillar MP2 will be described.

First, the above-described steps shown in FIGS. 40 to 43 are performed, and then the elliptical holes 61 are formed in the memory trench MT, as shown in FIGS. 72 and 73. This step and the steps prior to this are the same as those of the method of forming the memory pillar MP2 described above.

Thereafter, the steps described with reference to FIGS. 52 to 55, 10, and 11 are performed in a manner similar to those of the method of forming the memory pillar MP1*a*. Namely, the insulation layers 50 exposed to the inner wall of the holes 61 are removed, so that the recessed portions 52*b* are formed. Next, the aluminum oxide film 40Aa, the silicon oxide film 40Ab, the charge storage film 40B, the tunnel insulation film 40C, the semiconductor layer 41, and the core insulation film 42 are formed, in the order mentioned, on the inner wall of the holes 61 including the recessed portions 52*b*. Thereafter, the replacement step which involves replacing the insulation layers 50 with the a-side conductive layers and the b-side conductive layers (conductive layers 33, 34-0 to 34-7, and 35) is performed.

Through the above steps, the memory pillar MP2*a* that includes the aluminum oxide film 40Aa, the silicon oxide film 40Ab, the charge storage film 40B, the tunnel insulation film 40C, the semiconductor layer 41, and the core insulation film 42, arranged in the order mentioned, is formed on the side surfaces of the a-side conductive layers 34*a* and the b-side conductive layers 34*b*.

2.3. Advantageous Effects of Second Embodiment

According to the second embodiment, a semiconductor memory device with memory cells that are capable of improving write characteristics can be provided.

In the second embodiment, a part of the charge storage film 40B is arranged between the memory trench MT and the conductive layers 34-0 to 34-7 at one end of a portion where the memory pillar MP2 (or MP2*a*), having an elliptical cross section along plane XY and the conductive layers 34-0 to 34-7 (word lines WL), face each other (or a boundary portion where the memory pillar MP2 (or MP2*a*) and the conductive layers 34-0 to 34-7 (word lines WL) come into contact with each other). As a result, an amount of charge storage in the charge storage film 40B, arranged at the end of the portion where the memory pillar MP1 and the conductive layers 34-0 to 34-7 face each other, is increased in a write operation. This increases a threshold voltage of a parasitic transistor generated at the end of the portion where the memory pillar MP1 and the conductive layers face each other, and prevents the parasitic transistor from being turned on. Accordingly, the threshold voltage of the memory cell transistor is determined by the threshold voltage of the transistor formed in the center of the portion where the memory pillar MP1 and the conductive layers face each other, allowing for improvement of the write characteristics of the memory cell transistor.

3. Other Modifications, Etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A semiconductor memory device, comprising:
    first conductive layers stacked in a first direction;
    second conductive layers stacked in the first direction and spaced from the first conductive layers in a second direction crossing the first direction;
    a first insulation region provided between the first conductive layers and the second conductive layers, the first insulation region extending in the first direction;
    a second insulation region provided between the first conductive layers and the second conductive layers, the second insulation region extending in the first direction, the second insulation region being spaced from the first insulation region in a third direction crossing the first and second directions; and a pillar arranged between the first conductive layers and the second conductive layers, the pillar being arranged between the first insulation region and the second insulation region, and extending in the first direction, wherein the pillar includes a charge storage film, a first insulation film, and a semiconductor layer, which are provided sequentially from the first conductive layers, a second insulation film is provided between the charge storage film and the first conductive layers, and in a cross section of the charge storage film taken along the second and third directions, a portion of the charge storage film is provided between the first insulation region and the first conductive layers at an end of a portion where the first conductive layers and the charge storage film face each other.

2. The semiconductor memory device according to claim 1, wherein when viewed in a cross section perpendicular to the first direction, a length of the portion of the charge storage film in the second direction is equal to or less than twice a length of the charge storage film between the first conductive layer and the first insulation film of the pillar in the second direction.

3. The semiconductor memory device according to claim 1, wherein the second insulation film is provided between the first insulation region and the first conductive layers.

4. The semiconductor memory device according to claim 1, wherein the second insulation film is provided around the charge storage film.

5. The semiconductor memory device according to claim 1, wherein the first conductive layers include a first linear portion, the second conductive layers include a second linear portion, and the pillar is arranged between the first linear portion and the second linear portion.

6. The semiconductor memory device according to claim 5, wherein the first linear portion and the second linear portion extend in the third direction, the first linear portion and the second linear portion face each other.

7. The semiconductor memory device according to claim 1, wherein the first conductive layers include a first curved portion, the second conductive layers include a second curved portion, and the pillar is arranged between the first curved portion and the second curved portion.

8. The semiconductor memory device according to claim 7, wherein outer peripheries of the first curved portion and the second curved portion have an arc shape.

9. The semiconductor memory device according to claim 1, wherein when viewed in a cross section perpendicular to the first direction, an outer periphery of a cross section of the pillar has one of a rectangular shape, an elliptical shape, and a circular shape.

10. The semiconductor memory device according to claim 1, wherein when viewed in a cross section perpendicular to the first direction, an outer periphery of a cross section of the semiconductor layer included in the pillar has one of a rectangular shape, an elliptical shape, and a circular shape.

11. The semiconductor memory device according to claim 1, wherein the pillar includes a silicon oxide film, a silicon nitride film, a silicon oxide film, and a semiconductor layer, which are arranged sequentially from the first conductive layers.

12. The semiconductor memory device according to claim 1, wherein the first insulation film includes a tunnel insulation film, and the second insulation film includes a block insulation film.

13. A semiconductor memory device, comprising:
a first conductive layer extending in a first direction;
a second conductive layer extending in the first direction and spaced from the first conductive layer in a second direction crossing the first direction;
first and second insulation regions provided between the first conductive layer and the second conductive layer, the second insulation region being spaced from the first insulation region in the first direction; and
a pillar arranged between the first conductive layer and the second conductive layer and between the first insulation region and the second insulation region, the pillar extending in a third direction crossing the first direction and the second direction, wherein
the pillar includes a charge storage film, a first insulation film, and a semiconductor layer, which are provided sequentially from the first conductive layer,
a second insulation film is provided between the charge storage film and the first conductive layer, and
in a cross section of the charge storage film taken along the first and second directions, a portion of the charge storage film is provided between the first insulation region and the first conductive layer at an end of a portion where the first conductive layer and the charge storage film face each other.

14. The semiconductor memory device according to claim 13, wherein when viewed in a cross section perpendicular to the third direction, a length of the portion of the charge storage film in the second direction is equal to or less than twice a length of the charge storage film between the first conductive layer and the first insulation film of the pillar in the second direction.

15. The semiconductor memory device according to claim 13, wherein the second insulation film is provided between the first insulation region and the first conductive layer.

16. The semiconductor memory device according to claim 13, wherein the second insulation film is provided around the charge storage film.

17. The semiconductor memory device according to claim 13, wherein the first conductive layer includes a first linear portion, the second conductive layer includes a second linear portion, and the pillar is arranged between the first linear portion and the second linear portion.

18. The semiconductor memory device according to claim 17, wherein the first linear portion and the second linear portion extend in the first direction, the first linear portion and the second linear portion face each other.

19. The semiconductor memory device according to claim 13, wherein the first conductive layer includes a first curved portion, the second conductive layer includes a second curved portion, and the pillar is arranged between the first curved portion and the second curved portion.

20. The semiconductor memory device according to claim 19, wherein outer peripheries of the first curved portion and the second curved portion have an arc shape.

21. The semiconductor memory device according to claim 13, wherein when viewed in a cross section perpendicular to the third direction, an outer periphery of a cross section of the pillar has one of a rectangular shape, an elliptical shape, and a circular shape.

22. The semiconductor memory device according to claim 13, wherein when viewed in a cross section perpendicular to the third direction, an outer periphery of a cross section of the semiconductor layer included in the pillar has one of a rectangular shape, an elliptical shape, and a circular shape.

23. The semiconductor memory device according to claim 13, wherein the pillar includes a silicon oxide film, a silicon nitride film, a silicon oxide film, and a semiconductor layer, which are arranged sequentially from the first conductive layer.

24. The semiconductor memory device according to claim 13, wherein the first insulation film includes a tunnel insulation film, and the second insulation film includes a block insulation film.

* * * * *